(12) United States Patent
Yamazaki et al.

(10) Patent No.: US 8,455,331 B2
(45) Date of Patent: Jun. 4, 2013

(54) MANUFACTURING METHOD OF SEMICONDUCTOR DEVICE

(75) Inventors: Shunpei Yamazaki, Setagaya (JP); Takeshi Shichi, Atsugi (JP); Naoki Suzuki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 225 days.

(21) Appl. No.: 12/246,640

(22) Filed: Oct. 7, 2008

(65) Prior Publication Data

US 2009/0098674 A1 Apr. 16, 2009

(30) Foreign Application Priority Data

Oct. 10, 2007 (JP) .................... 2007-264409

(51) Int. Cl.
*H01L 21/10* (2006.01)
*H01L 21/46* (2006.01)
(52) U.S. Cl.
USPC .............. 438/458; 438/455; 257/E21.568
(58) Field of Classification Search
USPC .............. 438/455, 458, 459; 257/E21.568
See application file for complete search history.

(56) References Cited

U.S. PATENT DOCUMENTS

| | | | |
|---|---|---|---|
| 5,064,775 A | 11/1991 | Chang | |
| 5,104,818 A | 4/1992 | Silver | |
| 5,374,564 A | 12/1994 | Bruel | |
| 5,904,509 A | 5/1999 | Zhang et al. | |
| 5,910,666 A * | 6/1999 | Wen | 257/288 |
| 6,127,702 A | 10/2000 | Yamazaki et al. | |
| 6,191,007 B1 | 2/2001 | Matsui et al. | |
| 6,271,101 B1 | 8/2001 | Fukunaga | |
| 6,335,231 B1 | 1/2002 | Yamazaki et al. | |
| 6,362,078 B1 * | 3/2002 | Doyle et al. | 438/459 |
| 6,380,046 B1 | 4/2002 | Yamazaki | |
| 6,388,652 B1 | 5/2002 | Yamazaki et al. | |
| 6,455,360 B1 | 9/2002 | Miyasaka | |
| 6,534,380 B1 | 3/2003 | Yamauchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |

(Continued)

FOREIGN PATENT DOCUMENTS

JP 2003-257992 9/2003

OTHER PUBLICATIONS

Wolf, S. et al., Silicon Processing for the VLSI Era, 1986, vol. 1: Process Technology, pp. 323-325, Lattice Press.

*Primary Examiner* — Kimberly Rizkallah
*Assistant Examiner* — Errol Fernandes
(74) *Attorney, Agent, or Firm* — Eric J. Robinson; Robinson Intellectual Property Law Office, P.C.

(57) ABSTRACT

To realize high performance and low power consumption of a semiconductor device by controlling electric characteristics of a transistor in accordance with a required function. Further, to manufacture such a semiconductor device with high yield and high productivity without complicating a manufacturing process. An impurity element imparting one conductivity type is added to a semiconductor substrate in order to control the threshold voltage of a transistor included in the semiconductor device, before separating a semiconductor layer of the transistor from the semiconductor substrate and transferring the semiconductor layer to a supporting substrate that is a substrate having an insulating surface.

32 Claims, 24 Drawing Sheets

U.S. PATENT DOCUMENTS

| | | |
|---|---|---|
| 6,875,633 B2 | 4/2005 | Fukunaga |
| 6,908,797 B2 | 6/2005 | Takano |
| 7,045,442 B2 * | 5/2006 | Maruyama et al. ........... 438/458 |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,682,931 B2 | 3/2010 | Yamazaki et al. |
| 2003/0162346 A1 | 8/2003 | Srinivasan |
| 2003/0207545 A1 * | 11/2003 | Yasukawa .................... 438/459 |
| 2004/0097055 A1 | 5/2004 | Henley et al. |
| 2004/0104424 A1 | 6/2004 | Yamazaki |
| 2005/0009252 A1 | 1/2005 | Yamazaki et al. |
| 2005/0260800 A1 | 11/2005 | Takano |
| 2006/0084249 A1 | 4/2006 | Yamada |
| 2007/0087488 A1 | 4/2007 | Moriwaka |
| 2007/0108510 A1 | 5/2007 | Fukunaga |
| 2007/0141802 A1 | 6/2007 | Gadkaree |
| 2007/0173000 A1 | 7/2007 | Yamazaki |
| 2007/0184632 A1 | 8/2007 | Yamazaki et al. |
| 2007/0281399 A1 | 12/2007 | Cites et al. |
| 2007/0291022 A1 | 12/2007 | Yamazaki et al. |
| 2008/0160661 A1 | 7/2008 | Henley et al. |
| 2008/0179547 A1 | 7/2008 | Henley et al. |
| 2008/0248629 A1 | 10/2008 | Yamazaki |

* cited by examiner

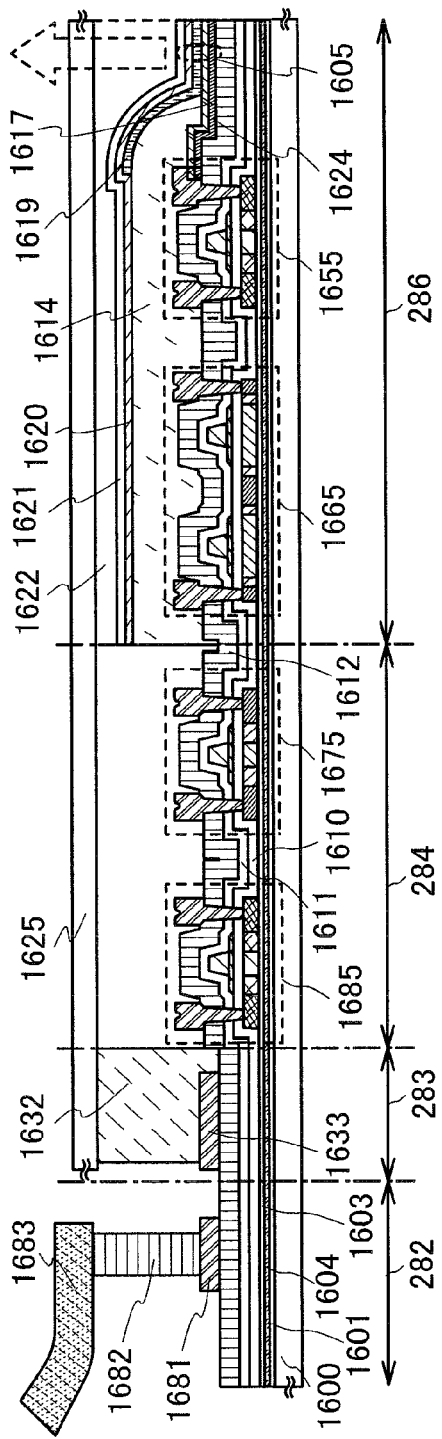
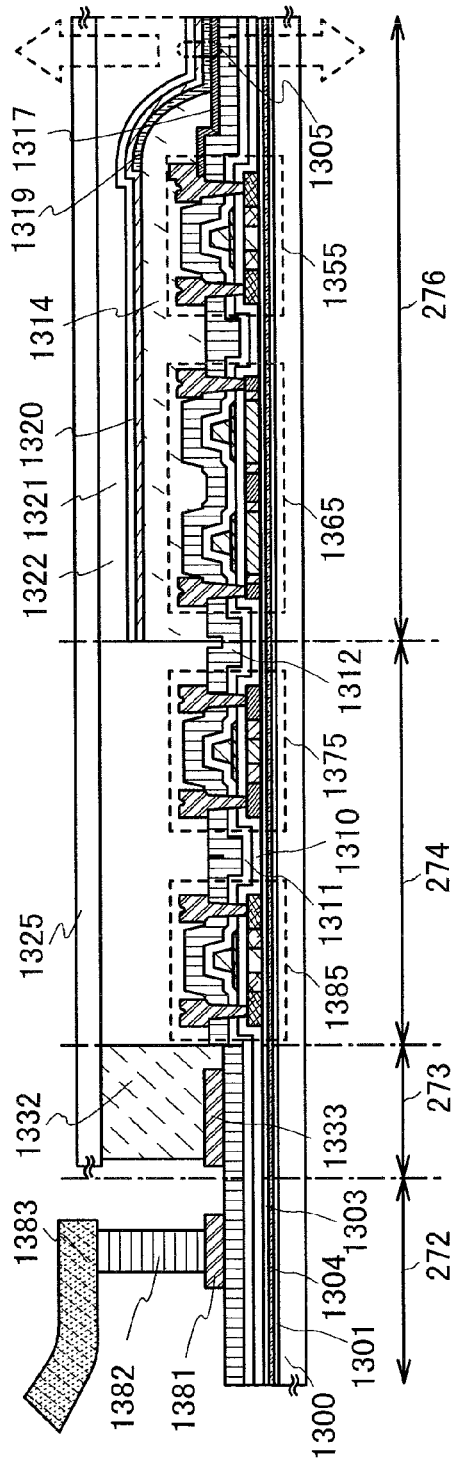
FIG. 11A
FIG. 11B

MANUFACTURING METHOD OF SEMICONDUCTOR DEVICE

BACKGROUND OF THE INVENTION

1. Field of the Invention

The present invention relates to a manufacturing method of a semiconductor device having a so-called silicon-on-insulator (SOI) structure in which a semiconductor layer is provided on an insulating surface.

2. Description of the Related Art

An integrated circuit using a semiconductor substrate called a silicon on insulator (hereinafter also referred to as "SOI") substrate in which a thin single crystal semiconductor layer is provided on an insulating surface, instead of using a silicon wafer which is manufactured by thinly slicing an ingot of a single crystal semiconductor, has been developed. An integrated circuit using an SOI substrate has attracted attention as an integrated circuit which reduces parasitic capacitance between the transistors and the substrate and improves performance of the semiconductor integrated circuit.

A transistor is a switching element that is turned on when a certain amount of voltage (referred to as a threshold value or a threshold voltage) is applied to a gate electrode and is turned off when a voltage of less than the certain amount is applied. Therefore, it is very important to control a threshold voltage precisely in terms of accurate operation of a circuit.

However, the threshold voltage of a transistor is, in some cases, moved (shifted) toward the minus side or the plus side by an indefinite factor such as an effect of a movable ion due to contamination and an influence of difference in work function and an interface charge in the periphery of a gate of the transistor.

As a technique proposed as a means for solving such a phenomenon, a channel doping method is given. The channel doping method is a technique in which an impurity element imparting one conductivity type (typically, P, As, B, or the like) is added to at least a channel formation region of a transistor and a threshold voltage is controlled by being shifted intentionally (e.g., see Patent Document 1: Japanese Published Patent Application No. 2003-257992).

SUMMARY OF THE INVENTION

However, transistors manufactured for a semiconductor device include an n-channel transistor and a p-channel transistor, which have different conductivity types, and electric characteristics or functions to be needed are different from one another depending on an intended use. Therefore, it is necessary to control electric characteristics of transistors in accordance with respective functions required in the transistors.

An object of the present invention is to control electric characteristics of transistors in accordance with required functions and realize higher performance and lower power consumption of a semiconductor device. Another object of the present invention is to manufacture such a semiconductor device with high yield and high productivity without complicating a manufacturing process.

In manufacturing a semiconductor device having an SOI structure, an impurity element is added to a semiconductor substrate in order to control the threshold voltage of a transistor included in the semiconductor device, before separating a semiconductor layer of the transistor from the semiconductor substrate and transferring the semiconductor layer to a supporting substrate that is a substrate having an insulating surface. The transistor in the present invention means a field-effect transistor having a thin semiconductor layer. Note that in this specification, addition of an impurity element having one conductivity type for controlling the threshold voltage of a transistor is also referred to as a channel doping step, and an impurity region formed in a channel formation region by the channel doping step is also referred to as a channel doping region.

In order to separate the semiconductor layer from the semiconductor substrate, the semiconductor substrate is irradiated with ions to form an embrittlement layer at a certain depth from the surface of the semiconductor substrate. The region irradiated with the ions, which is from the surface of the semiconductor substrate to the embrittlement layer, is separated from the semiconductor substrate as the semiconductor layer; accordingly, the channel doping step is performed on at least such a region. It is acceptable as long as the channel doping step is performed before separation of the semiconductor layer from the semiconductor substrate. Therefore, the channel doping step may be performed before or after the formation of the embrittlement layer.

By heat treatment included in the process in which the semiconductor layer is separated from the semiconductor substrate and transferred to the substrate having an insulating surface by bonding, the impurity region to which the impurity element having one conductivity type is added can be activated as well. Therefore, it is not necessary to increase a heating step for activation of the impurity element which is added in the channel doping step.

The semiconductor layer is separated from the semiconductor substrate and transferred to the supporting substrate so that the surface of the semiconductor layer through which the impurity element is added in the channel doping step faces the supporting substrate side. Accordingly, the surface (the surface opposite to the surface through which the impurity element is added) of the semiconductor layer transferred to be placed over the supporting substrate can be prevented from suffering damage (such as surface roughness and entry of contaminants) from the channel doping step.

The step of adding the impurity element for controlling the threshold voltage (channel doping step) may be performed using an ion doping method or an ion implantation method.

In this specification, separating a semiconductor layer from a semiconductor substrate and providing the semiconductor layer for a supporting substrate by bonding is referred to as transferring (transposing) the semiconductor layer from the semiconductor substrate to the supporting substrate. Accordingly, in the present invention, the transistor includes a semiconductor layer transferred to the supporting substrate from the semiconductor substrate. Note that the transferred semiconductor layer is a semiconductor layer including the impurity region which has been formed by the channel doping step in the semiconductor substrate before transfer to the supporting substrate.

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, the impurity element may be selectively added to the semiconductor substrate using a mask to form impurity regions having different impurity concentrations. Further, impurity elements imparting different conductivity types may be selectively added in accordance with the conductivity types of transistors to be manufactured, to form impurity regions having different conductivity types in the semiconductor substrate.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

If the step of adding an impurity element for controlling the threshold voltage is performed on the semiconductor substrate, the concentration profile in the impurity region can be selected from a wide range and can be set freely. For example, in the case where an impurity element is added so that the concentration peak is near the surface of a semiconductor substrate to which the impurity element is added and a semiconductor layer is transferred from the semiconductor substrate to a supporting substrate provided with an insulating film serving as a base film, the semiconductor layer can contain the impurity element added at a high concentration near the interface with the insulating film.

When a transistor is formed using a semiconductor layer transferred from the semiconductor substrate to the supporting substrate, a channel doping region (region to which the impurity element imparting one conductivity type is added) is formed so that a channel formation region of the transistor includes the channel doping region. Therefore, the channel doping region includes a region to which the impurity element is added, which is from the surface of the semiconductor substrate to the embrittlement layer. The impurity element may be added to an entire region or part of the region in the film thickness direction from the surface of the semiconductor substrate to the embrittlement layer. Further, part of the channel doping region may be formed down to a region below the embrittlement layer in the semiconductor substrate.

One aspect of a manufacturing method of a semiconductor device according to the present invention is to form an impurity region by adding an impurity element imparting one conductivity type to a semiconductor substrate from a surface of the semiconductor substrate. Irradiation with ions is performed on the surface of the semiconductor substrate to which the impurity element is added, so that an embrittlement layer is formed below the impurity region with respect to the surface of the semiconductor substrate. An insulating layer is formed over at least one of the surface of the semiconductor substrate and a supporting substrate. The semiconductor substrate and the supporting substrate are bonded with the insulating layer interposed therebetween. Heat treatment for generating a crack in the embrittlement layer is performed and the semiconductor substrate is separated at the embrittlement layer; accordingly, a semiconductor layer including the impurity region, which is separated from the semiconductor substrate, is formed over the supporting substrate. A field-effect transistor is formed using the impurity region of the semiconductor layer as a channel formation region.

Another aspect of the manufacturing method of a semiconductor device according to the present invention is to form an embrittlement layer at a certain depth from a surface of a semiconductor substrate by irradiating the surface of the semiconductor substrate with ions. An impurity element imparting one conductivity type is added from the surface of the semiconductor substrate, so that an impurity region is formed between the surface of the semiconductor substrate and the embrittlement layer. An insulating layer is formed over at least one of the surface of the semiconductor substrate and a supporting substrate. The semiconductor substrate and the supporting substrate are bonded with the insulating layer interposed therebetween. Heat treatment for generating a crack in the embrittlement layer is performed and the semiconductor substrate is separated at the embrittlement layer; accordingly, a semiconductor layer including the impurity region, which is separated from the semiconductor substrate, is formed over the supporting substrate. A field-effect transistor is formed using the impurity region of the semiconductor layer as a channel formation region.

The semiconductor layer transferred from the semiconductor substrate to the supporting substrate may be subjected to etching treatment, polishing treatment, or the like as long as a region used as a channel formation region in the semiconductor layer of the transistor to be manufactured becomes a channel doping region.

In addition, a protective layer may be formed between the semiconductor substrate and the insulating layer having a bonding surface. The protective layer can be formed of a single layer or a stacked structure of a plurality of layers selected from a silicon nitride layer, a silicon oxide layer, a silicon nitride oxide layer, or a silicon oxynitride layer. Any of these layers can be formed over the semiconductor substrate before the embrittlement layer and the impurity region are formed in the semiconductor substrate. Alternatively, any of these layers may be formed over the semiconductor substrate after the embrittlement layer and the impurity region are formed in the semiconductor substrate.

In this manner, electric characteristics of a transistor is controlled depending on the function required for a supporting substrate by a channel doping step of a semiconductor substrate; accordingly, a semiconductor device with high performance and low power consumption can be achieved. Further, such a semiconductor device can be manufactured with high yield and high productivity without complicating a manufacturing process.

BRIEF DESCRIPTION OF THE DRAWINGS

In the accompanying drawings:

FIGS. 11A and 11B illustrate semiconductor devices according to the present invention;

DETAILED DESCRIPTION OF THE INVENTION

Figure 1A:
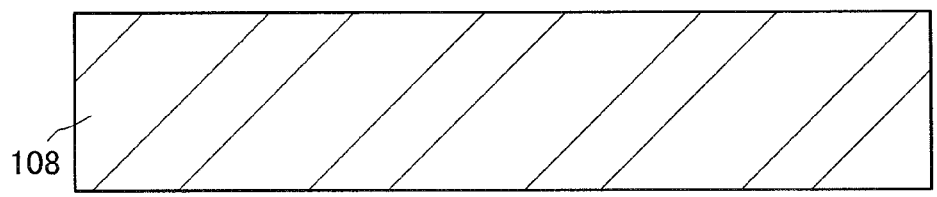
FIGS. 1A to 1C illustrate a manufacturing method of a semiconductor device according to the present invention.

Embodiment modes of the present invention will be described with reference to the drawings. The present invention is not limited to the following description, and it is easily understood by those skilled in the art that modes and details herein disclosed can be modified in various ways without departing from the spirit and the scope of the present invention. Therefore, the present invention is not to be construed with limitation to what is described in the embodiment modes. Note that the same portions or portions having a similar function are denoted by the same reference numeral through different drawings in a structure of the present invention described hereinafter, and repetitive description thereof is omitted.

Embodiment Mode 1

A manufacturing method of a semiconductor device of the present invention will be described with reference to FIGS. 1A to 1C, FIGS. 2A to 2C, FIGS. 3A to 3C, and FIGS. 4A to 4D.

In this embodiment mode, addition of an impurity element to a semiconductor substrate for controlling the threshold voltage of a transistor included in a semiconductor device is performed before separating a semiconductor layer of a transistor from the semiconductor substrate and transferring the semiconductor layer to a supporting substrate that is a substrate having an insulating surface. It is preferable that a single crystal semiconductor substrate be used as the semiconductor substrate to form a single crystal semiconductor layer as the semiconductor layer which is separated and bonded to the supporting substrate.

First, a method for providing the semiconductor layer from the semiconductor substrate over the supporting substrate that is a substrate having an insulating surface will be described with reference to FIGS. 1A to 1C, FIGS. 2A to 2C, FIGS. 3A to 3C, and FIGS. 4A to 4D.

FIG. 1A illustrates a cleaned semiconductor substrate 108. As the semiconductor substrate 108, a semiconductor substrate such as a silicon substrate or a germanium substrate, or a compound semiconductor substrate such as a gallium arsenide substrate or an indium phosphide substrate is used. It is preferable that a single crystal semiconductor substrate be used as the semiconductor substrate 108, but a polycrystalline semiconductor substrate may be used as well. Alternatively, a semiconductor substrate formed of silicon having lattice distortion, silicon germanium in which germanium is added to silicon, or the like may be used. Silicon having lattice distortion can be formed by formation of silicon on silicon germanium or silicon nitride which has a larger lattice constant than silicon. A semiconductor layer obtained over a supporting substrate can be determined by selecting a semiconductor substrate to serve as a base.

The crystal plane orientation of the semiconductor substrate 108 may be selected in accordance with a semiconductor element (in this embodiment mode, a field-effect transistor) to be manufactured. For example, a semiconductor substrate having {100} plane, {110} plane, or the like as a crystal plane orientation can be used.

Figure 1B:
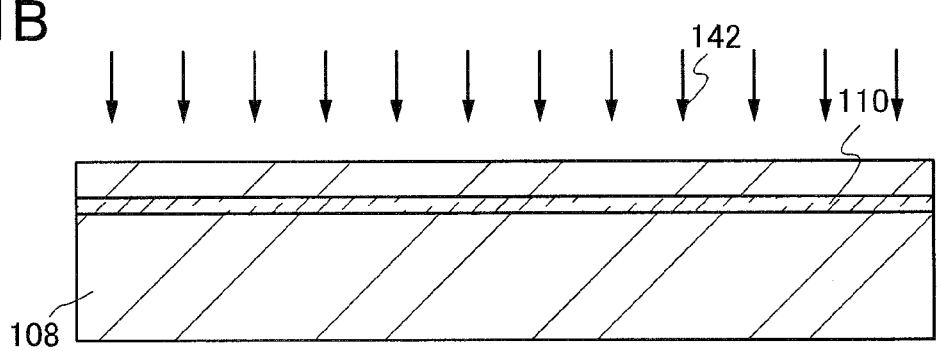
Figure 1C:
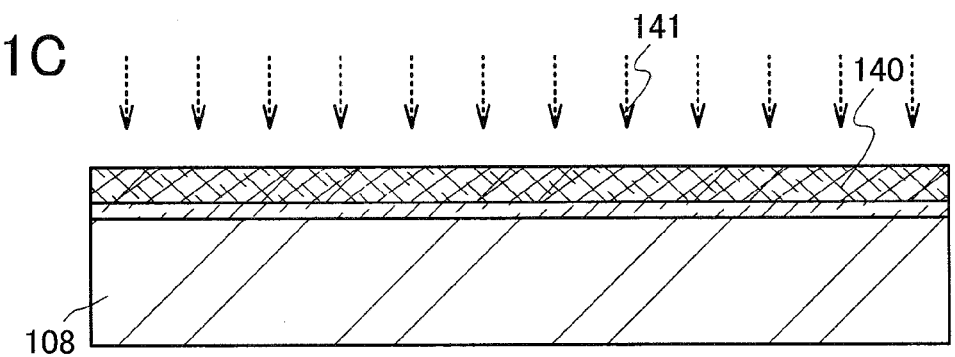

A region at a predetermined depth is irradiated with ions 142 accelerated by electric field through a surface of the semiconductor substrate 108; accordingly, an embrittlement layer 110 is formed (see FIG. 1B). The irradiation with the ions 142 is performed in consideration of the thickness of the semiconductor layer to be transferred to the supporting substrate. An accelerating voltage in irradiating the semiconductor substrate 108 with the ions 142 is set in consideration of such a thickness.

In this embodiment mode, an ion irradiation separation method in which a region at a predetermined depth of a semiconductor substrate is irradiated with hydrogen, helium, or fluorine ions, heat treatment is then conducted, and a semiconductor layer, which is an outer layer, is separated can be used. Alternatively, a method in which single crystal silicon is epitaxially grown on porous silicon and the porous silicon layer is separated by cleavage by water jetting may also be employed.

For example, a single crystal silicon substrate is used as the semiconductor substrate 108, and the surface thereof is processed with dilute hydrofluoric acid. Accordingly, a natural oxide film is removed and a contaminant such as dust or the like attached to the surface is also removed, whereby the surface of the semiconductor substrate 108 is cleaned.

The embrittlement layer 110 may be formed by irradiation with ions by an ion doping method (also referred to as an ID method) or an ion implantation method (also referred to as an II method). The embrittlement layer 110 is formed by irradiation with ions of hydrogen, helium, or a halogen typified by fluorine. In the case of irradiation with fluorine ions as halogen elements, $BF_3$ may be used as a source gas. Note that an ion implantation method refers to a method in which an ionized gas is mass-separated to irradiate a semiconductor.

For example, by an ion implantation method, an ionized hydrogen gas is mass-separated and only $H^+$ ions are selectively accelerated for irradiation. At this time, the $H^+$ ions are added to a deeper region of a semiconductor substrate at the same energy compared with the case of irradiation with ions having other masses, and a broad concentration profile of $H^+$ ions is shown.

In ion doping method, a plurality of kinds of ion species are generated in plasma from an ionized gas without mass separation, and accelerated to be introduced into a semiconductor substrate by doping. For example, in hydrogen including $H^+$ ions, $H_2^+$ ions, and $H_3^+$ ions, the percentage of $H_3^+$ ions introduced is typically equal to or greater than 50%, and generally the percentage of $H_3^+$ ions introduced is, for example, 80% and the percentage of the other ions ($H^+$ ions, $H_2^+$ ions) is 20%. Here, addition of only an ion species of $H_3^+$ ions is also referred to as ion doping. That is, since $H_3^+$ ions has a large mass, a large amount of $H_3^+$ ions can be shallowly added to a semiconductor substrate at the same accelerating energy, and a sharp concentration profile of $H_3^+$ ions is shown.

When the single crystal silicon substrate is irradiated with halogen ions such as fluorine ions by an ion irradiation method, fluorine which is used for irradiation knocks out (expels) silicon atoms in the silicon crystal lattice, so that blank portions are created effectively and microvoids are formed in the embrittlement layer. In this case, heat treatment is performed at a relatively low temperature, so that a change occurs in the volume of the microvoids formed in the embrittlement layer, and a thin single crystal semiconductor layer can be formed by cleavage along the embrittlement layer. After irradiation with fluorine ions, irradiation with hydrogen ions may be performed so that hydrogen is contained in the voids. Since the embrittlement layer which is formed to separate the thin semiconductor layer from the semiconductor substrate cleaves using a change in volume of the microvoids formed in the embrittlement layer, it is preferable to make effective use of fluorine ion operation or hydrogen ion operation.

In addition, irradiation may be performed using a single kind of ions or plural kinds of ions of the same atom which have different masses. For example, in the case of irradiation with hydrogen ions, the hydrogen ions preferably include $H^+$ ions, $H_2^+$ ions, and $H_3^+$ ions with a high proportion of $H_3^+$ ions. In the case of hydrogen ion irradiation, when the hydrogen ions include $H^+$ ions, $H_2^+$ ions, and $H_3^+$ ions with a high proportion of $H_3^+$ ions, efficiency in addition can be increased and irradiation time can be shortened. By this structure, separation can be performed easily.

Next, a channel doping step is performed on the semiconductor substrate 108 in order to control the threshold voltage of a transistor to be formed using a semiconductor layer which is to be separated. The channel doping step may be performed by an ion doping method or an ion implantation method. The region separated from the semiconductor substrate 108 as the semiconductor layer is a region irradiated with the ions, which is from the surface of the semiconductor substrate 108 to the embrittlement layer 110; therefore, the channel doping step is performed on at least the region. An impurity element 141 imparting one conductivity type is added to the semiconductor substrate 108, to form an impurity region (channel doping region) 140 (see FIG. 1C).

Figure 2A:
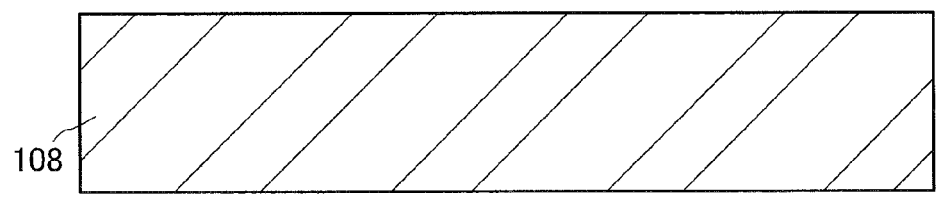
FIGS. 2A to 2C illustrate a manufacturing method of a semiconductor device according to the present invention.
Figure 2B:
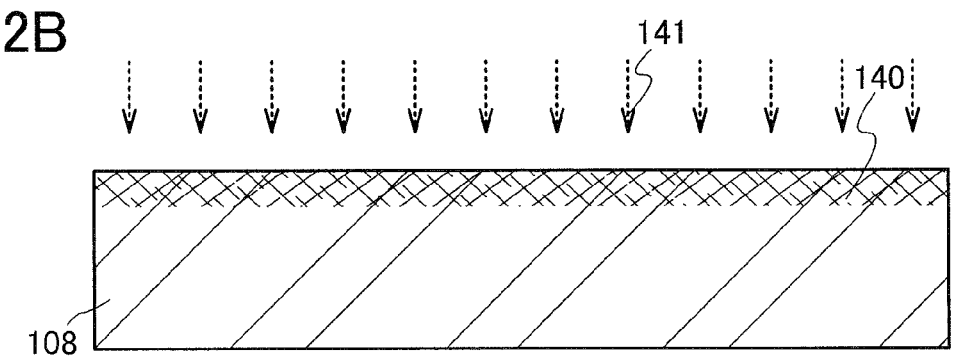
Figure 2C:
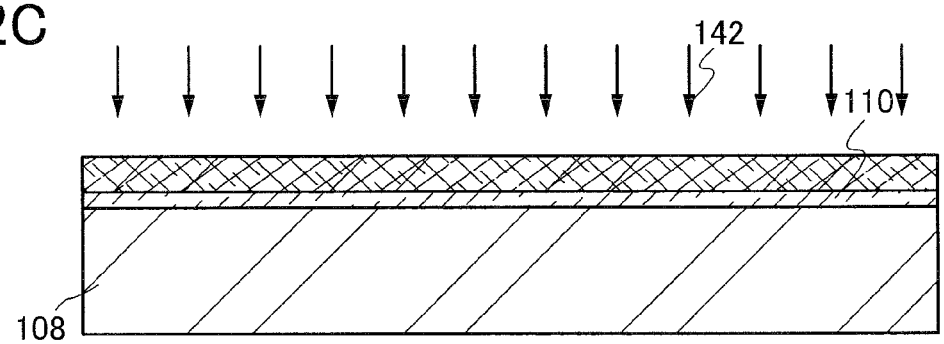

It is acceptable as long as the channel doping step is performed before separation of the semiconductor layer from the semiconductor substrate. Therefore, the channel doping step may be performed before or after the formation of the embrittlement layer. FIGS. 2A to 2C illustrate an example in which a channel doping step is performed before the formation of the embrittlement layer 110.

FIG. 2A illustrates the cleaned semiconductor substrate 108. The impurity element 141 imparting one conductivity type to the semiconductor substrate 108 is added to the semiconductor substrate 108, to form the impurity region (channel doping region) 140 near the surface of the semiconductor substrate 108 (see FIG. 2B). Then, the semiconductor substrate 108 in which the impurity region 140 has been formed is irradiated with the ions 142, to form the embrittlement layer 110 (see FIG. 2C).

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, the impurity element may be selectively added to the semiconductor substrate using a mask to form impurity regions having different impurity concentrations. Further, impurity elements imparting different conductivity types may be selectively added in accordance with the conductivity types of transistors to be manufactured, to form impurity regions having different conductivity types in the semiconductor substrate.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

If the step of adding an impurity element for controlling the threshold voltage is performed on the semiconductor substrate, the concentration profile in the impurity region can be selected from a wide range and can be set freely. For example, in the case where an impurity element is added so that the concentration peak is near the surface of a semiconductor substrate to which the impurity element is added and a semiconductor layer is transferred from the semiconductor substrate to a supporting substrate provided with an insulating film serving as a base film, the semiconductor layer can contain the impurity element added at a high concentration near the interface with the insulating film.

The channel doping region (region to which the impurity element imparting one conductivity type is added) in the semiconductor substrate preferably at least includes a channel formation region of a semiconductor layer in a transistor to be formed through transfer of the semiconductor layer from the semiconductor substrate to the supporting substrate. Therefore, the channel doping region includes a region to which the impurity element is added, which is from the surface of the semiconductor substrate to the embrittlement layer. The impurity element may be added to an entire region or part of the region in the film thickness direction from the surface of the semiconductor substrate to the embrittlement layer. Further, part of the channel doping region may be formed down to a region below the embrittlement layer in the semiconductor substrate.

Note that, in this specification, a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Further, a protective layer may be formed between the semiconductor substrate and the insulating layer which is bonded to the above-described semiconductor layer. The protective layer can be formed of a single layer or a stacked structure of a plurality of layers selected from a silicon nitride layer, a silicon oxide layer, a silicon nitride oxide layer, or a silicon oxynitride layer. These layers can be formed over the semiconductor substrate before the embrittlement layer and an impurity region by the channel doping step are formed in the semiconductor substrate. Alternatively, these layers may be formed over the semiconductor substrate after the embrittlement layer and an impurity region by the channel doping step are formed in the semiconductor substrate.

It is necessary to perform irradiation with ions under high dose conditions in the formation of the embrittlement layer, but the surface of the semiconductor substrate 108 becomes rough in some cases. Therefore, a protective layer having a thickness of 50 nm to 200 nm against ion irradiation, such as a silicon nitride film, a silicon nitride oxide film, or a silicon oxide film may be provided on the surface which is irradiated with ions.

For example, a stacked layer of a silicon oxynitride film (with a thickness of 5 nm to 300 nm, preferably, 30 nm to 150 nm (e.g., 50 nm)) and a silicon nitride oxide film (with a thickness of 5 nm to 150 nm, preferably, 10 nm to 100 nm (e.g., 50 nm)) is formed by a plasma CVD method as a protective layer over the semiconductor substrate 108. As an example, a silicon oxynitride film is formed at a thickness of 50 nm over the semiconductor substrate 108, and a silicon nitride oxide film is stacked at a thickness of 50 nm over the silicon oxynitride film. A silicon oxynitride film may be a silicon oxide film formed by a chemical vapor deposition method using an organosilane gas.

Further, the semiconductor substrate 108 may be degreased and cleaned to remove an oxide film on the surface, and thermal oxidation may be performed. As thermal oxidation, general dry oxidation may be performed; however, oxidation in an oxidizing atmosphere in which a halogen is added is preferably performed. For example, thermal treatment is carried out in an atmosphere containing HCL at a ratio of 0.5 to 10 vol. % (preferably, 3 vol. %) with respect to oxygen at a temperature of 700° C. or higher. Preferably, thermal oxidation is performed at a temperature of 950° C. to 1100° C. Processing time may be 0.1 to 6 hours, and preferably 0.5 to 3.5 hours. The thickness of the oxide film thus formed is made to be 10 nm to 1000 nm (preferably, 50 nm to 200 nm), and for example, 100 nm.

As a material including a halogen, one or more of HF, $NF_3$, HBr, $Cl_2$, $ClF_3$, $BCl_3$, $F_2$, $Br_2$, and the like can be used as well as HCl.

Heat treatment is performed in such a temperature range, whereby a gettering effect due to a halogen element can be obtained. Gettering is particularly effective in removing a metal impurity. That is, by operation of chlorine, an impurity such as a metal is separated and removed as volatile chloride into the air. The gettering is effective on the surface of the semiconductor substrate 108 subjected to chemical mechanical polishing (CMP). In addition, hydrogen has action of compensating a defect at the interface between the semiconductor substrate 108 and the oxide film to be formed so as to lower a localized level density at the interface, whereby the interface between the semiconductor substrate 108 and the oxide film is inactivated to stabilize electric characteristics.

A halogen can be contained in the oxide film formed by this heat treatment. A halogen element can be contained at a concentration of $1 \times 10^{17}$ atoms/$cm^3$ to $5 \times 10^{20}$ atoms/$cm^3$, whereby the oxide film can function as a protective layer which captures impurities such as a metal or the like and prevents contamination of the semiconductor substrate 108.

When the embrittlement layer 110 is formed, the accelerating voltage and the number of all ions can be adjusted in accordance with the thickness of a film deposited over the semiconductor layer, the thickness of the targeted semiconductor layer which is separated from the semiconductor substrate and transferred to a supporting substrate, and the ion species which is used for irradiation.

For example, irradiation with ions is performed by an ion doping method using a hydrogen gas as a raw material at an accelerating voltage of 40 kV with the total ion number of $2 \times 10^{16}$ ions/$cm^2$, so that the embrittlement layer can be formed. If the protective layer is made to be thick, when irradiation with ions is performed under the same condition to form the embrittlement layer, a thinner semiconductor layer can be formed as the targeted semiconductor layer which is separated from the semiconductor substrate and transferred to the supporting substrate. For example, although it depends on the proportion of ion species ($H^+$, $H_2^+$, and $H_3^+$ ions), in the case where the embrittlement layer is formed under the above conditions and a silicon oxynitride film (thickness: 50 nm) and a silicon nitride oxide film (thickness: 50 nm) are stacked as a protective layer over the semiconductor substrate, the thickness of the semiconductor layer to be transferred to the supporting substrate is approximately 120 nm; and in the case where a silicon oxynitride film (thickness: 100 nm) and a silicon nitride oxide film (thickness: 50 nm) are stacked as a protective layer over the semiconductor substrate, the thickness of the semiconductor layer to be transferred to the supporting substrate is approximately 70 nm.

When helium (He) or hydrogen is used as a source gas, irradiation is performed at an accelerating voltage in the range of 10 kV to 200 kV and at a dose in the range of $1 \times 10^{16}$ ions/$cm^2$ to $6 \times 10^{16}$ ions/$cm^2$ so that the embrittlement layer can be formed. When helium is used for a source gas, $He^+$ ions can be used as main ions for irradiation even though mass separation is not performed. Alternatively, when hydrogen is used as a source gas, $H_3^+$ ions and $H_2^+$ ions can be used as main ions for irradiation. The ion species also changes depending on the plasma generation method, pressure, supply of a source gas, and accelerating voltage.

As another example of forming the embrittlement layer, a silicon oxynitride film (thickness: 50 nm), a silicon nitride oxide film (thickness: 50 nm), and a silicon oxide film (thickness: 50 nm) are stacked as a protective layer over the semiconductor substrate, and irradiation with hydrogen is performed at an accelerating voltage of 40 kV at a dose of $2 \times 10^{16}$ ions/$cm^2$, so that the embrittlement layer is formed in the semiconductor substrate. Then, a silicon oxide film (thickness: 50 nm) is formed as an insulating layer over the silicon oxide film which is a top layer of the protective layer. As another example of forming the embrittlement layer, a silicon oxide film (thickness: 100 nm) and a silicon nitride oxide film (thickness: 50 nm) are stacked as a protective layer over the semiconductor substrate, and irradiation with hydrogen is performed at an accelerating voltage of 40 kV at a dose of $2 \times 10^{16}$ ions/cm$^2$, so that the embrittlement layer is formed in the semiconductor substrate. Then, a silicon oxide film (thickness: 50 nm) is formed as an insulating layer over the silicon nitride oxide film which is a top layer of the protective layer. Note that the silicon oxynitride film or the silicon nitride oxide film may be formed by a plasma CVD method, and the silicon oxide film may be formed by a CVD method using an organosilane gas.

In the case where a glass substrate that is used in the electronics industry, such as an aluminosilicate glass substrate, an aluminoborosilicate glass substrate, or a barium borosilicate glass substrate, is used as a supporting substrate 101, an alkali metal such as sodium or the like is contained in a very small amount in a glass substrate, and this very small amount of impurity might adversely affect the characteristics of semiconductor elements such as transistors or the like. The silicon nitride oxide film has an effect of preventing such a metal impurity contained in the supporting substrate 101 from diffusing into the semiconductor substrate side. Note that, instead of the silicon nitride oxide film, a silicon nitride film may be formed. A stress alleviation layer such as a silicon oxynitride film or silicon oxide film is preferably provided between the semiconductor substrate and the silicon nitride oxide film. When a stacked layer structure of the silicon nitride oxide film and the silicon oxynitride film is provided, an impurity can be prevented from diffusing into the semiconductor substrate and stress distortion can be alleviated.

The supporting substrate may also be provided with a silicon nitride film or a silicon nitride oxide film, which prevents diffusion of an impurity element, as a blocking layer (also referred to as a barrier layer). A silicon oxynitride film may be further combined as an insulating film which has an operation of alleviating stress.

Figure 3A:
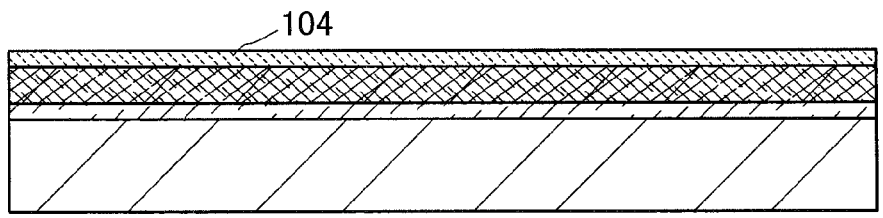
FIGS. 3A to 3C illustrate a manufacturing method of a semiconductor device according to the present invention.

Next, as illustrated in FIG. 3A, a silicon oxide film is formed as an insulating layer 104 on the surface which forms a bond with the supporting substrate. A silicon oxide film which is formed by a chemical vapor deposition method with the use of an organosilane gas is preferable as the silicon oxide film. Alternatively, a silicon oxide film formed by a chemical vapor deposition method using a silane gas can be used. In the film formation by a chemical vapor deposition method, a film formation temperature of, for example, 350° C. or lower (300° C. as a specific example) is applied as the temperature that does not cause degasification from the embrittlement layer 110 which is formed in the single crystal semiconductor substrate. Further, heat treatment temperature which is higher than the film formation temperature is used for the heat treatment by which a semiconductor layer is separated from a single crystal semiconductor substrate or a polycrystalline semiconductor substrate.

The insulating layer 104 has a smooth surface and forms a hydrophilic surface. A silicon oxide film is suitable for the insulating layer 104. In particular, a silicon oxide film formed by a chemical vapor deposition method using an organosilane gas is preferable. Examples of the organosilane gas include silicon-containing compounds, such as tetraethoxysilane (TEOS) (chemical formula: Si(OC$_2$H$_5$)$_4$), trimethylsilane (TMS) (chemical formula: (CH$_3$)$_3$SiH), tetramethylsilane (chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), and trisdimethylaminosilane (chemical formula: SiH(N(CH$_3$)$_2$)$_3$). Note that, in the case where a silicon oxide layer is formed by a chemical vapor deposition method using organosilane as a source gas, it is preferable to mix a gas which provides oxygen. Oxygen, nitrous oxide, nitrogen dioxide, or the like can be used as a gas which provides oxygen. Further, an inert gas such as argon, helium, nitrogen, or hydrogen may be mixed.

Further, as the insulating layer 104, a silicon oxide film formed by a chemical vapor deposition method using silane such as monosilane, disilane, trisilane, or the like as a source gas can also be used. Also in this case, it is preferable to mix an inert gas, a gas which provides oxygen, or the like. In addition, the silicon oxide film to serve as an insulating layer bonded to the semiconductor layer may contain chlorine. In film formation by a chemical vapor deposition method, a film formation temperature of, for example, 350° C. or lower is applied as the temperature that does not cause degasification from the embrittlement layer 110 which is formed in the semiconductor substrate 108. Further, heat treatment temperature which is higher than the film formation temperature is used for the heat treatment by which a semiconductor layer is separated from a single crystal semiconductor substrate or a polycrystalline semiconductor substrate. Note that a chemical vapor deposition (CVD) method in this specification includes a plasma CVD method, a thermal CVD method, and a photo CVD method in its category.

Further alternatively, as the insulating layer 104, silicon oxide formed by heat treatment under an oxidizing atmosphere, silicon oxide which grows by reaction of oxygen radicals, chemical oxide formed using an oxidative chemical solution, or the like can be used. For the insulating layer 104, an insulating layer including a siloxane (Si—O—Si) bond may be used. Alternatively, the organosilane gas may be reacted with an oxygen radical or a nitrogen radical to form the insulating layer 104.

The insulating layer 104 which has a smooth surface and forms a hydrophilic surface is provided at a thickness of 5 nm to 500 nm, preferably, 10 nm to 200 nm. If the thickness is set in this range, it is possible to smooth surface roughness of the insulating layer 104 and also to ensure smoothness of the growth surface of the film. In addition, distortion of the supporting substrate and the semiconductor layer that are to be bonded to each other can be alleviated. The surface of the insulating layer 104 is preferably set as follows: preferably, the arithmetic mean roughness Ra is less than 0.8 nm and the root-mean-square roughness Rms is less than 0.9 nm; more preferably, Ra is 0.4 nm or less and Rms is 0.5 nm or less; and still more preferably, Ra is 0.3 nm or less and Rms is 0.4 nm or less. For example, Ra is 0.27 nm and Rms is 0.34 nm. In this specification, Ra is arithmetic mean roughness, Rms is root-mean-square roughness, and the measurement range is 2 μm$^2$ or 10 μm.

A silicon oxide film which is similar to the insulating layer 104 may also be provided for the supporting substrate 101. That is, when a semiconductor layer 102 is bonded to the supporting substrate 101, a strong bond can be formed by preferably providing the insulating layer 104 which is formed of a silicon oxide film deposited using organosilane as a raw material for one surface or both surfaces which form a bond.

Figure 3B:
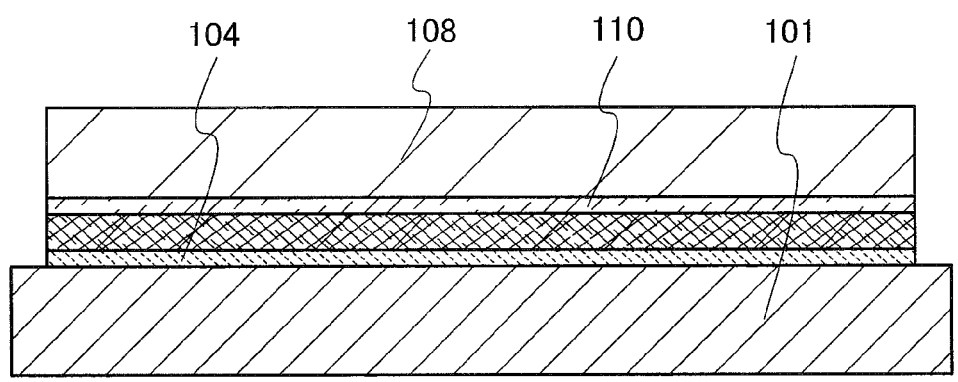

FIG. 3B illustrates a mode in which the supporting substrate 101 and the surface of the insulating layer 104, which is formed over the semiconductor substrate 108, are disposed to be in close contact with each other and are bonded. Surfaces which are to form a bond are cleaned sufficiently. The surfaces of the supporting substrate 101 and the insulating layer 104 of the semiconductor substrate 108 may be cleaned by megasonic cleaning or the like. In addition, the surfaces may be cleaned with ozone water after megasonic cleaning to remove an organic substance and improve the hydrophilicity of the surfaces.

By making the supporting substrate 101 and the insulating layer 104 face each other and pressing one part thereof from the outside, the supporting substrate 101 and the insulating layer 104 attract each other by increase in van der Waals forces or contribution of hydrogen bonding due to local reduction in distance between the bonding surfaces. Further, since the distance between the supporting substrate 101 and the insulating layer 104 in an adjacent region, which also face each other, is reduced, a region which is strongly influenced by van der Waals forces or a region to which hydrogen bonding contributes is spread. Accordingly, bonding proceeds and spreads to the entire bonding surface. For example, a pressure of about 100 kPa to 5000 kPa may be applied. Further, the supporting substrate and the semiconductor substrate can be disposed so as to overlap with each other, so that bonding can spread under the weight of the overlapping substrates.

In order to form a favorable bond, the surface may be activated. For example, the surface that is to form a bond is irradiated with an atomic beam or an ion beam. In the case of utilizing the atomic beam or the ion beam, an inert gas neutral atomic beam or an inert gas ion beam of argon or the like can be used. Alternatively, plasma irradiation or radical treatment is performed. Such surface treatment makes facilitates formation of a bond between different kinds of materials even at a temperature of 200° C. to 400° C.

In order to improve bonding strength at a bond interface between the supporting substrate and the insulating layer, heat treatment is preferably performed. For example, heat treatment is performed in a temperature condition of 70° C. to 350° C. (e.g., at 200° C. for 2 hours) in an oven, a furnace, or the like.

Figure 3C:
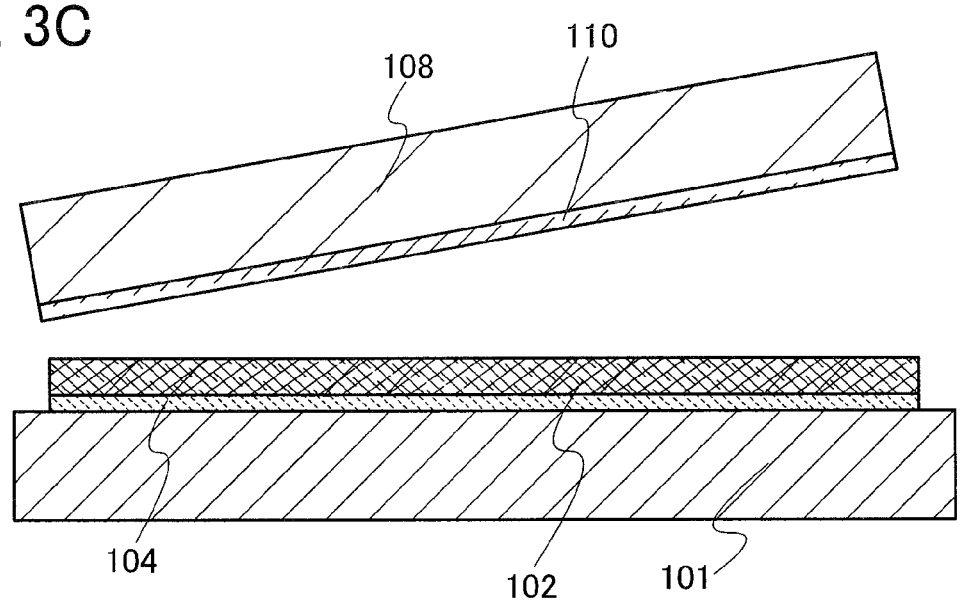

In FIG. 3C, after the supporting substrate 101 and the semiconductor substrate 108 are bonded to each other, heat treatment is performed, and the semiconductor substrate 108 is separated from the supporting substrate 101 using the embrittlement layer 110 as a cleavage plane. When heat treatment is performed at, for example, 400° C. to 700° C., the volume of microvoids formed in the embrittlement layer 110 changes, which enables cleavage to occur along the embrittlement layer 110. Since the insulating layer 104 is bonded to the supporting substrate 101, the semiconductor layer 102 having the same crystallinity as that of the semiconductor substrate 108 remains over the supporting substrate 101.

By the heat treatment included in the process in which the semiconductor layer is separated from the semiconductor substrate and transferred to the substrate having an insulating surface by bonding, the impurity region to which the impurity element having one conductivity type is added can be activated as well. Therefore, it is not necessary to increase a heating step for activation of the impurity element which is added in the channel doping step.

The heat treatment in the temperature range of 400° C. to 700° C. may be continuously performed with the same apparatus as the above heat treatment for improving the bonding strength or with a different apparatus. For example, after heat treatment in a furnace at 200° C. for 2 hours, the temperature is increased to near 600° C. and kept for 2 hours. Then, the temperature is decreased to a temperature ranging from room temperature to 400° C., and the substrate is taken out of the furnace. Alternatively, in the heat treatment, the temperature may be increased from a room temperature. Further, after heat treatment is performed in a furnace at 200° C. for 2 hours, heat treatment may be performed in a temperature range of 600° C. to 700° C. with a rapid thermal annealing (RTA) apparatus for 1 minute to 30 minutes (e.g., at 600° C. for 7 minutes, or at 650° C. for 7 minutes).

By heat treatment in a temperature range of 400° C. to 700° C., bonding between the insulating layer and the supporting substrate shifts from hydrogen bonding to covalent bonding, and an element added to the embrittlement layer is separated out and pressure is increased, whereby the semiconductor layer can be separated from the semiconductor substrate. After the heat treatment, the supporting substrate and the semiconductor substrate are in a state where one of the supporting substrate and the semiconductor substrate is provided over the other, and the supporting substrate and the semiconductor substrate can be separated from each other without application of large force. For example, a substrate provided over the other is lifted by a vacuum chuck, so that the substrates can be easily separated. At this time, if a substrate on the lower side is fixed with a vacuum chuck or a mechanical chuck, the supporting substrate and the semiconductor substrate can be separated from each other without horizontal misalignment.

Note that FIGS. 3A to 3C and FIGS. 4A to 4D illustrate an example in which the semiconductor substrate 108 is smaller than the supporting substrate 101; however, the present invention is not limited thereto, and the semiconductor substrate 108 and the supporting substrate 101 may have the same size or the semiconductor substrate 108 may be larger than the supporting substrate 101.

In the channel doping step, the impurity element may be directly added to the semiconductor substrate, or a protective layer, an insulating layer used for bonding, or the like may be formed over the semiconductor substrate and the impurity element may be added through the insulating layer.

Figure 4A:
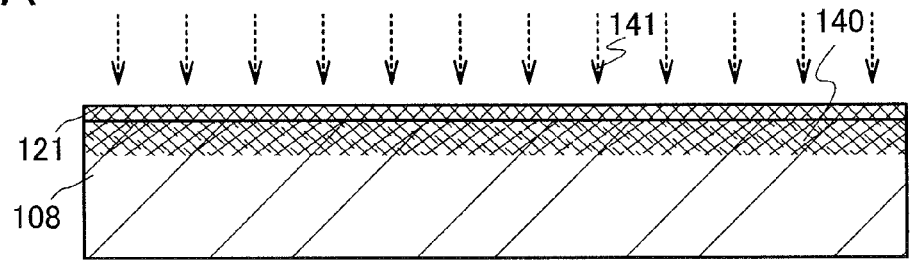
FIGS. 4A to 4D illustrate a manufacturing method of a semiconductor device according to the present invention.
Figure 4B:
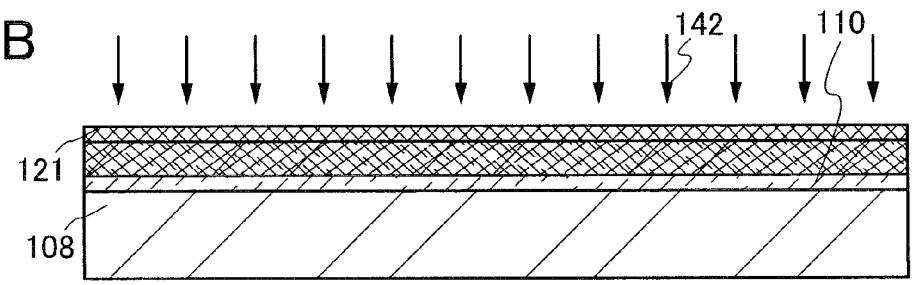

FIGS. 4A to 4D illustrate steps in which an insulating layer which is bonded to a semiconductor layer is provided on the supporting substrate side and the semiconductor layer is formed. FIG. 4A illustrates an example of forming the impurity region 140 by adding, as a channel doping step, the impurity element 141 imparting one conductivity type to the semiconductor substrate 108 on which a silicon oxide film is formed as a protective layer 121. In addition, a step of forming the embrittlement layer 110 by adding ions 142 accelerated by electric field to a predetermined depth of the semiconductor substrate 108 including the impurity region 140 is illustrated (see FIG. 4B). The irradiations with the impurity element 141 and the ions 142 are similar to those in the case of FIGS. 1B and 1C. If the protective layer 121 is formed on the surface of the semiconductor substrate 108, the surface can be prevented from being damaged by the irradiation with the impurity element and the ions, and accordingly degradation of planarity can be prevented. In addition, the protective layer 121 has an advantageous effect of preventing the diffusion of impurities into the semiconductor layer 102 formed using the semiconductor substrate 108.

Figure 4C:
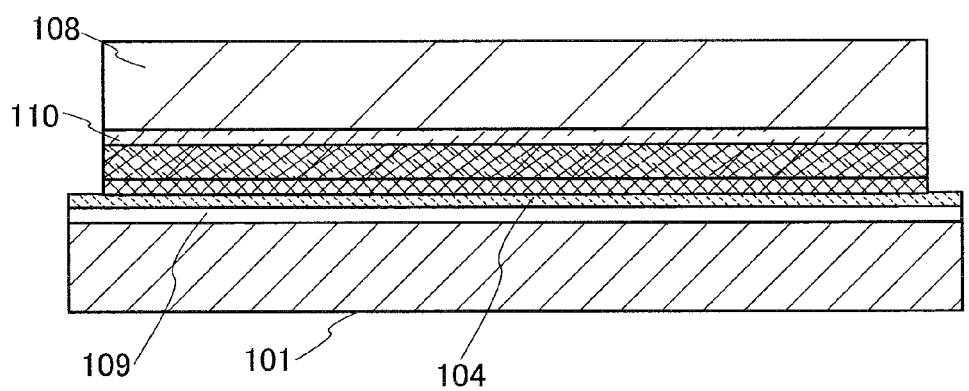

FIG. 4C illustrates a step in which the supporting substrate 101 provided with a blocking layer 109 and the insulating layer 104, and the protective layer 121 of the semiconductor substrate 108 are disposed to be in contact with each other to form a bond. The bond is formed by disposing the insulating layer 104 over the supporting substrate 101 to be in close contact with the protective layer 121 of the semiconductor substrate 108.

Figure 4D:
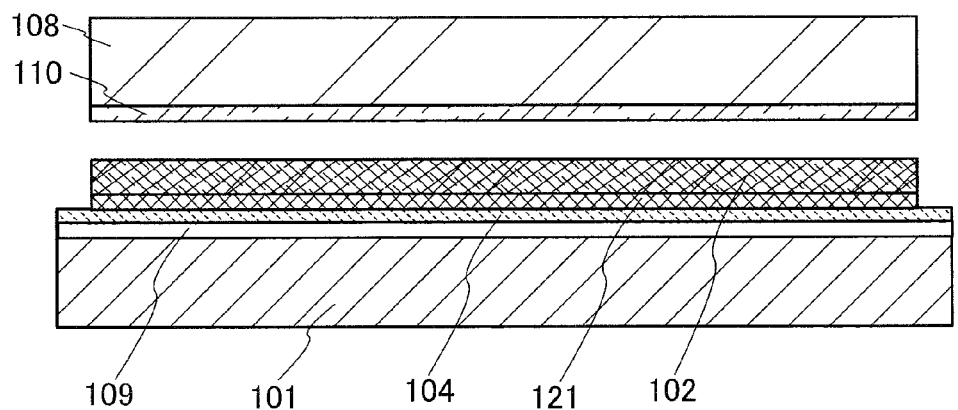

Then, the semiconductor substrate 108 is separated as illustrated in FIG. 4D. Heat treatment by which a semiconductor layer is separated is performed in a similar manner to the case of FIG. 3C. In this manner, a semiconductor substrate illustrated in FIG. 4D can be obtained.

As the supporting substrate 101, a substrate having an insulating property or a substrate having an insulating surface can be used, and it is possible to use any of a variety of glass substrates which are used in the electronics industry and are referred to as non-alkali glass substrates, such as an aluminosilicate glass substrate, an aluminoborosilicate glass substrate, and a barium borosilicate glass substrate. In addition, a quartz substrate, a ceramic substrate, a sapphire substrate, a metal substrate having a surface coated with an insulating layer, or the like can be used.

Through the above-described process, as illustrated in FIG. 4D, the insulating layer 104 is provided over the supporting substrate 101, which is a substrate having an insulating surface, and then the semiconductor layer 102, which is separated from the semiconductor substrate 108, is formed.

The semiconductor layer 102 is separated from the semiconductor substrate and transferred to the supporting substrate so that the surface of the semiconductor layer through which the impurity element is added in the channel doping step faces the supporting substrate side. Accordingly, the surface (the surface opposite to the surface through which the impurity element is added) of the semiconductor layer transferred to be placed over the supporting substrate can be prevented from suffering damage (such as surface roughness and entry of contaminants) from the channel doping step.

In addition, by the separation step and the ion irradiation step, in some cases, crystal defects generate in the semiconductor layer which is separated from the semiconductor substrate and transferred to the supporting substrate, and the planarity of the surface of the semiconductor layer is degraded so that roughness is generated. When a transistor is manufactured as a semiconductor element using the semiconductor layer, it is difficult to form a thin gate insulating layer with high withstand voltage over a top surface of the semiconductor layer having such roughness. In addition, if the semiconductor layer has crystal defects, performance and reliability of the transistor are adversely affected; for example, the localized interface state density with the gate insulating layer is increased.

Accordingly, it is preferable that the semiconductor layer be irradiated with an electromagnetic wave such as a laser beam so as to reduce the crystal defects. At least part of the semiconductor layer is melted by irradiation with an electromagnetic wave, whereby crystal defects in the semiconductor layer can be reduced. Note that an oxide film (a film which has been naturally oxidized or a chemical oxide film) formed on the surface of the semiconductor layer is preferably removed using a dilute hydrofluoric acid before irradiation with the electromagnetic wave.

Any electromagnetic waves may be used as long as they provide high energy to the semiconductor layer, and a laser beam can be preferably used.

The energy supply to the semiconductor layer can also be performed mainly by heat conduction, which is caused by colliding particles having high energy with the semiconductor layer by irradiation or the like. As a heat source for supplying the particles having high energy, plasma can be used; normal-pressure plasma, high-pressure plasma, a thermal plasma jet, or a flame of a gas burner, or the like can be used. Further, as another example of the heat source, an electron beam or the like can be given.

The wavelength of the electromagnetic wave is set so as to be absorbed by the semiconductor layer. The wavelength can be determined in consideration of the skin depth of the electromagnetic wave. For example, the wavelength of the electromagnetic wave can be 190 nm to 600 nm. In addition, the electromagnetic wave energy can be determined in consideration of the wavelength of the electromagnetic wave, the skin depth of the electromagnetic wave, the thickness of the semiconductor layer to be irradiated, and the like.

As the laser emitting the laser beam, a continuous wave laser, a pseudo continuous wave laser, or a pulsed laser can be used. For the semiconductor layer partially melted, a pulsed laser is preferable. For example, an excimer laser such as a KrF laser, or a gas laser such as an Ar laser or a Kr laser can be used. Alternatively, as a solid-state laser, a YAG laser, a $YVO_4$ laser, a YLF laser, a $YAlO_3$ laser, a $GdVO_4$ laser, a KGW laser, a KYW laser, an alexandrite laser, a Ti: sapphire laser, a $Y_2O_3$ laser, or the like can be used. An excimer laser is a pulsed laser, and some solid lasers such as a YAG laser can be used as a continuous wave laser, a pseudo continuous wave laser, and a pulsed laser. Note that in a solid-state laser, the second to fifth harmonics of a fundamental wave are preferably used. In addition, a semiconductor laser of GaN, GaAs, GaAlAs, InGaAsP, or the like can be used.

If the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. Flash annealing using the above-described lamp light may also be performed. Since flash annealing, which is performed by preferably using a halogen lamp, a xenon lamp, or the like, takes very short treatment time, temperature increase of the supporting substrate can be suppressed.

A shutter, a reflector such as a mirror or a half mirror, an optical system including a cylindrical lens, a convex lens, or the like may be provided to adjust the shape or path of the electromagnetic wave.

Note that, as for an irradiation method of the electromagnetic wave, an electromagnetic wave may be selectively emitted, or scanning with light (electromagnetic wave) may be performed in the XY directions. In this case, a polygon mirror or a galvanometer mirror is preferably used in the optical system.

Irradiation with an electromagnetic wave can be performed in an atmosphere containing oxygen such as an air atmosphere or in an inert atmosphere such as a nitrogen atmosphere. In order to perform irradiation with an electromagnetic wave in an inert atmosphere, irradiation with an electromagnetic wave may be performed in an airtight chamber while the atmosphere in this chamber is controlled. In the case where a chamber is not used, a nitrogen atmosphere can be formed by spraying an inert gas such as nitrogen gas or the like onto a surface irradiated with the electromagnetic wave.

Further, polishing treatment may be performed on the surface of the semiconductor layer in which crystal defects are reduced by supply of high energy such as electromagnetic wave irradiation. The polishing treatment can increase planarity of the surface of the semiconductor layer.

For the polishing treatment, a chemical mechanical polishing (CMP) method or a liquid jet polishing method can be used. Note that the surface of the semiconductor layer is cleaned and purified before the polishing treatment. The cleaning may be performed by megasonic cleaning, two-fluid jet cleaning, or the like; and dust or the like on the surface of the semiconductor layer is removed by the cleaning. In addition, it is preferable to remove a natural oxide film or the like on the surface of the semiconductor layer by using a dilute hydrofluoric acid to expose the semiconductor layer.

In addition, polishing treatment (or etching treatment) may be performed on the surface of the semiconductor layer before irradiation with the electromagnetic wave.

The semiconductor layer transferred from the semiconductor substrate to the supporting substrate may be subjected to etching treatment, polishing treatment, or the like as long as a region used as a channel formation region in the semiconductor layer of the transistor to be manufactured becomes a channel doping region.

In this embodiment mode, an SOI substrate which has a semiconductor layer including an impurity region formed through a channel doping step can be manufactured in the above-described manner.

When a transistor is manufactured using a semiconductor layer provided in an SOI substrate, the transistor can have a controlled threshold voltage. In addition, a gate insulating layer can be thinned, and the localized interface state density with the gate insulating layer can be reduced. If the semiconductor layer is formed to be thin, a transistor of complete depletion type can also be formed over the supporting substrate, using a single crystal semiconductor layer.

In this embodiment mode, when a single crystal silicon substrate is used as the semiconductor substrate 108, a single crystal silicon layer can be obtained as the semiconductor layer 102. In addition, in the manufacturing method of an SOI substrate according to this embodiment mode, the process temperature can be set at equal to or lower than 700° C.; therefore, a glass substrate can be used as the supporting substrate 101. That is, similarly to a conventional thin film transistor, a transistor can be formed over a glass substrate and a single crystal silicon layer can be used as the semiconductor layer. Accordingly, a transistor with high performance and high reliability, which can operate at high speed with a low consumption voltage and have a low subthreshold value and a high field-effect mobility, can be manufactured over a supporting substrate such as a glass substrate.

With the use of a semiconductor layer formed in a manufacturing method of an SOI substrate according to the present invention, a transistor can be formed, and a display element electrically connected to the transistor can be formed.

It is to be noted that in the present invention, a semiconductor device refers to a device which can function by utilizing semiconductor characteristics. By using the present invention, a device having a circuit including semiconductor elements (e.g., transistors, memory elements, and/or diodes) or a semiconductor device such as a chip including a processor circuit can be manufactured.

The present invention can also be applied to a semiconductor device having a display function (also referred to as a display device). The semiconductor devices using the present invention include a semiconductor device (light-emitting display device) in which a light-emitting element including a layer containing an organic material, an inorganic material, or a mixture of an organic material and an inorganic material, which exhibits light emission called electroluminescence (hereinafter also refereed to as EL) between electrodes is connected to a transistor; a semiconductor device (liquid crystal display device) using a liquid crystal element (liquid crystal display element) containing a liquid crystal material as a display element; and the like. In this specification, a display device means a device having a display element. Note that the display device may be a main body of a display panel provided with a plurality of pixels including a display element and a peripheral driver circuit for driving the pixels over a substrate. In addition, the display device may include one which is provided with a flexible printed circuit (FPC) or a printed wiring board (PWB) (such as an IC, a resistor, a capacitor, an inductor, or a transistor). Such display device may also include an optical sheet such as a polarizing plate or a retardation plate. Further, the display device may include a backlight unit (which may include a light guide plate, a prism sheet, a diffusion sheet, a reflective sheet, or a light source (e.g., an LED or a cold-cathode tube)).

Note that a display element or a semiconductor device may be in various modes and may include various elements. For example, a display medium in which contrast is changed by an electromagnetic effect, such as an EL element (an organic EL element, an inorganic EL element, or an EL element containing an organic compound and an inorganic compound), an electron emitting element, a liquid crystal element, electronic ink, a grating light valve (GLV), a plasma display (PDP), a digital micromirror device (DMD), a piezoelectric ceramic display, or a carbon nanotube can be employed. Note that a semiconductor device using an EL element may be an EL display; a semiconductor device using an electron emitting element may be a field emission display (FED), an SED (surface-conduction electron-emitter display) type flat panel display, or the like; a semiconductor device using a liquid crystal element may be a liquid crystal display, a transmissive liquid crystal display, a semi-transmissive liquid crystal display, or a reflective liquid crystal display; and a semiconductor device using electron ink may be electronic paper.

In this manner, electric characteristics of a transistor is controlled depending on the function required for a supporting substrate by a channel doping step of a semiconductor substrate; accordingly, a semiconductor device with high performance and low power consumption can be achieved. Further, such a semiconductor device can be manufactured with high yield and high productivity without complicating a manufacturing process.

Embodiment Mode 2

In Embodiment Mode 2, a manufacturing method of a CMOS (complementary metal oxide semiconductor) will be described as an example of a manufacturing method of a semiconductor device including a semiconductor element having high performance and high reliability with high yield, with reference to FIGS. 7A to 7E, FIGS. 8A to 8E, and FIGS. 9A to 9D. Note that repetitive descriptions for the same components as or components having similar functions to the components in Embodiment Mode 1 are omitted.

An example of forming impurity regions under different channel doping conditions in accordance with the conductivity types of transistors to be manufactured, in a step of channel-doping a semiconductor substrate, will be described in this embodiment mode. The different channel doping conditions mean adding impurity elements imparting different kinds of conductivity type or adding an impurity element having the same conductivity type at different concentrations.

Figure 7A:
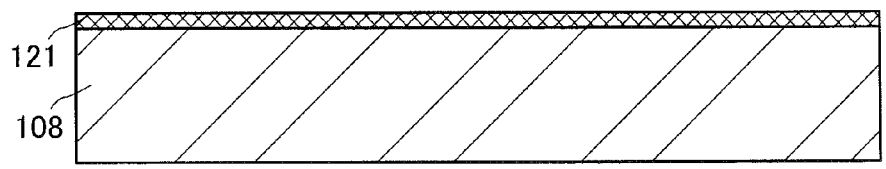
FIGS. 7A to 7E illustrate a manufacturing method of a semiconductor device according to the present invention.
Figure 7B:
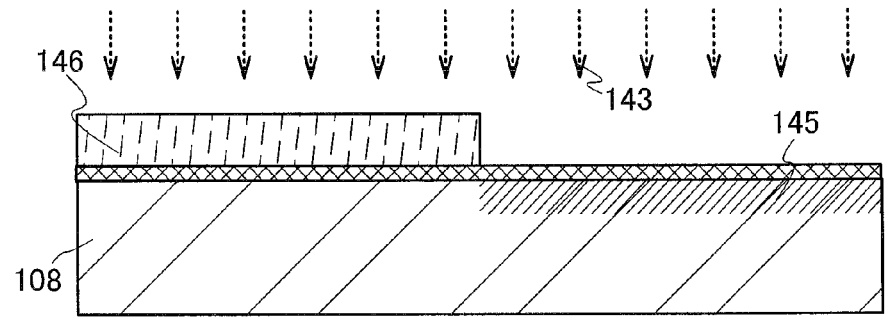
Figure 7C:
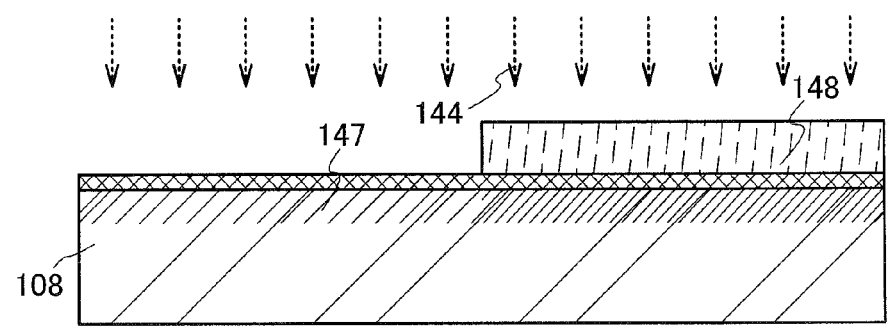

As illustrated in FIG. 7A, the protective layer 121 is formed over the semiconductor substrate 108. Next, a mask 146 which selectively covers the semiconductor substrate 108 and the protective layer 121 is formed. An impurity element 143 imparting one conductivity type is selectively added using the mask 146, so that an impurity region 145 is formed in the semiconductor substrate 108 (see FIG. 7B). The impurity region 145 is a channel doping region.

The mask 146 is removed, and a mask 148 which selectively covers the semiconductor substrate 108 and the protective layer 121 is formed. An impurity element 144 imparting one conductivity type is selectively added using the mask 148, so that an impurity region 147 is formed in the semiconductor substrate 108 (see FIG. 7C). The impurity region 147 is a channel doping region.

In this manner, performing the channel doping step selectively on the semiconductor substrate makes it possible to form impurity regions under different channel doping conditions in the semiconductor substrate 108.

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, the impurity element may be selectively added to the semiconductor substrate using a mask to form impurity regions having different impurity concentrations. Further, impurity elements imparting different conductivity types may be selectively added in accordance with the conductivity types of transistors to be manufactured to form impurity regions having different conductivity types in the semiconductor substrate.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

Figure 7D:
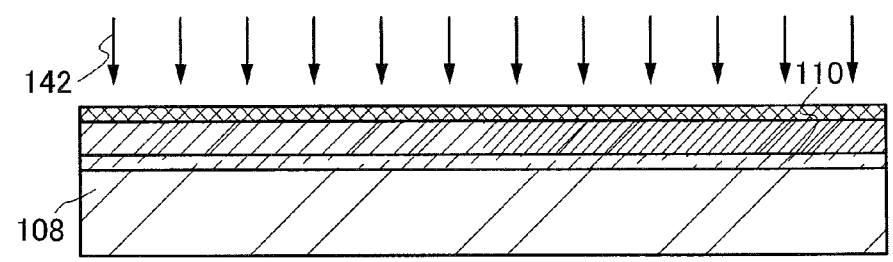
Figure 7E:
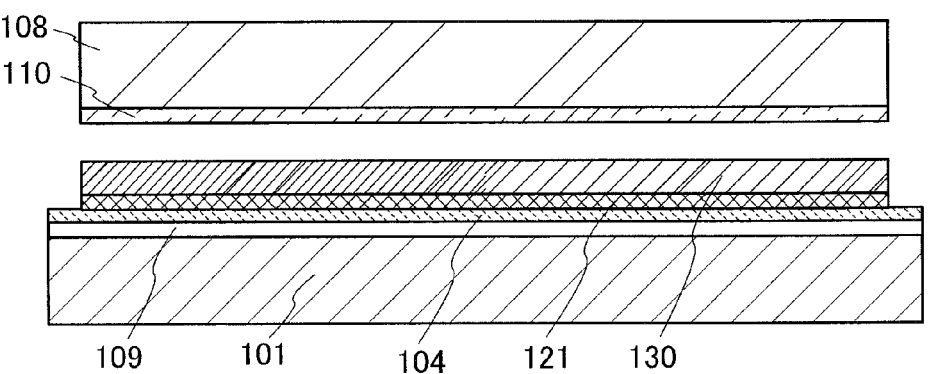

The semiconductor substrate 108 including the impurity region 145 and the impurity region 147 is irradiated with the ions 142; accordingly, the embrittlement layer 110 is formed (see FIG. 7D). The semiconductor substrate 108 is bonded to the supporting substrate 101 provided with the insulating layer 104 and the blocking layer 109 so that the insulating layer 104 and the protective layer 121 are bonded to each other, and heat treatment is performed to transfer a semiconductor layer 130 to the supporting substrate 101 side (see FIG. 7E). Through the above-described steps, an SOI substrate having the semiconductor layer 130 which includes the plurality of different impurity regions can be manufactured.

Figure 8A:
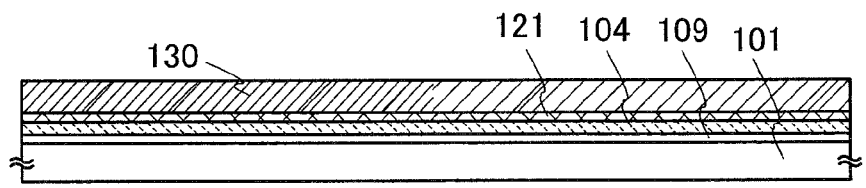
FIGS. 8A to 8E illustrate a manufacturing method of a semiconductor device according to the present invention.

In FIG. 8A, the blocking layer 109, the insulating layer 104, the protective layer 121, and the semiconductor layer 130 are formed over the supporting substrate 101. The semiconductor layer 130, the blocking layer 109, the insulating layer 104, and the protective layer 121 correspond to those in FIG. 7E. Note that here, although an example is described in which an SOI substrate having the structure illustrated in FIG. 8A is used, an SOI substrate having another structure described in this specification can also be used.

The semiconductor layer 130 includes impurity regions (channel doping regions) into which a p-type impurity element such as boron, aluminum, or gallium and an n-type impurity element such as phosphorus or arsenic are added in accordance with the formation regions of an n-channel field-effect transistor and a p-channel field-effect transistor.

Figure 8B:
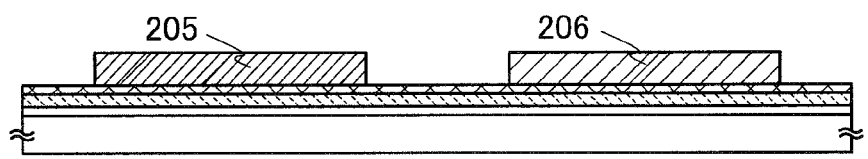

The semiconductor layer 130 is etched into island shapes in accordance with the position of the semiconductor elements; accordingly, separated semiconductor layers 205 and 206 are formed (see FIG. 8B). FIGS. 8A to 8E illustrates an example in which the protective layer and the insulating layer formed below the semiconductor layer are not etched by the etching treatment for forming the semiconductor layers 205 and 206; however, the protective layer and the insulating layer may be etched as well by the etching treatment for the semiconductor layer. In such a case, the protective layer and the insulating layer reflect the shape of the semiconductor layers 205 and 206 and remain only below the semiconductor layers 205 and 206.

The semiconductor layer 205 is formed from the impurity region 145, and the semiconductor layer 206 is formed from the impurity region 147. Each of the impurity regions 145 and 147 is a region containing an impurity element imparting one conductivity type formed under a channel doping condition corresponding to the electric characteristics required for the transistor to be manufactured.

An oxide film over the semiconductor layers is removed, and a gate insulating layer 207 which covers the semiconductor layers 205 and 206 is formed.

The gate insulating layer 207 may be formed of silicon oxide or a stacked structure of silicon oxide and silicon nitride. The gate insulating layer 207 may be formed by depositing an insulating film by a plasma CVD method or a low pressure CVD method or may be formed by solid phase oxidation or solid phase nitridation by plasma treatment. This is because a gate insulating layer which is formed by oxidizing or nitriding a semiconductor layer by plasma treatment is dense, has high withstand voltage, and is excellent in reliability. For example, surfaces of the semiconductor layers 205 and 206 are oxidized or nitrided using nitrous oxide ($N_2O$) diluted with Ar by 1 to 3 times (flow ratio) by application of a microwave (2.45 GHz) power of 3 to 5 kW at a pressure of 10 to 30 Pa. By this treatment, an insulating film with a thickness of 1 nm to 10 nm (preferably, 2 nm to 6 nm) is formed. Further, nitrous oxide ($N_2O$) and silane ($SiH_4$) are introduced, and a silicon oxynitride film is formed by a vapor deposition method by application of a microwave (2.45 GHz) power of 3 to 5 kW at a pressure of 10 to 30 Pa; accordingly, the gate insulating layer is formed. The combination of the solid phase reaction and the reaction by the vapor deposition method can form a gate insulating layer with a low interface state density and an excellent withstand voltage.

For the gate insulating layer 207, a high dielectric constant material such as zirconium dioxide, hafnium oxide, titanium dioxide, tantalum pentoxide, or the like may be used. If a high dielectric constant material is used for the gate insulating layer 207, gate leakage current can be reduced.

Figure 8C:
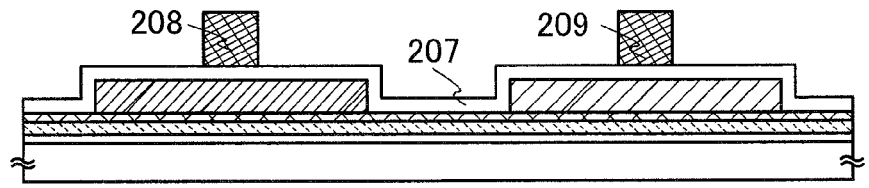
Figure 8D:
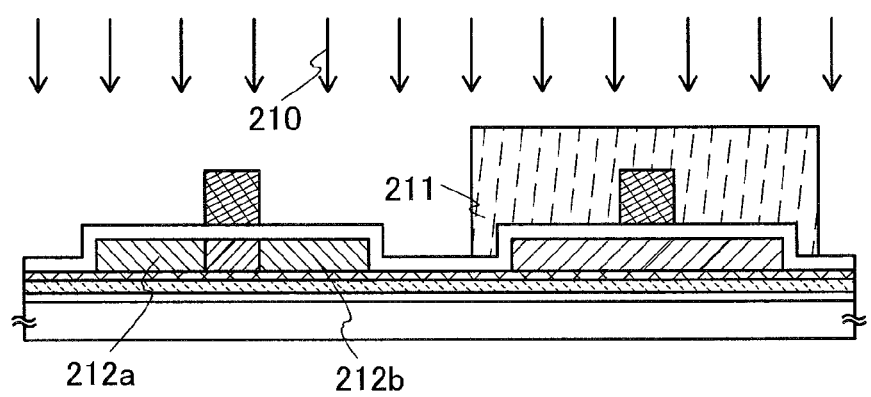
Figure 8E:
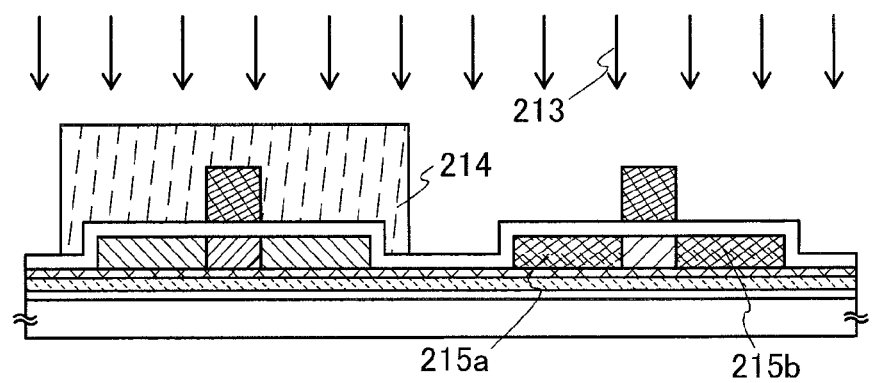

A gate electrode layer 208 and a gate electrode layer 209 are formed over the gate insulating layer 207 (see FIG. 8C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material that contains any of these elements as its main component. In addition, as the gate electrode layers 208 and 209, a semiconductor film typified by a polycrystalline silicon film doped with an impurity element such as phosphorus, or an AgPdCu alloy may be used.

A mask 211 which covers the semiconductor layer 206 is formed. An impurity element 210 imparting n-type conductivity is added using the mask 211 and the gate electrode layer 208 as masks to form first n-type impurity regions 212a and 212b (see FIG. 8D). In this embodiment mode, phosphine (PH$_3$) is used as a doping gas containing an impurity element. Here, doping is performed so that the first n-type impurity regions 212a and 212b contain an impurity element imparting n-type conductivity at a concentration of about $1 \times 10^{17}$/cm$^3$ to $5 \times 10^{18}$/cm$^3$. In this embodiment mode, phosphorus (P) is used as the impurity element imparting n-type conductivity.

Next, a mask 214 which covers the semiconductor layer 205 is formed. An impurity element 213 imparting p-type conductivity is added using the mask 214 and the gate electrode layer 209 as masks to form first p-type impurity regions 215a and 215b (see FIG. 8E). In this embodiment mode, diborane (B$_2$H$_6$) or the like is used as a doping gas containing an impurity element because boron (B) is used as an impurity element.

Figure 9A:
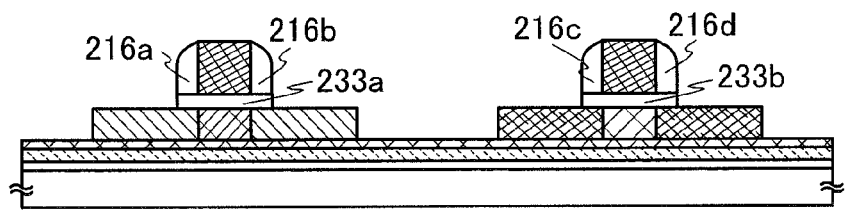
FIGS. 9A to 9D illustrate a manufacturing method of a semiconductor device according to the present invention.
Figure 9B:
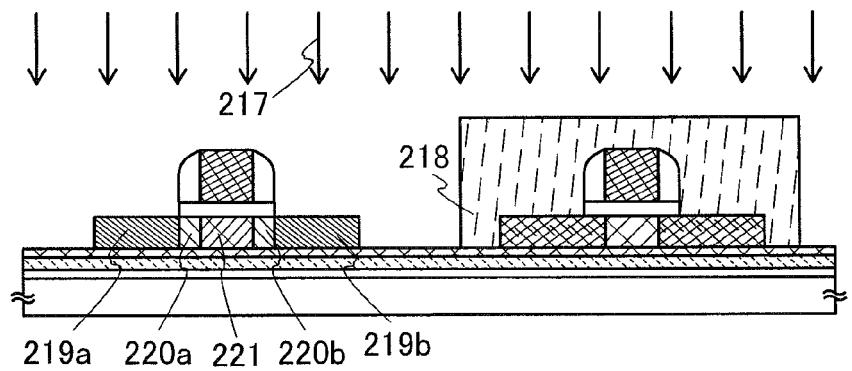
Figure 9C:
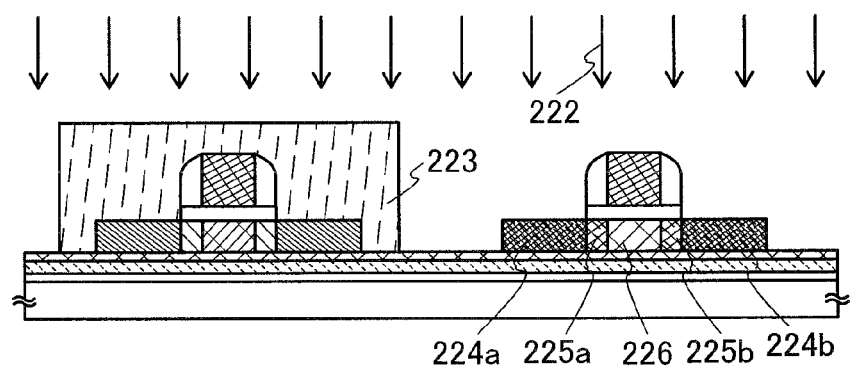

The mask 214 is removed, and sidewall insulating layers 216a to 216d each with a sidewall structure are formed on side surfaces of the gate electrode layers 208 and 209, and gate insulating layers 233a and 233b are formed (see FIG. 9A). The sidewall insulating layers 216a to 216d each with a sidewall structure may be formed on the side surfaces of the gate electrode layers 208 and 209 in a self-aligned manner in the following manner: an insulating layer covering the gate electrode layers 208 and 209 is formed and is processed by anisotropic etching using an RIE (reactive ion etching) method. Here, the insulating layers are not particularly limited and are preferably a layer of silicon oxide with favorable step coverage, which is formed by reacting TEOS (tetra-ethyl-ortho-silicate), silane, or the like with oxygen, nitrous oxide, or the like. The insulating layer can be formed by a thermal CVD method, a plasma CVD method, an atmospheric pressure CVD method, a bias ECR CVD method, a sputtering method, or the like. The gate insulating layers 233a and 233b can be formed, using the gate electrode layers 208 and 209 and the sidewall insulating layers 216a to 216d as masks and etching the gate insulating layer 207.

In this embodiment mode, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protecting the gate electrode layers in such a manner, film reduction of the gate electrode layers can be prevented in etching processing. In the case of forming silicide in a source region and a drain region, since a metal film formed for formation of the silicide is not in contact with the gate electrode layers, even when a material of the metal film can easily react with a material of the gate electrode layers, defects such as chemical reaction, diffusion, and the like can be prevented. Various etching methods such as a dry etching method and a wet etching method may be used for etching. In this embodiment mode, a dry etching method is used. As an etching gas, a chlorine-based gas typified by Cl$_2$, BCl$_3$, SiCl$_4$, or CCl$_4$; a fluorine-based gas typified by CF$_4$, SF$_6$, or NF$_3$; or O$_2$ can be used as appropriate.

Next, a mask 218 which covers the semiconductor layer 206 is formed. An impurity element 217 imparting n-type conductivity is added using the mask 218, the gate electrode layer 208, and the sidewall insulating layers 216a and 216b as masks to form second n-type impurity regions 219a and 219b and third n-type impurity regions 220a and 220b. In this embodiment mode, PH$_3$ is used as a doping gas containing an impurity element. Here, the doping is performed so that the second n-type impurity regions 219a and 219b contain an impurity element imparting n-type conductivity at a concentration of about $5 \times 10^{19}$/cm$^3$ to $5 \times 10^{20}$/cm$^3$. In addition, a channel formation region 221 is formed in the semiconductor layer 205 (see FIG. 9B).

The second n-type impurity regions 219a and 219b are high-concentration n-type impurity regions and function as a source and a drain. On the other hand, the third n-type impurity regions 220a and 220b are low-concentration impurity regions, or LDD (lightly doped drain) regions. Since the third n-type impurity regions 220a and 220b are formed in Loff regions, which are not covered with the gate electrode layer 208, off current can be reduced. Accordingly, a semiconductor device with higher reliability and lower power consumption can be manufactured.

The mask 218 is removed, and a mask 223 which covers the semiconductor layer 205 is formed. An impurity element 222 imparting p-type conductivity is added using the mask 223, the gate electrode layer 209, and the sidewall insulating layers 216c and 216d as masks to form second p-type impurity regions 224a and 224b, and third p-type impurity regions 225a and 225b.

Doping is performed so that the second p-type impurity regions 224a and 224b contain an impurity element imparting p-type conductivity at a concentration of about $1 \; 10^{20}$/cm$^3$ to $5 \times 10^{21}$/cm$^3$. In this embodiment mode, the third p-type impurity regions 225a and 225b are formed in a self-aligned manner using the sidewall insulating layers 216c and 216d so as to have a lower concentration than the second p-type impurity regions 224a and 224b. In addition, a channel formation region 226 is formed in the semiconductor layer 206 (see FIG. 9C).

The second p-type impurity regions 224a and 224b are high-concentration p-type impurity regions and function as a source and a drain. On the other hand, the third p-type impurity regions 225a and 225b are low-concentration impurity regions, or LDD (lightly doped drain) regions. Since the third p-type impurity regions 225a and 225b are formed in Loff regions, which are not covered with the gate electrode layer 209, off current can be reduced. Accordingly, a semiconductor device with higher reliability and lower power consumption can be manufactured.

The mask 223 is removed, and heat treatment, intense light irradiation, or laser beam irradiation may be performed in order to activate the impurity element. At the same time as the activation, plasma damage to the gate insulating layer and plasma damage to the interface between the gate insulating layer and the semiconductor layer can be recovered.

Then, an interlayer insulating layer which covers the gate electrode layers and the gate insulating layers is formed. In this embodiment mode, a stacked structure of an insulating film 227 containing hydrogen to serve as a protective film and an insulating layer 228 is employed. The insulating film 227 and the insulating layer 228 may be formed of a silicon nitride film, a silicon nitride oxide film, a silicon oxynitride film, or a silicon oxide film by a sputtering method or a plasma CVD method. Alternatively, a single layer structure or a stacked structure of three or more layers using another insulating film containing silicon may be employed.

In addition, heat treatment is performed in a nitrogen atmosphere at 300° C. to 550° C. for 1 to 12 hours to hydrogenate the semiconductor layers. Preferably, this step is performed at 400° C. to 500° C. This step is a step for terminating a dangling bond of the semiconductor layers with hydrogen contained in the insulating film 227, which is an interlayer insulating layer. In this embodiment mode, heat treatment is performed at 410° C. for 1 hour.

Each of the insulating film 227 and the insulating layer 228 can also be formed of a material selected from aluminum nitride (AlN), aluminum oxynitride (AlON), aluminum nitride oxide having a higher content of nitrogen than oxygen (AlNO), aluminum oxide, diamond-like carbon (DLC), nitrogen-containing carbon (CN), or another substance containing an inorganic insulating material. Further, a siloxane resin may be used as well. Note that the siloxane resin corresponds to a resin containing a Si—O—Si bond. Siloxane is composed of a skeleton structure formed by the bond of silicon (Si) and oxygen (O). As a substituent, an organic group containing at least hydrogen (e.g., an alkyl group or an aryl group) is used. A fluoro group may also be included in the organic group. Alternatively, an organic insulating material such as polyimide, acrylic, polyamide, polyimide amide, resist, benzocyclobutene, or polysilazane can be used. A coating film with high flatness may be formed by a coating method.

The insulating film 227 and the insulating layer 228 can be formed by dipping, spray coating, a doctor knife, a roll coater, a curtain coater, a knife coater, a CVD method, an evaporation method, or the like. The insulating film 227 and the insulating layer 228 may also be formed by a droplet discharge method. In the case of using a droplet discharge method, a material solution can be saved. Alternatively, a method like a droplet discharge method by which a pattern can be transferred or drawn, such as a printing method (a method for forming a pattern such as screen printing or offset printing) or the like can be used.

Next, contact holes (openings) which reach the semiconductor layers are formed in the insulating film 227 and the insulating layer 228, using a mask made of a resist. Etching may be performed once or plural times depending on the selection ratio of a material to be used. The insulating film 227 and the insulating layer 228 are partly removed by the etching, so that the openings which reach the second n-type impurity regions 219a and 219b and the second p-type impurity regions 224a and 224b, which are source regions and drain regions, are formed. For the etching, wet etching, dry etching, or both of them may be employed. A hydrofluoric-acid-based solution such as a mixed solution of ammonium hydrogen fluoride and ammonium fluoride may be used as an etchant for wet etching. As an etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which function as source and drain electrode layers which are electrically connected to parts of the source regions and the drain regions. The wiring layers can be formed by forming a conductive layer by a PVD method, a CVD method, an evaporation method, or the like and then etching the conductive layer into a desired shape. In addition, a conductive layer can be selectively formed in a predetermined position by a droplet discharge method, a printing method, an electrolytic plating method, or the like. A reflow method or a damascene method may also be used. As a material for the wiring layers, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. Further, a stacked structure of these materials may also be used.

Figure 9D:
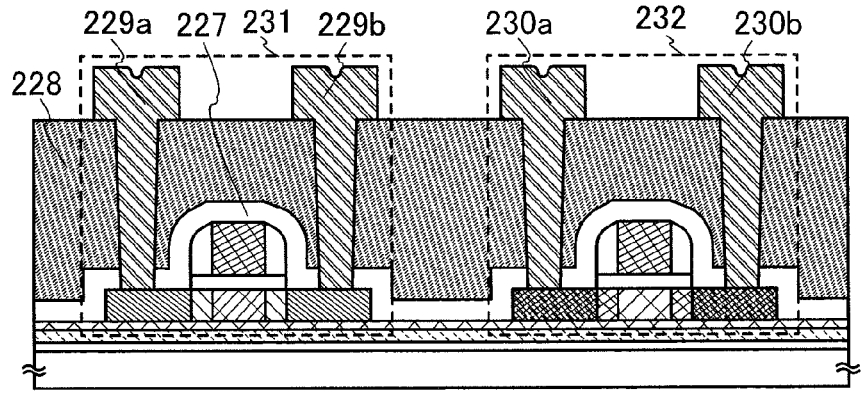

Through the above-described process, a semiconductor device having a CMOS structure which includes a thin film transistor 231, which is an n-channel thin film transistor, and a thin film transistor 232, which is a p-channel thin film transistor, can be manufactured (see FIG. 9D). Although not illustrated in the drawings, since a CMOS structure is described in this embodiment mode, the thin film transistor 231 and the thin film transistor 232 are electrically connected to each other.

The thin film transistor is not limited to this embodiment mode, and may have a single gate structure, in which one channel formation region is formed, a double gate structure, in which two channel formation regions are formed, or a triple gate structure, in which three channel formation regions are formed.

In this manner, electric characteristics of a transistor is controlled depending on the function required for a supporting substrate by a channel doping step of a semiconductor substrate; accordingly, a semiconductor device with high performance and low power consumption can be achieved. Further, such a semiconductor device can be manufactured with high yield and high productivity without complicating a manufacturing process.

Embodiment Mode 3

In Embodiment Mode 3, a different example of the step of bonding the semiconductor layer from the semiconductor substrate to the supporting substrate in Embodiment Mode 1 will be described. Accordingly, repetitive descriptions for the same components as or components having similar functions to the components in Embodiment Mode 1 are omitted.

In this embodiment mode, when semiconductor layers are transferred from a semiconductor substrate, the semiconductor substrate is etched selectively (this step is also referred to as groove processing), and a plurality of semiconductor layers divided such that they have the size of semiconductor elements to be manufactured are transferred to a supporting substrate. Thus, a plurality of island-shaped semiconductor layers can be formed over the supporting substrate. Since the semiconductor layers which are processed into an element size in advance are transferred, transfer to the supporting substrate can be performed on a semiconductor layer basis; thus, the size and shape of the semiconductor substrate are not restricted. Therefore, transfer of semiconductor layers to a large-sized supporting substrate can be performed more efficiently.

Further, the shape of the semiconductor layers formed over the supporting substrate may be processed or modified by etching in order to control the shape precisely. Accordingly, discrepancy in formation position and defects in shape of the semiconductor layer due to pattern misalignment caused by light going around a resist mask in light exposure, or the like during resist mask formation; position misalignment caused by a bonding step during transfer; or the like can be modified.

Accordingly, a plurality of semiconductor layers having a desired shape can be formed over a supporting substrate with high yield. Therefore, a semiconductor device, which includes a semiconductor element and an integrated circuit, with more precision and high performance can be manufactured over a large-sized substrate with high throughput and high productivity.

Figure 5A:
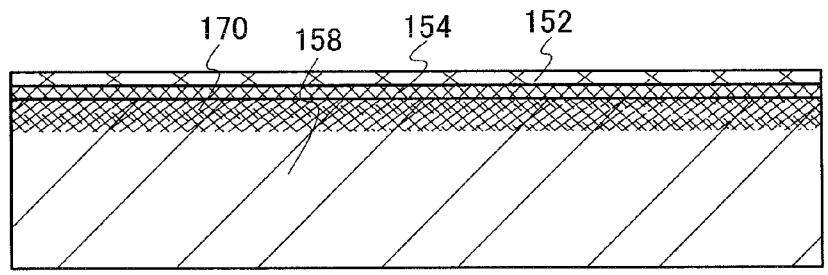
FIGS. 5A to 5E illustrate a manufacturing method of a semiconductor device according to the present invention.

FIG. 5A illustrates a state where a protective layer 154 and a silicon nitride film 152 are formed over a semiconductor substrate 158. The silicon nitride film 152 is used as a hard mask in groove processing of the semiconductor substrate 158. The silicon nitride film 152 may be formed by a vapor deposition method using silane and ammonia. Similarly to Embodiment Mode 1, an impurity region 170 added with an impurity element imparting one conductivity type for controlling the threshold voltage is formed in the semiconductor substrate 158. The impurity region 170 is used as a channel formation region in a semiconductor layer of a transistor after being transferred to a supporting substrate.

Figure 5B:
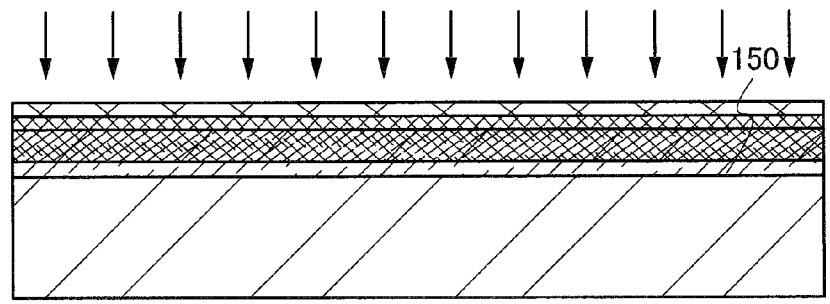

Next, an entire surface of the semiconductor substrate 158 is irradiated with ions to form an embrittlement layer 150 (see FIG. 5B). Ion irradiation is performed in consideration of the thickness of a semiconductor layer to be transferred to a supporting substrate. The accelerating voltage in the irradiation with ions is determined in consideration of such a thickness so that the impurity element is added to a deep region of the semiconductor substrate 158. By this treatment, the embrittlement layer 150 is formed in a region at a certain depth from the surface of the semiconductor substrate 158.

The groove processing is performed in consideration of the shape of a semiconductor layer of a semiconductor element. That is, the groove processing is performed on the semiconductor substrate 158 such that a semiconductor layer of a semiconductor element can be transferred to a supporting substrate and a portion of the semiconductor layer remains as a convex portion.

Figure 5C:
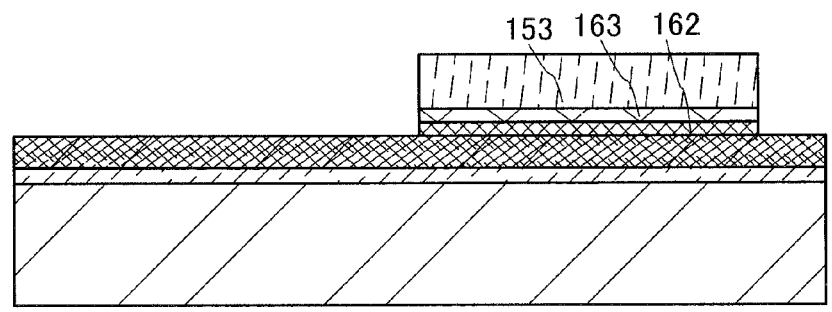

A mask 153 is formed using a photoresist. The silicon nitride film 152 and the protective layer 154 are etched using the mask 153, so that a protective layer 162 and a silicon nitride layer 163 are formed (see FIG. 5C).

Figure 5D:
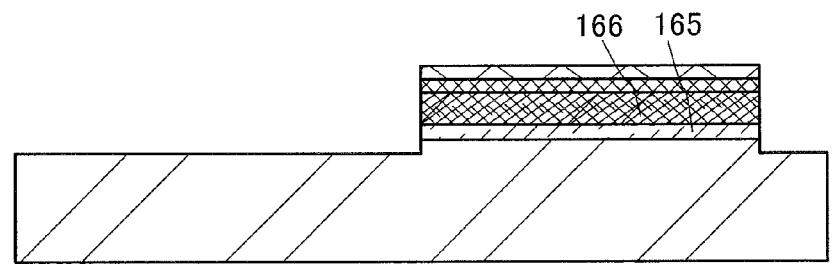

Then, the semiconductor substrate 158 is etched using the silicon nitride layer 163 as a hard mask so that the semiconductor substrate 158 has an embrittlement layer 165 and a semiconductor layer 166 (see FIG. 5D). In the present invention, a semiconductor region which is part of the semiconductor substrate processed into a convex shape by the embrittlement layer and the groove processing is referred to as the semiconductor layer 166 as illustrated in FIG. 5D.

The etching depth of the semiconductor substrate 158 is appropriately determined in consideration of the thickness of a semiconductor layer to be transferred to a supporting substrate. The thickness of the semiconductor layer can be controlled by the depth which hydrogen ions reach by irradiation. The depth of the groove formed in the semiconductor substrate 158 is preferably greater than the depth of the embrittlement layer. In the groove processing, if the groove is processed to be deeper than the embrittlement layer, the embrittlement layer can remain only in a region of a semiconductor layer which should be separated.

Figure 5E:
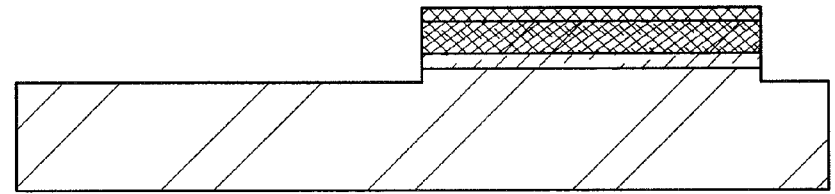
Figure 6A:
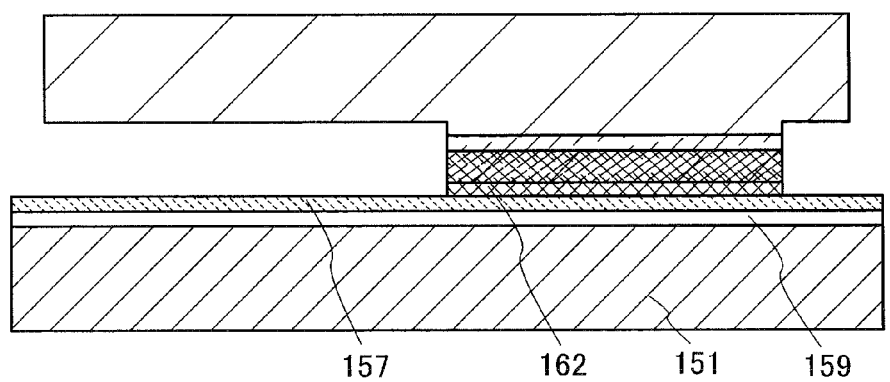
FIGS. 6A to 6D illustrate a manufacturing method of a semiconductor device according to the present invention.

The silicon nitride layer 163 on the surface is removed (see FIG. 5E). Then, a surface of the protective layer 162 over the semiconductor substrate 158 is bonded to a supporting substrate 151 (see FIG. 6A).

A blocking layer 159 and an insulating layer 157 are formed over the surface of the supporting substrate 151. The blocking layer 159 is provided to prevent contamination of the semiconductor layer due to impurities such as sodium ions which are diffused from the supporting substrate 151. However, in the case where there is no concern that impurities causing adverse effects on the semiconductor layer would be diffused from the supporting substrate 151, the blocking layer 159 can also be omitted. The insulating layer 157 is provided in order to form a bond with the protective layer 162.

The bond can be formed by making the protective layer 162 having a cleaned surface on the semiconductor substrate 158 side be in close contact with the insulating layer 157 on the supporting substrate side. The bond can be formed at room temperature. This bonding is carried out at the atomic level, and a strong bond is formed at room temperature by van der Waals forces. Since the semiconductor substrate 158 is subjected to groove processing, the convex portion which forms the semiconductor layer is made to be in contact with the supporting substrate 151.

Figure 6B:
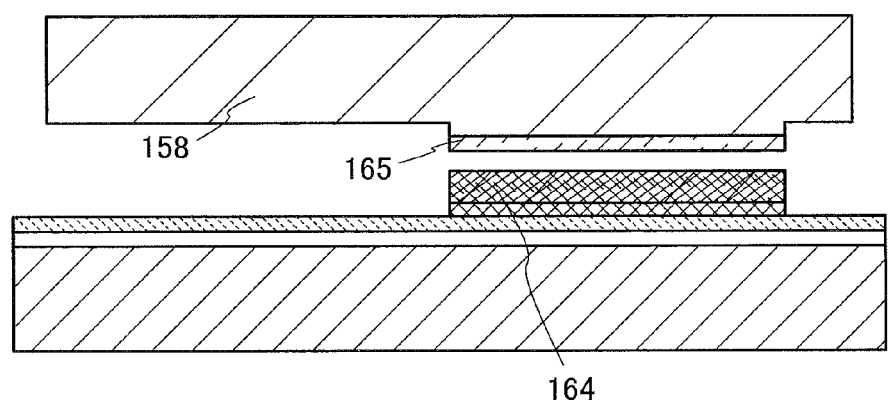

After the semiconductor substrate 158 and the supporting substrate 151 are bonded, heat treatment is performed; accordingly, a semiconductor layer 164 can be separated from the semiconductor substrate 158 and fixed to the supporting substrate 151 as illustrated in FIG. 6B. Separation of the semiconductor layer is performed in the following manner: the volume of microcavities formed in the embrittlement layer 150 is changed, and a ruptured section is generated along the embrittlement layer 150. After that, in order to make the bond stronger, it is preferable to perform heat treatment. In this manner, the semiconductor layer is formed over the insulating surface. FIG. 6B illustrates a state where the semiconductor layer 164 is bonded to the supporting substrate 151.

In this embodiment mode, since the semiconductor layer which has been processed into an element size in advance is transferred, transfer to the supporting substrate can be performed on a semiconductor layer basis; thus, the size and shape of the semiconductor substrate are not restricted. Therefore, semiconductor layers having various shapes can be formed over the semiconductor substrate. For example, semiconductor layers can be freely formed on a mask basis of a light-exposure apparatus at the time of etching, on a stepper basis of the light-exposure apparatus for forming the mask patterns, and on a size basis of a panel or a chip of a semiconductor device, which is cut from a large-sized substrate.

The semiconductor layer 164 may be used directly as a semiconductor layer of a semiconductor element, or the shape of the semiconductor layer 164 may be further processed by etching.

Figure 6C:
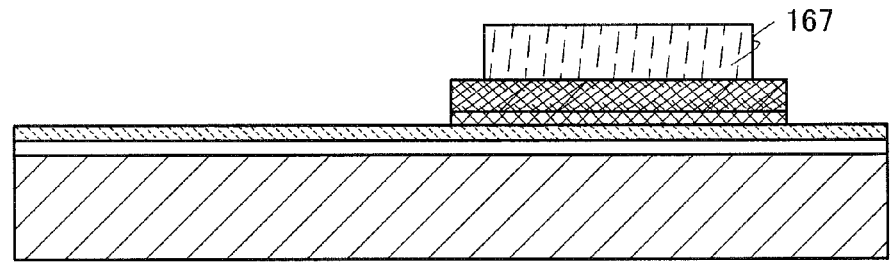
Figure 6D:
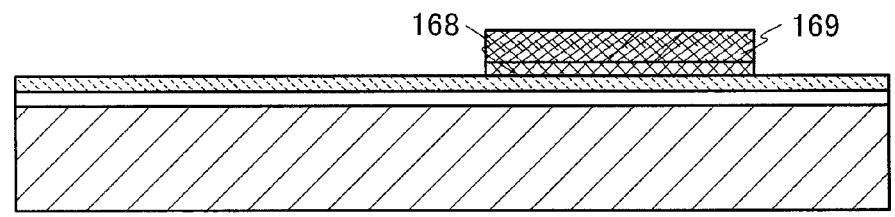

FIGS. 6C and 6D illustrate an example where the shape of the transferred semiconductor layer 164 is further processed by etching. A mask 167 is formed in such a manner that a peripheral part of the semiconductor layer 164, which is an unnecessary part, is exposed.

The semiconductor layer 164 is etched using the mask 167 to form a semiconductor layer 169. In this embodiment mode, the protective layer 162 under the semiconductor layer is also etched together with the semiconductor layer to form a protective layer 168 (see FIG. 6D). In this manner, misalignment of a formation region, defects in shape, or the like which is caused in a manufacturing process can be modified by further processing the shape after transfer to a supporting substrate.

Although FIGS. 5A to 5E and FIGS. 6A to 6D illustrate the example where the semiconductor layer is transferred to the insulating layer provided over the supporting substrate, this embodiment mode can of course be applied to the case where a semiconductor layer is formed over an insulating layer over an interlayer insulating layer as a semiconductor layer stacked in an upper layer of a semiconductor element.

This embodiment mode can be implemented in combination with Embodiment Mode 1 as appropriate.

Embodiment Mode 4

In Embodiment Mode 4, a different example of the step of bonding the semiconductor layer from the semiconductor substrate to the supporting substrate in Embodiment Mode 1 will be described. Accordingly, repetitive descriptions for the same components as or components having similar functions to the components in Embodiment Mode 1 are omitted.

In this embodiment mode, an example where a semiconductor layer is separated from a semiconductor substrate and then bonded to a supporting substrate will be described.

Figure 22A:
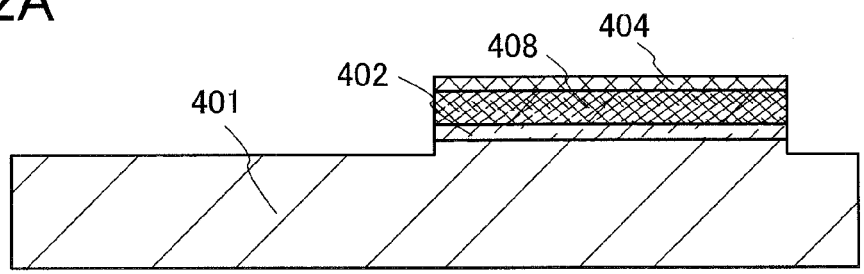
FIGS. 22A to 22D illustrate a manufacturing method of a semiconductor device according to the present invention.

As illustrated in FIGS. 5A to 5E of Embodiment Mode 2, an embrittlement layer is formed in a semiconductor substrate and a groove is formed. The groove processing is performed in consideration of the shape of a semiconductor layer of a semiconductor element. That is, the groove processing is performed on a semiconductor substrate 401 so that the semiconductor layer of the semiconductor element remains as a convex portion in order to be transferred to a supporting substrate. In FIG. 22A, the semiconductor substrate 401, an embrittlement layer 402, a semiconductor layer 408 which is part of the semiconductor substrate, and an insulating film 404 are formed. In this embodiment mode, silicon oxide is used for the insulating film 404. Similarly to Embodiment Mode 1, an impurity region added with an impurity element imparting one conductivity type for controlling the threshold voltage is formed in the semiconductor layer 408 of the semiconductor substrate 401. The impurity region is used as a channel formation region in a semiconductor layer 403 of a transistor after being transferred to a supporting substrate.

Next, heat treatment is performed so that adjacent microvoids are coupled in the embrittlement layer 402; accordingly, the volume of the microvoids increases. Consequently, the semiconductor substrate 401 is cleaved at the embrittlement layer 402, and the semiconductor layer 408 and the insulating film 404 are separated from the semiconductor substrate 401. The heat treatment may be performed at a temperature of, for example, 400° C. to 600° C.

Note that the heat treatment may be performed by dielectric heating with high frequency waves such as microwaves. The heat treatment using dielectric heating can be performed by irradiating the semiconductor substrate 401 with a high frequency wave having a frequency of 300 MHz to 3 THz generated by a high-frequency generation apparatus. Specifically, for example, the semiconductor substrate 401 is irradiated with a microwave of 2.45 GHz at 900 W for 14 minutes, whereby adjacent microvoids are coupled in the embrittlement layer and consequently the semiconductor substrate 401 can be cleaved.

Figure 22B:
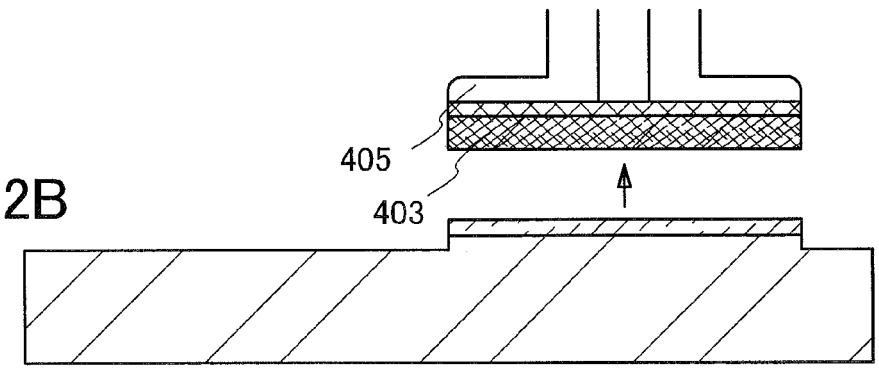

Then, as illustrated in FIG. 22B, a collet 405 is firmly fixed to the insulating film 404 formed over the semiconductor layer 408, and the semiconductor layer 408 is separated off from the semiconductor substrate 401. Even in the case where the semiconductor substrate 401 is not sufficiently cleaved by the above heat treatment, application of force with the collet 405 makes it possible to completely separate the semiconductor layer 408 from the semiconductor substrate 401 and obtain the semiconductor layer 403. A means which can be firmly fixed to a selected one of the semiconductor layers 408, for example, a chuck such as a vacuum chuck or a mechanical chuck, a microneedle with a tip to which an adhesive is attached, or the like is used as the collet 405. FIG. 22B illustrates the case where a vacuum chuck is used as the collet 405.

As the adhesive attached to the microneedle, an expoxy-based adhesive, a ceramic-based adhesive, a silicone-based adhesive, a low-temperature coagurant, or the like can be used. As the low-temperature coagulant, MW-1 (manufactured by Eminent Supply Corporation) can be used for example. The freezing point of the MW-1 is approximately 17° C., and the MW-1 exhibits an adhesive effect at a temperature of equal to or lower than the freezing point (preferably, equal to or lower than 10° C.) and does not exhibit the adhesive effect at a temperature of equal to or higher than the freezing point (preferably, approximately 25° C.).

Note that before cleavage of the semiconductor substrate 401, hydrogenation treatment may be performed on the semiconductor substrate 401. The hydrogenation treatment is performed, for example, at 350° C. in a hydrogen atmosphere for approximately two hours.

Figure 22C:
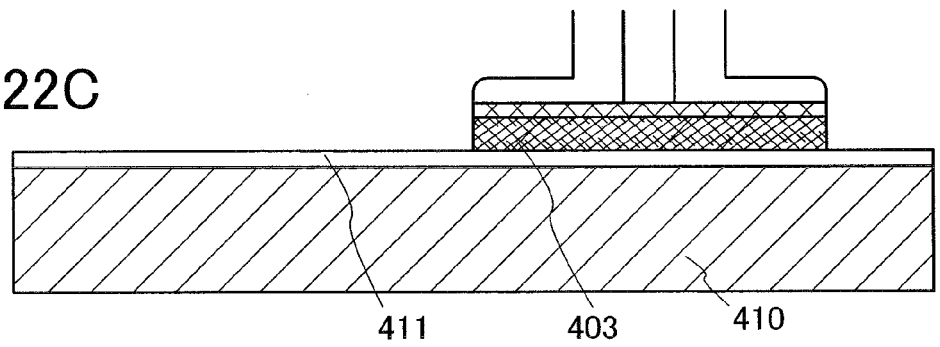

Next, as illustrated in FIG. 22C, the semiconductor layer 403 and a supporting substrate 410 are bonded to each other so that the surface of the semiconductor layer 403, which is exposed by separation, faces the supporting substrate 410 side. In this embodiment mode, an insulating film 411 is formed over the supporting substrate 410, and by bonding the insulating film 411 and the semiconductor layer 403, the semiconductor layer 403 and the supporting substrate 410 can be bonded to each other. After bonding of the semiconductor layer 403 and the insulating film 411, heat treatment at 400° C. to 600° C. is preferably performed to further strengthen the bonding.

Since the bond is formed by van der Waals forces, a strong bond is formed even at room temperature. Note that since the above-described bonding can be performed at a low temperature, various substrates can be used as the supporting substrate 410. As the supporting substrate 410, for example, a glass substrate made of aluminosilicate glass, barium borosilicate glass, aluminoborosilicate glass, or the like; or a substrate such as a quartz substrate, a sapphire substrate, or the like can be used. Furthermore, as the supporting substrate 410, a semiconductor substrate formed of silicon, gallium arsenide, indium phosphide, or the like can be used. Alternatively, a metal substrate including a stainless steel substrate may be used as the supporting substrate 410.

Note that the insulating film 411 is not necessarily formed over the surface of the supporting substrate 410. Even if the insulating film 411 is not formed, the supporting substrate 410 and the semiconductor layer 403 can be bonded to each other. Note that the insulating film 411 formed over the surface of the supporting substrate 410 can prevent impurities such as alkali metal or an alkaline earth metal from entering the semiconductor layer 403 from the supporting substrate 410.

In the case of forming the insulating film 411, since not the supporting substrate 410 but the insulating film 411 is bonded to the semiconductor layer 403, the substrate used as the supporting substrate 410 can be selected from a further wide range of substrates. A substrate made of a synthetic resin having flexibility such as plastics, which generally has a low allowable temperature limit, can be used as the supporting substrate 410 in the case of forming the insulating film 411, as long as the substrate can withstand the process temperature in a manufacturing process.

Further, the surface of the semiconductor layer 403, which is exposed by separation, may be subjected to thermal annealing by laser beam irradiation before or after bonding of the semiconductor layer 403 to the supporting substrate 410. In the case of performing thermal annealing before bonding of the semiconductor layer 403 to the supporting substrate 410, the surface exposed by separation is planarized, so that bonding strength can be further increased. Further, in the case of performing thermal annealing after bonding of the semiconductor layer 403 to the supporting substrate 410, the semiconductor layer 403 is partially melted, so that bonding strength can be increased.

The semiconductor layer 403 and the supporting substrate 410 may be attached not only by bonding but also by applying vibration with a high frequency of approximately 10 MHz to 1 THz to the semiconductor layer 403 to generate frictional heat between the semiconductor layer 403 and the supporting substrate 410 and partially melting the semiconductor layer 403 by the heat.

In the case of using the MW-1 as a low-temperature coagulant, the low-temperature coagulant attached to a tip of a microneedle is made to be in contact with the insulating film 404 at such a temperature that the low-temperature coagulant does not exhibit an adhesive effect (e.g., approximately 25° C.). Next, the temperature is decreased to such a temperature that the low-temperature coagulant exhibits an adhesive effect (e.g., approximately 5° C.) to coagulate the low-temperature coagulant; accordingly, the microneedle and the insulating film 404 are firmly fixed to each other. After the semiconductor layer 403 separated off from the semiconductor substrate 401 is bonded to the supporting substrate 410, the temperature of the low-temperature coagulant is increased to such a temperature that the low-temperature coagulant does not exhibit an adhesive effect (e.g., approximately 25° C.); accordingly, the microneedle can be separated from the semiconductor layer 403.

Figure 22D:
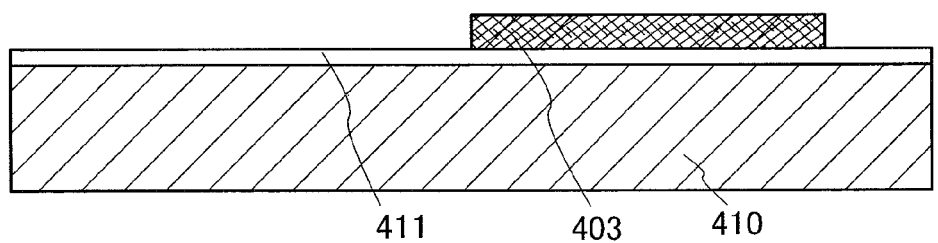

The insulating film 404 over the semiconductor layer 403 is removed. In this manner, the island-shaped semiconductor layer 403 is formed over the supporting substrate 410 and the insulating film 411 (see FIG. 22D). The shape of the semiconductor layer 403 may be further processed by etching.

As illustrated in FIGS. 22A to 22D, when the surface of the semiconductor layer, which is exposed by cleavage, faces the supporting substrate side, the surface having higher planarity is in contact with a gate insulating film. Consequently, the interface state density between the semiconductor layer and the gate insulating film can be made low and even. Therefore, polishing for planarizing the surface of the semiconductor layer to be in contact with the gate insulating film can be omitted, or polishing time can be shortened; accordingly, cost can be suppressed low and throughput can be increased.

Note that the semiconductor layer can be bonded to the supporting substrate so that the surface of the semiconductor layer, which is exposed by cleavage, is in contact with the gate insulating film. This example will be described with reference to FIGS. 23A to 23D and FIGS. 24A to 24C.

Figure 23A:
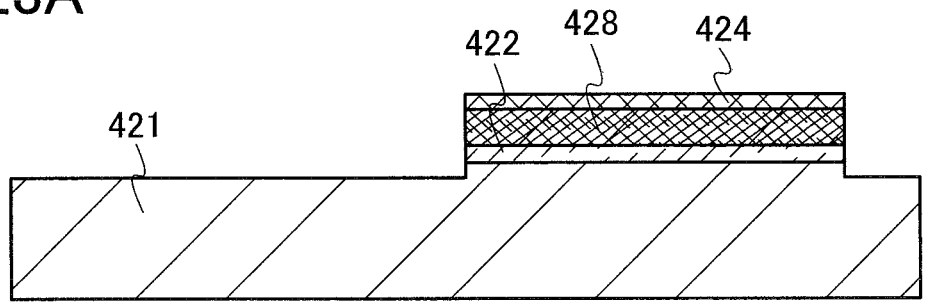
FIGS. 23A to 23D illustrate a manufacturing method of a semiconductor device according to the present invention.

In FIG. 23A, a semiconductor substrate 421, an embrittlement layer 422, a semiconductor layer 428 which is part of the semiconductor substrate, and an insulating film 424 are formed similarly to FIG. 22A. In this embodiment mode, silicon oxide is used for the insulating film 424. Similarly to Embodiment Mode 1, an impurity region added with an impurity element imparting one conductivity type for controlling the threshold voltage is formed in the semiconductor layer 428 of the semiconductor substrate 421. The impurity region is used as a channel formation region in a semiconductor layer 423 of a transistor after being transferred to a supporting substrate.

Figure 23B:
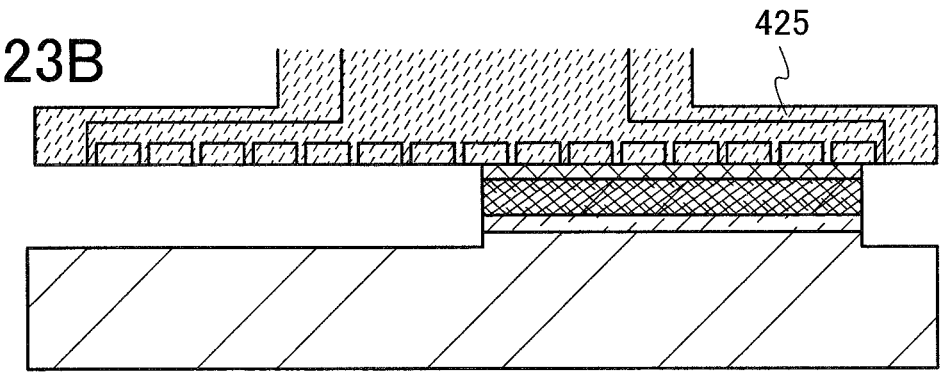

Next, the semiconductor substrate 421 is firmly fixed to a holder 425 as illustrated in FIG. 23B. The semiconductor substrate 421 is fixed so that the semiconductor layer 428 faces the holder 425 side. As the holder 425, a large-sized vacuum chuck or mechanical chuck which can withstand subsequent heat treatment and which can be firmly fixed to a plurality of semiconductor layers (the semiconductor layer 428 is illustrated in FIGS. 23A to 23D as one of the semiconductor layers) so as to overlap with the plurality of semiconductor layers, specifically, a porous vacuum chuck, a noncontact vacuum chuck, or the like can be used. In this embodiment mode, an example of using a vacuum chuck as the holder 425 is described.

Figure 23C:
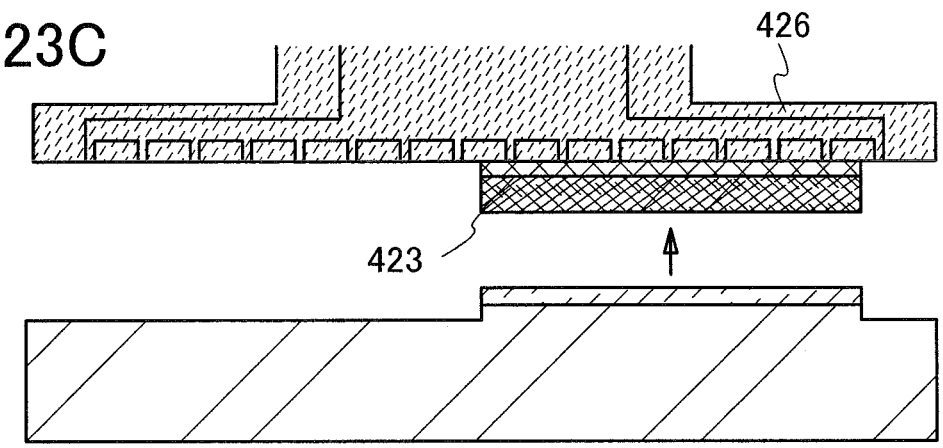

Next, heat treatment is performed so that adjacent microvoids are coupled in the embrittlement layer 422; accordingly, the volume of the microvoids increases. Consequently, as illustrated in FIG. 23C, the semiconductor substrate 421 is cleaved at the embrittlement layer 422, the semiconductor layer 423 is formed from the semiconductor layer 428 which is part of the semiconductor substrate 421, and the semiconductor layer 423 and the insulating film 424 are separated from the semiconductor substrate 421. Heat treatment may be performed at a temperature of, for example, 400° C. to 600° C.

Note that the heat treatment may be performed using dielectric heating with high frequency waves such as microwaves.

Further, before cleavage of the semiconductor substrate 421, hydrogenation treatment may be performed on the semiconductor substrate 421.

Figure 23D:
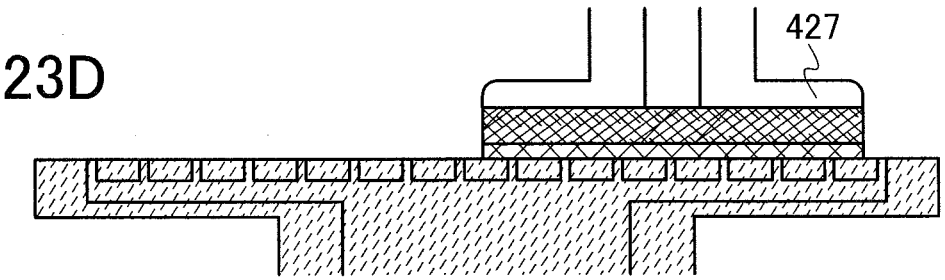
Figure 24A:
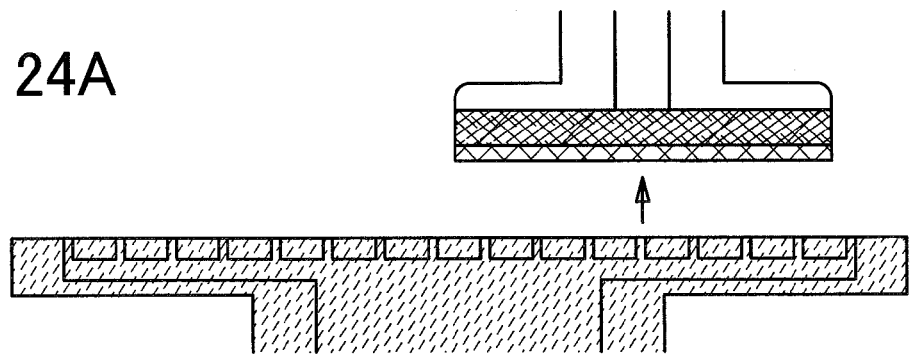
FIGS. 24A to 24C illustrate a manufacturing method of a semiconductor device according to the present invention.

As illustrated in FIG. 23D and FIG. 24A, a collet 427 is firmly fixed to the surface of the semiconductor layer 423, which is exposed by cleavage, and the semiconductor layer 423 is separated off from the holder 425. As the collet 427, a means which can be firmly and selectively fixed to the semiconductor layer 423, for example, a chuck such as a vacuum chuck or a mechanical chuck, a microneedle with a tip to which an adhesive is attached, or the like is used. FIG. 23D and FIG. 24A illustrate the case where a vacuum chuck is used as the collet 427.

In this embodiment mode, the example where the collet 427 is firmly fixed to the surface of the semiconductor layer 423, which is exposed by cleavage, has been described. However, a protective film such as an insulating film may be formed to prevent damage by the collet 427. Note that the protective film is removed after bonding of the semiconductor layer 423 to a supporting substrate 430.

As the adhesive attached to the microneedle, an expoxy-based adhesive, a ceramic-based adhesive, a silicone-based adhesive, a low-temperature coagulant, or the like can be used.

Figure 24B:
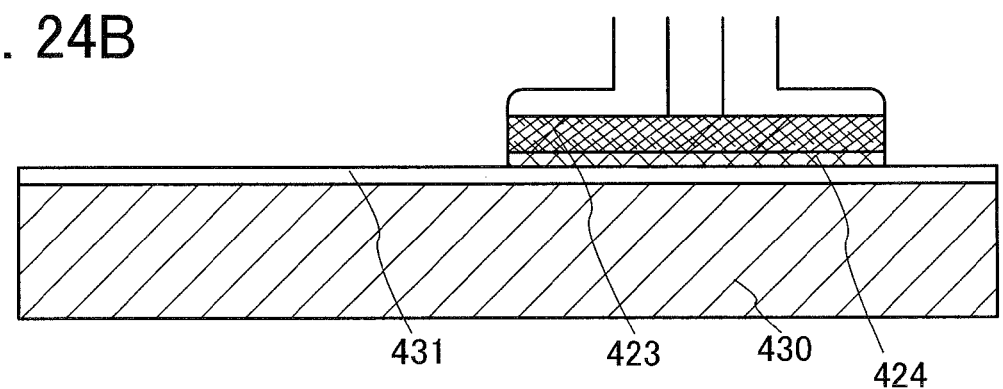
Figure 24C:
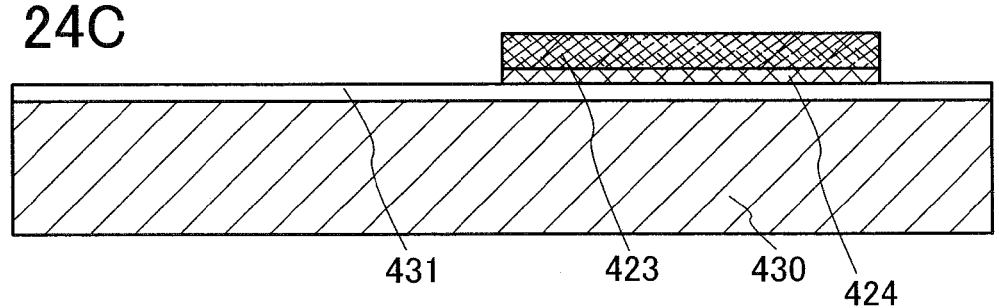

Next, as illustrated in FIG. 24B, the semiconductor layer 423 and the supporting substrate 430 are bonded to each other so that the insulating film 424 faces the supporting substrate 430 side, in other words, so that the surface opposite to the surface exposed by cleavage faces the supporting substrate 430 side. In this embodiment mode, an insulating film 431 is formed over the supporting substrate 430, and the insulating film 424 and the insulating film 431 are bonded to each other, thereby bonding the semiconductor layer 423 and the supporting substrate 430 (see FIG. 24C). After bonding of the insulating film 424 and the insulating film 431, heat treatment at a temperature ranging from 400° C. to 600° C. is preferably performed in order to further strengthen the bonding.

Since the bond is formed by van der Waals forces, a strong bond is formed even at room temperature. Note that since the above-described bonding can be performed at a low temperature, various substrates can be used as the supporting substrate 430.

Note that the insulating film 431 is not necessarily formed on the surface of the supporting substrate 430.

There are a case in which the semiconductor substrate is warped or deformed and a case in which an end portion of the semiconductor substrate is rounded slightly. Further, in irradiation with hydrogen or a rare gas, or hydrogen ions or rare gas ions in order to separate a semiconductor layer from a semiconductor substrate, there is also a case in which the above-mentioned gas or ions cannot be added into an end portion of the semiconductor substrate sufficiently. Accordingly, it is difficult to separate a portion of the semiconductor layer, which is located at the end portion of the semiconductor substrate. In the case of forming a semiconductor layer by cleavage of a semiconductor substrate after bonding of the semiconductor substrate to a supporting substrate, the distance between semiconductor layers is several millimeters to several centimeters. However, in this embodiment mode, a semiconductor layer is formed by cleavage of a semiconductor substrate before bonding of the semiconductor substrate to a supporting substrate. Therefore, the distance between semiconductor layers can be suppressed to be as small as about several tens of micrometers when the semiconductor layers are bonded to the supporting substrate, and this facilitates manufacture of a semiconductor device without the influence of the space between the semiconductor layers.

Using the manufacturing method of a semiconductor device of this embodiment mode, a plurality of semiconductor layers can be bonded to one supporting substrate using a plurality of semiconductor substrates; accordingly, processing with high throughput can be realized. In addition, since the plane orientation of a semiconductor layer can be appropriately selected in accordance with the polarity of a semiconductor element, mobility of the semiconductor element can be increased; accordingly, a semiconductor device capable of higher speed driving can be provided.

In the present invention, the channel doping step of adding an impurity element having one conductivity type is performed in order to control the threshold voltage of a transistor before separation of a semiconductor layer from a semiconductor substrate. The conditions of an impurity element used for channel doping such as conductivity type, concentration, and the like vary depending on the conductivity type or required function of the transistor. Therefore, a semiconductor layer subjected to channel doping at the conditions appropriate for the transistor to be manufactured can be selected and bonded to a supporting substrate.

Furthermore, a plurality of semiconductor layers can be formed by cleaving a semiconductor substrate at a plurality of locations, and the plurality of semiconductor layers can be bonded to a supporting substrate. Therefore, the position to which each of the plurality of semiconductor layers is bonded can be selected in accordance with the polarity and layout of the semiconductor element in the semiconductor device.

This embodiment mode can be implemented in combination with Embodiment Mode 1 as appropriate.

Embodiment Mode 5

In Embodiment Mode 5, an example of a manufacturing method of a semiconductor device (also referred to as a liquid crystal display device) having a display function as a semiconductor device having high performance and high reliability with high yield will be described using FIGS. 21A and 21B. Specifically, a liquid crystal display device that uses liquid crystal elements as display elements will be described.

Figure 21A:
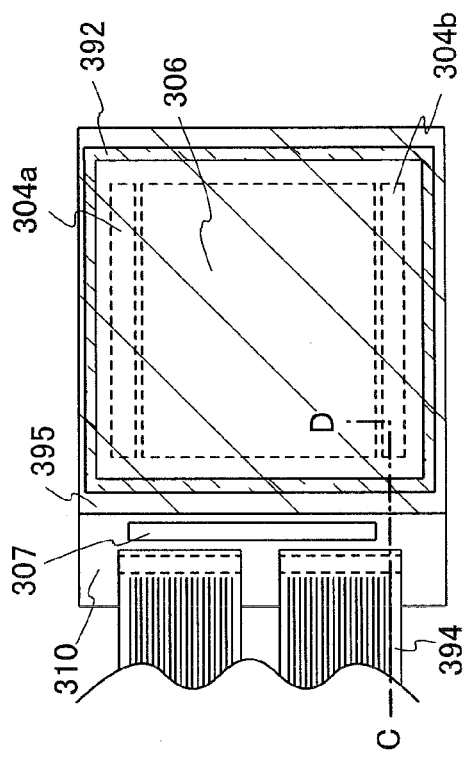
FIGS. 21A and 21B illustrate a semiconductor device according to the present invention.
Figure 21B:
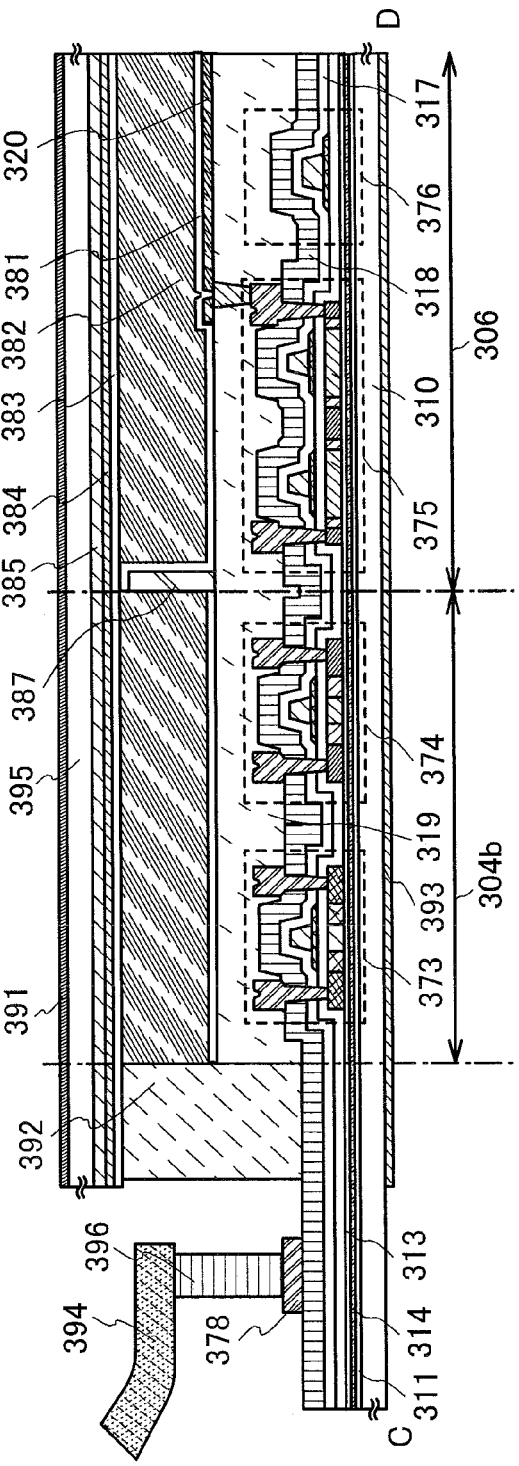

FIG. 21A is a top view of a semiconductor device which is one mode of the present invention, and FIG. 21B is a cross-sectional view taken along a line C-D of FIG. 21A.

As illustrated in FIG. 21A, a pixel region 306 and driver circuit regions 304a and 304b which are scanning line driver circuits are sealed between a supporting substrate 310 and a counter substrate 395 with a sealant 392. In addition, a driver circuit region 307 which is a signal line driver circuit formed using a driver IC is provided over the supporting substrate 310. A transistor 375 and a capacitor 376 are provided in the pixel region 306. A driver circuit having transistors 373 and 374 is provided in the driver circuit region 304b. In this embodiment mode, channel formation regions of semiconductor layers used for the transistors 373, 374, and 375 are subjected to a channel doping step before separation from a semiconductor substrate to control the threshold voltage. Accordingly, each of the transistors has required electric characteristics, so that a semiconductor device with high performance is formed.

In the pixel region 306, the transistor 375 to serve as a switching element is provided over a blocking layer 311, an insulating layer 314, and a protective layer 313. In this embodiment mode, a multi-gate thin film transistor (TFT) is used for the transistor 375, which includes a semiconductor layer having impurity regions functioning as source and drain regions, a gate insulating layer, a gate electrode layer having a two-layer structure, and source and drain electrode layers. The source or drain electrode layer is in contact with and electrically connected to the impurity region of the semiconductor layer and an electrode layer 320 which is used for a display element and also referred to as a pixel electrode layer.

The impurity regions in the semiconductor layer can be formed as high concentration impurity regions and low concentration impurity regions by controlling the concentration. A structure of such a thin film transistor having a low concentration impurity region is referred to as an LDD (lightly doped drain) structure. In addition, the low concentration impurity region can be formed to be overlapped with the gate electrode. A structure of such a thin film transistor is referred to as a GOLD (gate overlapped LDD) structure. The polarity of the thin film transistor is to be an n-type by using phosphorus (P) or the like in the impurity region. In the case of forming a p-type TFT, boron (B) or the like may be added. After that, insulating films 317 and 318 are formed to cover the gate electrodes and the like.

Further, in order to improve planarity, an insulating film 319 is formed as an interlayer insulating film. The insulating film 319 can be formed using an organic material, an inorganic material, or a stacked structure of them. For example, the insulating layer 319 can be formed using a material selected from silicon oxide, silicon nitride, silicon oxynitride, silicon nitride oxide, aluminum nitride, aluminum oxynitride, aluminum nitride oxide which contains more nitrogen than oxygen, aluminum oxide, diamond-like carbon (DLC), polysilazane, nitrogen-containing carbon, PSG (phosphosilicate glass), BPSG (borophosphosilicate glass), alumina, and other inorganic insulating materials. Also, an organic insulating material may be used, and the organic material may be either photosensitive or nonphotosensitive. For example, polyimide, acrylic, polyamide, polyimide amide, resist, benzocyclobutene, a siloxane resin, or the like can be used.

Since the semiconductor layer used for a semiconductor element is formed similarly to the case of Embodiment Mode 1 using the preset invention, a single crystal semiconductor layer separated from a single crystal semiconductor substrate can be used as the semiconductor layer, and the pixel region and the driver circuit region can be formed over the same substrate. In that case, transistors in the pixel region 306 and transistors in the driver circuit region 304b are formed at the same time. Needless to say, the driver circuit region 307 may also be formed over the same substrate in a similar manner. The transistors used in the driver circuit region 308b form a CMOS circuit. Although the thin film transistors which form the CMOS circuit have a GOLD structure, an LDD structure like the transistor 375 can also be employed.

Next, an insulating layer 381 which functions as an alignment film is formed so as to cover the electrode layer 320 used for a display element and the insulating film 319 by a printing method or a droplet discharge method. Note that when a screen printing method or an offset printing method is used, the insulating layer 381 can be formed selectively. Then, rubbing treatment is performed. The rubbing treatment is not necessarily performed when the mode of liquid crystal is, for example, a VA mode. An insulating layer 383 functioning as an alignment film is formed similarly to the insulating layer 381. Next, the sealant 392 is formed in a peripheral region of pixels by a droplet discharge method.

After that, the counter substrate 395 provided with the insulating layer 383 which functions as an alignment film, an electrode layer 384 which is used in a display element and also referred to as a counter electrode layer, a coloring layer 385 which functions as a color filter, and a polarizer 391 (also referred to as a polarizing plate), is attached to the supporting substrate 310 which is a TFT substrate with a spacer 387 interposed therebetween. Therefore, a polarizer (polarizing plate) 393 is provided on the side opposite to the surface of the supporting substrate 310 having elements. Further, the stacked structure of the polarizer and the coloring layer is not limited to that shown in FIGS. 21A and 21B and may be determined as appropriate depending on materials of the polarizer and the coloring layer or conditions of a manufacturing process. The polarizer can be provided over the substrate using an adhesive layer. A filler may be mixed in the sealant and further, a light-shielding film (black matrix) or the like may be formed on the counter substrate 395. Note that the coloring filter or the like may be formed of materials exhibiting red (R), green (G), and blue (B) when the liquid crystal display device performs full color display. When performing monochrome display, the coloring layer may be omitted or formed of a material exhibiting at least one color. In addition, an anti-reflective film having an antireflective function may be provided on the viewing side of the semiconductor device. A retardation film may be stacked between the polarizer and the liquid crystal layer.

Note that the coloring filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap with a transistor and a CMOS circuit for the sake of reducing reflection of external light by wirings of the transistor and the CMOS circuit. It is to be noted that the black matrix may be provided so as to overlap with a capacitor. This is because the black matrix can prevent reflection due to a metal film forming the capacitor.

The liquid crystal layer can be formed by a dispenser method (a dropping method) or an injection method in which the supporting substrate 310 having elements and the counter substrate 395 are attached first and then liquid crystal is injected into a space therebetween by using a capillary phenomenon. When handling a large-sized substrate to which the injection method is difficult to be applied, the dropping method may be applied.

The spacer may be provided by spraying particles having a size of several micrometers; however, the spacer in this embodiment mode is formed by forming a resin film over the entire surface of the substrate and etching the resin film. A material of such a spacer is applied by a spinner and then light-exposed and developed to form a predetermined pattern. Further, the pattern is cured by heating at a temperature of 150° C. to 200° C. with a clean oven or the like. The thus manufactured spacer can have various shapes depending on the conditions of the exposure and development. It is preferable that the spacer have a columnar shape with a flat top so that mechanical strength for the semiconductor device can be secured when the counter substrate is attached. The shape of the spacer is not particularly limited and may be conical, pyramidal, or the like.

Next, an FPC 394 which is a connection wiring board is connected to a terminal electrode layer 378 that is electrically connected to the pixel region, with an anisotropic conductive layer 396 interposed therebetween. The FPC 394 functions to transmit signals and potentials from the outside. Through the above-described process, a semiconductor device having a display function can be manufactured.

In this manner, electric characteristics of a transistor is controlled depending on the function required for a supporting substrate by a channel doping step of a semiconductor substrate; accordingly, a semiconductor device with high performance and low power consumption can be achieved. Further, such a semiconductor device can be manufactured with high yield and high productivity without complicating a manufacturing process.

Embodiment Mode 6

A semiconductor device having a light-emitting element can be formed by applying the present invention, and the light-emitting element emits light by any one of bottom emission, top emission, and dual emission. In Embodiment Mode 6, an example of a manufacturing method of a semiconductor device will be described in which a semiconductor device having a display function (also called a display device or a light-emitting device) is manufactured as a bottom-emission, dual-emission, or top-emission semiconductor device with high performance and high reliability with high yield, with reference to FIGS. 10A to 10B and FIGS. 11A and 11B.

Figure 10A:
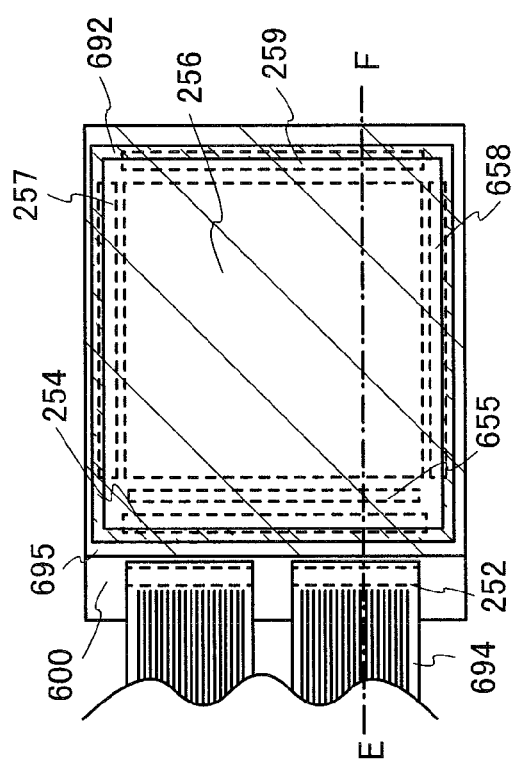
FIGS. 10A and 10B illustrate a semiconductor device according to the present invention.
Figure 10B:
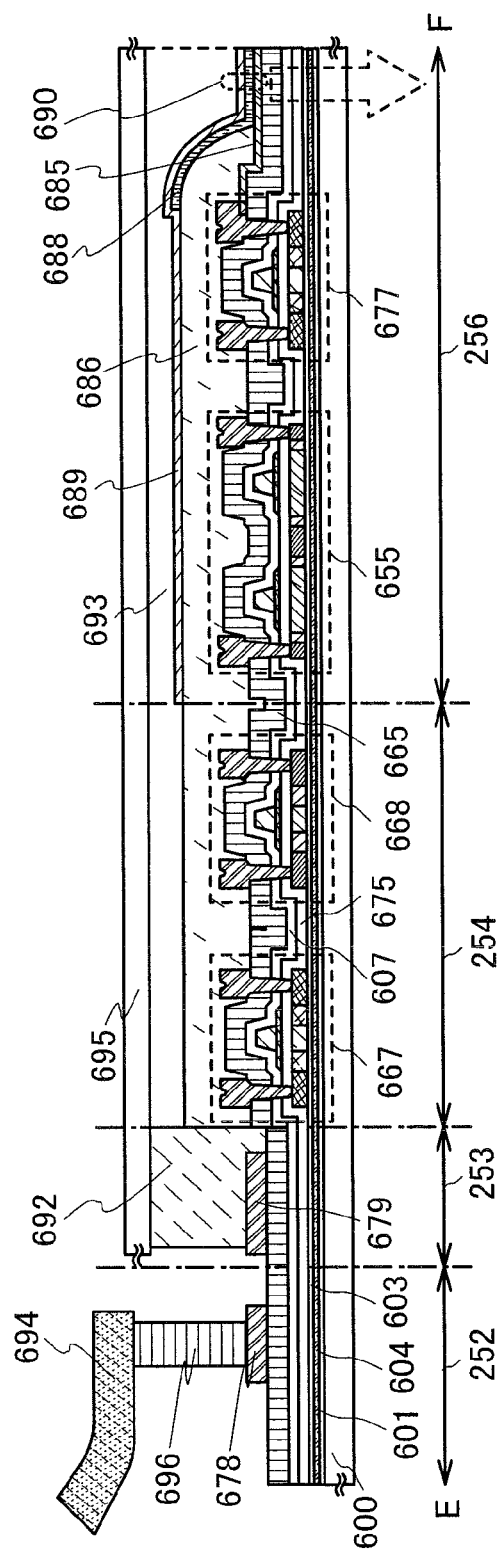

A semiconductor device illustrated in FIGS. 10A and 10B employs a bottom-emission structure in which light is emitted in a direction indicated by an arrow. FIG. 10A is a plane view of the semiconductor device, and FIG. 10B is a cross-sectional view taken along a line E-F of FIG. 10A. In FIGS. 10A and 10B, the semiconductor device includes an external terminal connection region 252, a sealing region 253, a driver circuit region 254, and a pixel region 256.

The semiconductor device illustrated in FIGS. 10A and 10B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, a blocking layer 601, an insulating layer 604, an oxide film 603, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The filler 693 can be formed by a dropping method using a composition in a liquid state. A semiconductor device (light-emitting display device) is sealed by attaching the element substrate 600 provided with the filler by a dropping method and the sealing substrate 695 to each other.

In the semiconductor device illustrated in FIGS. 10A and 10B, the first electrode layer 685 is formed using a light-transmitting conductive material so as to transmit light emitted from the light-emitting element 690, and the second electrode layer 689 is formed using a reflective conductive material so as to reflect light emitted from the light-emitting element 690.

Since it is acceptable as long as the second electrode layer 689 has reflectivity, a conductive film formed of titanium, tungsten, nickel, gold, platinum, silver, copper, tantalum, molybdenum, aluminum, magnesium, calcium, lithium, or an alloy thereof may be used as the second electrode layer 689. It is preferable to use a substance having high reflectivity in a visible light range, and an aluminum film is used in this embodiment mode.

The first electrode layer 685 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

A semiconductor device illustrated in FIG. 11A employs a top-emission structure in which light is emitted in a direction indicated by an arrow. The semiconductor device illustrated in FIG. 11A includes an element substrate 1600, a thin film transistor 1655, a thin film transistor 1665, a thin film transistor 1675, a thin film transistor 1685, a wiring layer 1624, a first electrode layer 1617, a light-emitting layer 1619, a second electrode layer 1620, a filler 1622, a sealant 1632, a blocking layer 1601, an insulating layer 1604, an oxide film 1603, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, and an FPC 1683.

The semiconductor device illustrated in FIG. 11A includes an external terminal connection region 282, a sealing region 283, a driver circuit region 284, and a pixel region 286. In the semiconductor device illustrated in FIG. 11A, the wiring layer 1624 that is a reflective metal layer is provided below the first electrode layer 1617. The first electrode layer 1617 that is a transparent conductive film is formed over the wiring layer 1624. Since the wiring layer 1624 is required to have reflectivity, a conductive film or the like made of titanium, tungsten, nickel, gold, platinum, silver, copper, tantalum, molybdenum, aluminum, magnesium, calcium, lithium, or an alloy thereof may be used. A substance which has high reflectivity in a visible light range is preferably used. A conductive film may also be used as the first electrode layer 1617, and in that case, the wiring layer 1624 having reflectivity is not required to be provided.

The first electrode layer 1617 and the second electrode layer 1620 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

Further, when a material such as a metal film having no light-transmitting property is formed thin (preferably a thickness of approximately 5 to 30 nm) so as to be able to transmit light, light can be emitted through the second electrode layer 1620. As a metal thin film that can be used for the first electrode layer 1617 and the second electrode layer 1620, a conductive film made of titanium, tungsten, nickel, gold, platinum, silver, aluminum, magnesium, calcium, lithium, or an alloy thereof, or the like can be used.

A semiconductor device illustrated in FIG. 11B includes an element substrate 1300, a thin film transistor 1355, a thin film transistor 1365, a thin film transistor 1375, a thin film transistor 1385, a first electrode layer 1317, a light-emitting layer 1319, a second electrode layer 1320, a filler 1322, a sealant 1332, a blocking layer 1301, an insulating layer 1304, an oxide film 1303, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383. The semiconductor device includes an external terminal connection region 272, a sealing region 273, a driver circuit region 274, and a pixel region 276.

The semiconductor device illustrated in FIG. 11B is dual-emission type and has a structure in which light is emitted in directions indicated by arrows from both the element substrate 1300 side and the sealing substrate 1325 side. Therefore, a light-transmitting electrode layer is used for each of the first electrode layer 1317 and the second electrode layer 1320.

In this embodiment mode, the first electrode layer 1317 and the second electrode layer 1320, which are light-transmitting electrode layers, may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

Further, when a material such as a metal film having no light-transmitting property is formed thin (preferably a thickness of approximately 5 to 30 nm) so as to be able to transmit light, light can be emitted through the first electrode layer 1317 and the second electrode layer 1320. As a metal thin film that can be used for the first electrode layer 1317 and the second electrode layer 1320, a conductive film made of titanium, tungsten, nickel, gold, platinum, silver, aluminum, magnesium, calcium, lithium, or an alloy thereof, or the like can be used.

In the above-described manner, the semiconductor device illustrated in FIG. 11B has a structure in which light emitted from a light-emitting element 1305 passes through the first electrode layer 1317 and the second electrode layer 1320 so that light is emitted from both sides.

A pixel of a semiconductor device including a light-emitting element can be driven by a passive matrix mode or an active matrix mode. In addition, either digital driving or analog driving can be employed.

A sealing substrate may be provided with a color filter (coloring layer). The color filter (coloring layer) can be formed by an evaporation method or a droplet discharge method. With the use of the color filter (coloring layer), high-definition display can be performed. This is because a broad peak can be modified to be sharp in a light emission spectrum of each of RGB by the color filter (coloring layer).

Full color display can be performed by formation of a material exhibiting light of a single color and combination of the material with a color filter or a color conversion layer. The color filter (coloring layer) or the color conversion layer may be provided for, for example, the sealing substrate and then attached to the element substrate.

Needless to say, display of single color emission may also be performed. For example, an area color type semiconductor device may be formed by using single color light emission. The area color type is suitable for a passive matrix display portion and can mainly display characters and symbols.

By using a single crystal semiconductor layer, a pixel region and a driver circuit region can be formed to be integrated over the same substrate. In this case, transistors in the pixel region and transistors in the driver circuit region are formed at the same time.

In this embodiment mode, channel formation regions of semiconductor layers used for the transistors provided in the semiconductor device of this embodiment mode illustrated in FIGS. 10A and 10B and FIGS. 11A and 11B are subjected to a channel doping step before separation from a semiconductor substrate to control the threshold voltage. Accordingly, each of the transistors has required electric characteristics, so that a semiconductor device with high performance is formed.

In this manner, electric characteristics of a transistor is controlled depending on the function required for a supporting substrate by a channel doping step of a semiconductor substrate; accordingly, a semiconductor device with high performance and low power consumption can be achieved. Further, such a semiconductor device can be manufactured with high yield and high productivity without complicating a manufacturing process.

This embodiment mode can be combined with Embodiment Mode 1 as appropriate.

Embodiment Mode 7

In Embodiment Mode 7, an example of a semiconductor device (also referred to as a display device or a light-emitting device) having a display function as a semiconductor device having high performance and high reliability will be described. More specifically, a light-emitting display device that uses light-emitting elements as display elements will be described.

In this embodiment mode, structures of light-emitting elements that can be used for display elements in the display device of the present invention will be described with reference to FIGS. 13A to 13D.

FIGS. 13A to 13D illustrate structures of a light-emitting element in which an EL layer 860 is sandwiched between a first electrode layer 870 and a second electrode layer 850. As illustrated in the drawings, the EL layer 860 includes a first layer 804, a second layer 803, and a third layer 802. In FIGS. 13A to 13D, the second layer 803 is a light-emitting layer, and the first layer 804 and the third layer 802 are functional layers.

The first layer 804 is a layer which transports holes to the second layer 803. In FIGS. 13A to 13D, a hole-injecting layer included in the first layer 804 is a layer that contains a material with a high hole-injecting property. Molybdenum oxide, vanadium oxide, ruthenium oxide, tungsten oxide, manganese oxide, or the like can be used. Further, the first layer 804 can also be formed using any of the following materials: a phthalocyanine-based compound such as phthalocyanine (abbrev.: H$_2$Pc), copper phthalocyanine (abbrev.: CuPc), or the like; an aromatic amine compound such as 4,4'-bis[N-(4-diphenylaminophenyl)-N-phenylamino]biphenyl (abbrev.: DPAB), 4,4'-bis(N-{4-[N-(3-methylphenyl)-N-phenylamino]phenyl}-N-phenylamino)biphenyl (abbrev.: DNTPD), or the like; a high molecular compound such as poly(ethylene dioxythiophene)/poly(styrenesulfonic acid) (abbrev.: PEDOT/PSS); and the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property since electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material of the electrode layer can be selected regardless of the work function.

As the inorganic compound used for the composite material, an oxide of a transition metal is preferably used. In addition, an oxide of a metal that belongs to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since they have high electron-accepting properties. Among them, molybdenum oxide is particularly preferable because it is stable in the atmosphere, low in hygroscopicity, and is easy to be handled.

As the organic compound used for the composite material, various compounds such as an aromatic amine compound, a carbazole derivative, aromatic hydrocarbon, and a high molecular compound (oligomer, dendrimer, polymer, or the like) can be used. The organic compound used for the composite material is preferably an organic compound having a high hole-transporting property. Specifically, a substance having a hole mobility of $10^{-6}$ cm$^2$/Vs or higher is preferably used. Further, other materials may also be used as long as a hole-transporting property thereof is higher than an electron-transporting property. The organic compound that can be used for the composite material is specifically shown below.

For example, as the aromatic amine compound, the following can be given: N,N'-di(p-tolyl)-N,N'-diphenyl-p-phenylenediamine (abbrev.: DTDPPA); 4,4'-bis[N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As specific examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl)amino]-9-phenylcarbazole (abbrev.: PCzPCN1); and the like.

Further, the following can also be used: 4,4'-di(N-carbazolyl)biphenyl (abbrev.: CBP); 1,3,5-tris[4-(N-carbazolyl)phenyl]benzene (abbrev.: TCPB); 9-[4-(N-carbazolyl)]phenyl-10-phenylanthracene (abbrev.: CzPA); 1,4-bis[4-(N-carbazolyl)phenyl]-2,3,5,6-tetraphenylbenzene; and the like.

Further, as the aromatic hydrocarbon which can be used for the composite material, the following can be given: 2-tert-butyl-9,10-di(2-naphthyl)anthracene (abbrev.: t-BuDNA); 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl)anthracene (abbrev.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of greater than or equal to $1 \times 10^{-6}$ cm$^2$/Vs and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10- bis[4-(2,2-diphenylvinyl)phenyl]anthracene (abbrev.: DPVPA), and the like can be given.

Further, a high molecular compound such as poly(N-vinylcarbazole) (abbrev.: PVK), poly(4-vinyltriphenylamine) (abbrev.: PVTPA), or the like can also be used.

As a substance for forming a hole-transporting layer included in the first layer 804 in FIGS. 13A to 13D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenyl-amino)triphenylamine, 4,4',4''-tris[N-(3-methylphenyl)-N-phenylamino]triphenylamine, and the like. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. With reference to FIGS. 13A to 13D, an electron-transporting layer included in the third layer 802 will be described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), bis(2-methyl-8-quinolinolato)(4-phenylphenolato)aluminum (abbrev.: BAlq), or the like can be used. Further, a metal complex or the like including an oxazole-based or thiazole-based ligand, such as bis[2-(2-hydroxyphenyl)benzoxazolato]zinc (abbrev.: Zn(BOX)$_2$), bis[2-(2-hydroxyphenyl)benzothiazolato]zinc (abbrev.: Zn(BTZ)$_2$), or the like can be used. Besides the above metal complexes, the following can be used: 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-triazole (abbrev.: TAZ), bathophenanthroline (abbrev.: BPhen); bathocuproine (abbrev.: BCP); and the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the aforementioned substance.

With reference to FIGS. 13A to 13D, an electron-injecting layer included in the third layer 802 is described. For the electron-injecting layer, a substance having a high electron-injecting property can be used. For the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof, for example, a layer of Alq containing magnesium (Mg) or the like can be used. It is preferable to use the layer which is made of a substance having an electron-transporting property and contains an alkali metal or an alkaline earth metal as the electron-injecting layer because electron injection from the electrode layer is efficiently performed by using the layer.

Next, the second layer 803 which is a light-emitting layer will be described. The light-emitting layer has a function of emitting light and includes an organic compound having a light-emitting property. The light-emitting layer may include an inorganic compound. The light-emitting layer may be formed using various light-emitting organic compounds and inorganic compounds. The thickness of the light-emitting layer is preferably about 10 nm to 100 nm.

There are no particular limitations on the organic compound used for the light-emitting layer as long as it is a light-emitting organic compound. As the organic compound, for example, the following can be given: 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino)styryl]-4H-pyran (abbrev.: DCM1), 4-(dicyanomethylene)-2-methyl-6-[2-(julolidin-9-yl)ethenyl]-4H-pyran (abbrev.: DCM2), 4-(dicyanomethylene)-2,6-bis[p-(dimethylamino)styryl]-4H-pyran (abbrev.: BisDCM), and the like. Further, a compound capable of emitting phosphorescence such as bis[2-(4',6'-difluorophenyl)pyridinato-N,C$^{2'}$]iridium(picolinate) (abbrev.: FIrpic), bis{2-[3',5'-bis(trifluoromethyl)phenyl]pyridinato-N,C$^{2'}$}iridium(picolinate) (abbrev.: Ir(CF$_3$ppy)$_2$(pic)), tris(2-phenylpyridinato-N,C$^{2'}$)iridium (abbrev.: Ir(ppy)$_3$), bis(2-phenylpyridinato-N,C$^{2'}$)iridium (acetylacetonate) (abbrev.: Ir(ppy)$_2$(acac)), bis[2-(2'-thienyl)pyridinato-N,C$^{3'}$]iridium(acetylacetonate) (abbrev.: Ir(thp)$_2$(acac)), bis(2-phenylquinolinato-N,C$^{2'}$)iridium (acetylacetonate) (abbrev.: Ir(pq)$_2$(acac)), or bis[2-(2'-benzothienyl)pyridinato-N,C$^{3'}$]iridium(acetylacetonate) (abbrev.: Ir(btp)$_2$(acac)) may be used.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, a smaller amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element that emits light of green, which has high visibility for human eyes, with the use of a triplet excitation light-emitting material.

Another organic compound may be further added to the light-emitting layer including any of the above-described organic compounds which emit light. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, DPVBi, and the like, and 4,4'-bis(N-carbazolyl)biphenyl (abbrev.: CBP), 1,3,5-tris[4-(N-carbazolyl)phenyl]benzene (abbrev.: TCPB), and the like. However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has higher physical strength than a low-molecular material and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], poly(2-(dialkoxyphenyl)-1,4-phenylenevinylene) [ROPh-PPV], and the like can be given. As the polyparaphenylene-based material, a derivative of polyparaphenylene [PPP] such as poly(2,5-dialkoxy-1,4-phenylene) [RO-PPP], poly(2,5-dihexoxy-1,4-phenylene), and the like can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT], and the like can be given. As the polyfluorene-based material, a derivative of polyfluorene [PF] such as poly(9,9-dialkylfluorene) [PDAF], poly(9,9-dioctylfluorene) [PDOF], and the like can be given.

The inorganic compound used for the light-emitting layer may be any inorganic compound as long as light emission of the organic compound is not easily quenched by the inorganic compound, and various kinds of metal oxide and metal nitride may be used. In particular, oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. The layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a semiconductor device which is formed using a light-emitting element can be driven by a passive matrix mode or an active matrix mode. In either case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a semiconductor device including a light-emitting element can be improved. In addition, either digital driving or analog driving can be applied.

A sealing substrate may be provided with a color filter (coloring layer). The color filter (coloring layer) can be formed by an evaporation method or a droplet discharge method. With the use of the color filter (coloring layer), high-definition display can be performed. This is because a broad peak can be modified to be sharp in a light emission spectrum of each of RGB by the color filter (coloring layer).

Full color display can be performed by formation of a material exhibiting light of a single color and combination of the material with a color filter or a color conversion layer. The color filter (coloring layer) or the color conversion layer may be provided for, for example, the sealing substrate and then attached to the element substrate.

Needless to say, display of single color emission may also be performed. For example, an area color type semiconductor device may be formed by using single color light emission. The area color type is suitable for a passive matrix display portion and can mainly display characters and symbols.

Figure 13A:
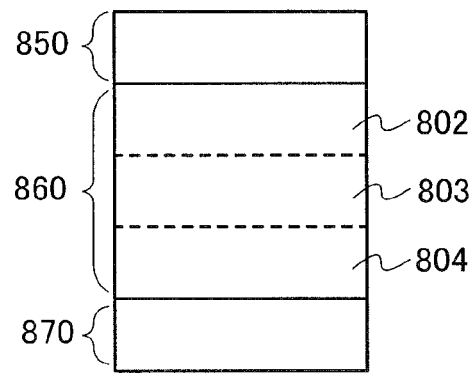
FIGS. 13A to 13D illustrate structures of a light-emitting element which can be applied to the present invention.
Figure 13B:
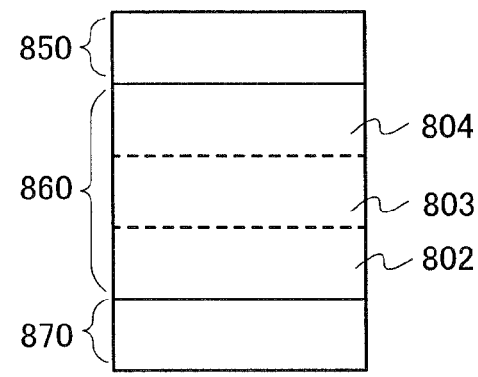

It is necessary to select materials for the first electrode layer 870 and the second electrode layer 850 considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as illustrated in FIG. 13A. In the case where the polarity of the driving thin film transistor is an n-channel type, the first electrode layer 870 may serve as a cathode and the second electrode layer 850 may serve as an anode as illustrated in FIG. 13B. Materials that can be used for the first electrode layer 870 and the second electrode layer 850 are described below. It is preferable to use a material having a high work function (specifically, a material having a work function of greater than or equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron-transporting property, both the first electrode layer 870 and the second electrode layer 850 are scarcely restricted by a work function and various materials can be used.

The light-emitting elements in FIGS. 13A and 13B each have a structure in which light is extracted from the first electrode layer 870 and thus, the second electrode layer 850 need not necessarily have a light-transmitting property. The second electrode layer 850 may be formed of a film mainly containing an element selected from Ti, Ni, W, Cr, Pt, Zn, Sn, In, Ta, Al, Cu, Au, Ag, Mg, Ca, Li or Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 nm to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing types of the first electrode layer 870 and the second electrode layer 850.

FIG. 13B illustrates the case where the EL layer 860 is formed by stacking the third layer 802, the second layer 803, and the first layer 804 in this order from the first electrode layer 870 side.

Figure 13C:
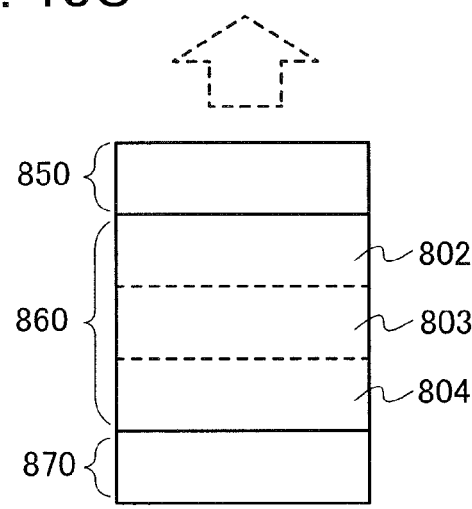
Figure 13D:
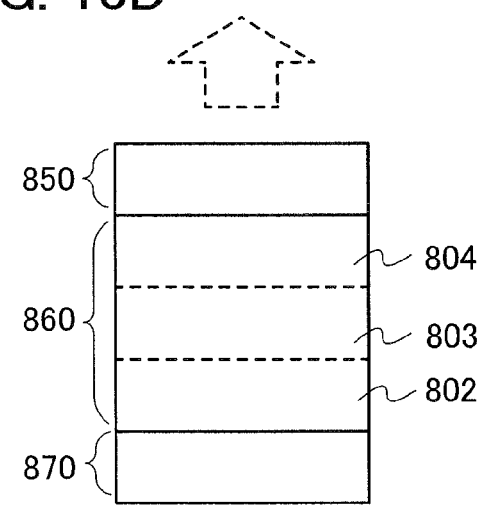

FIG. 13C illustrates a structure in which an electrode layer having reflectivity is used for the first electrode layer 870 and an electrode layer having a light-transmitting property is used for the second electrode layer 850 in FIG. 13A. Light emitted from the light-emitting element is reflected at the first electrode layer 870, transmitted through the second electrode layer 850, and emitted to the outside. Similarly, FIG. 13D illustrates a structure in which an electrode layer having reflectivity is used for the first electrode layer 870 and an electrode layer having a light-transmitting property is used for the second electrode layer 850 in FIG. 13B. Light emitted from the light-emitting element is reflected at the first electrode layer 870, transmitted through the second electrode layer 850, and emitted to the outside.

Further, various methods can be used as a method of forming the EL layer 860 when a mixture of an organic compound and an inorganic compound is used for the EL layer 860. For example, there is a co-evaporation method of vaporizing both an organic compound and an inorganic compound by resistance heating. Further, for co-evaporation, an inorganic compound may be vaporized by an electron beam (EB) while an organic compound is vaporized by resistance heating. Furthermore, a method of sputtering an inorganic compound while vaporizing an organic compound by resistance heating to deposit the both at the same time may also be used. Instead, the EL layer 860 may be formed by a wet method.

As a method of manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be used.

This embodiment mode can be combined with any of Embodiment Mode 1 and Embodiment Mode 4 as appropriate.

Embodiment Mode 8

In Embodiment Mode 8, other examples of a semiconductor device having a display function as a semiconductor device having high performance and high reliability will be described. In this embodiment mode, other structures that can be applied to the light-emitting element in the semiconductor device of the present invention will be described with reference to FIGS. 12A to 12F.

Light emitting elements which utilize electroluminescence are classified according to whether their light emitting materials are an organic compound or an inorganic compound. In general, a light emitting element whose light emitting material is an organic compound is referred to as an organic EL element, while a light emitting element whose light emitting material is an inorganic compound is referred to as an inorganic EL element.

Inorganic EL elements are classified according to their element structures into a dispersed inorganic EL element and a thin-film inorganic EL element. The former and the latter are different in that the former has an electroluminescent layer where particles of a light-emitting material are dispersed in a binder whereas the latter has an electroluminescent layer formed of a thin film of a light-emitting material. However, the former and the latter commonly need electrons accelerated by a high electric field. Mechanisms for obtaining light emission include donor-acceptor recombination light emission, which utilizes a donor level and an acceptor level, and localized light emission, which utilizes inner-shell electron transition of a metal ion. In general, it is often the case that the dispersed inorganic EL element performs the donor-acceptor recombination light emission and the thin-film inorganic EL element performs the localized light emission.

A light emitting material which can be used in the present invention includes a base material and an impurity element serving as a light emission center. Light emission of various colors can be obtained by changing the impurity element to be contained. As a method for forming the light-emitting material, various methods such as a solid phase method and a liquid phase method (a coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

A solid phase method is a method in which a base material, and an impurity element or a compound containing an impurity element are weighed, mixed in a mortar, heated in an electric furnace, and baked to be reacted, so that the impurity element is contained in the base material. Baking temperatures are preferably 700° C. to 1500° C. This is because solid phase reaction does not progress at a temperature that is too low and the base material is decomposed at a temperature that is too high. Note that although baking may be carried out in a powder form, the baking is preferably carried out in a pellet form. The method requires baking at a relatively high temperature; however, it is a simple method. Therefore, the method provides good productivity and is suitable for mass production.

A liquid phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the particles are small and the baking temperature is low.

As a base material for the light-emitting material, a sulfide, an oxide, or a nitride can be used. As the sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. The oxide may be zinc oxide (ZnO), yttrium oxide ($Y_2O_3$), or the like. As the nitride, aluminum nitride (AlN), gallium nitride (GaN), indium nitride (InN), or the like can be used. Furthermore, as the base material used for the light-emitting material, zinc selenide (ZnSe), zinc telluride (ZnTe), or the like can also be used. Alternatively, a ternary mixed crystal such as calcium sulfide-gallium ($CaGa_2S_4$), strontium sulfide-gallium ($SrGa_2S_4$), or barium sulfide-gallium ($BaGa_2S_4$) may also be used.

As a light emission center of localized type light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. Such halogen element can function to compensate charges.

On the other hand, as the light emission center of donor-acceptor recombination light emission, a light-emitting material which contains a first impurity element forming a donor level and a second impurity element forming an acceptor level can be used. As the first impurity element, fluorine (F), chlorine (Cl), aluminum (Al), or the like can be used, for example. Meanwhile, as the second impurity element, copper (Cu), silver (Ag), or the like can be used, for example.

In the case of synthesizing a light-emitting material of donor-acceptor recombination light emission by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As the base material, the above-described base materials can be used. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. Baking temperatures are preferably 700° C. to 1500° C. This is because solid phase reaction does not progress at a temperature that is too low and the base material is decomposed at a temperature that is too high. Note that although baking may be carried out in a powder form, the baking is preferably carried out in a pellet form.

As an impurity element in a case of utilizing a solid-phase reaction, a combination of compounds formed from the first impurity element and the second impurity element may be used. In that case, the impurity element can be easily diffused and the solid-phase reaction can smoothly advance; therefore, a light-emitting material with a uniform luminescence center can be obtained. Furthermore, since an excessive amount of impurity element will not be mixed in the light-emitting material, a high-purity light-emitting material can be obtained. As the compounds containing the first impurity element and the second impurity element, for example, copper chloride (CuCl), silver chloride (AgCl), or the like can be used.

The concentration of the impurity element may be 0.01 atom % to 10 atom % with respect to the base material, and preferably in a range of 0.05 atom % to 5 atom %.

In the case of a thin-film inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 12A:
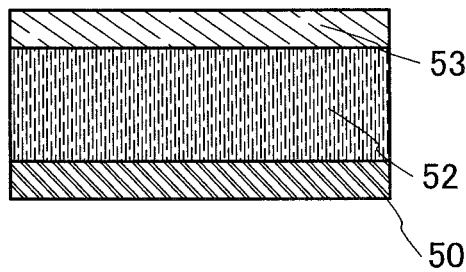
FIGS. 12A to 12F illustrate structures of a light-emitting element which can be applied to the present invention.
Figure 12D:
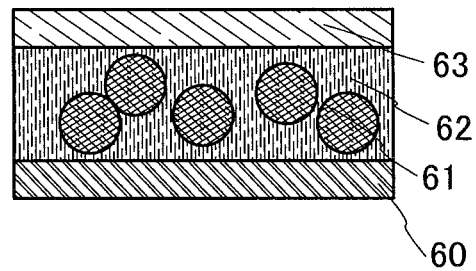
Figure 12B:
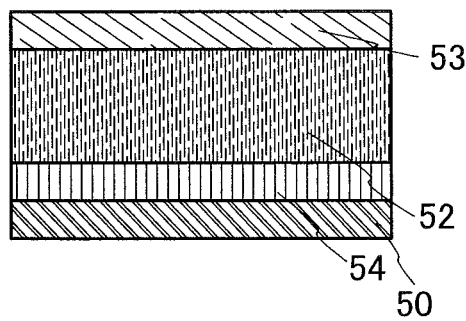
Figure 12E:
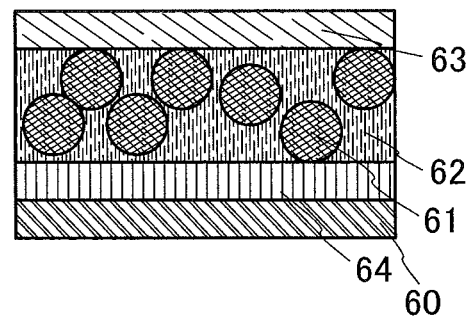
Figure 12C:
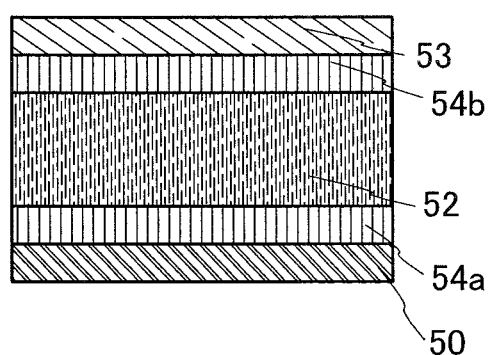

FIGS. 12A to 12C illustrate examples of a thin film inorganic EL element that can be used as a light-emitting element. In each of FIGS. 12A to 12C, a light-emitting element includes a first electrode layer 50, an electroluminescent layer 52, and a second electrode layer 53.

The light-emitting elements illustrated in FIGS. 12B and 12C each have a structure in which an insulating layer is provided between the electrode layer and the electroluminescent layer of the light-emitting element illustrated in FIG. 12A. The light-emitting element illustrated in FIG. 12B has an insulating layer 54 between the first electrode layer 50 and the electroluminescent layer 52. The light-emitting element illustrated in FIG. 12C has an insulating layer 54a between the first electrode layer 50 and the electroluminescent layer 52 and an insulating layer 54b between the second electrode layer 53 and the electroluminescent layer 52. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Moreover, the insulating layer may be a single layer or a stacked layer including a plurality of layers.

In FIG. 12B, the insulating layer 54 is provided to be in contact with the first electrode layer 50. However, the insulating layer 54 may be provided to be in contact with the second electrode layer 53 by reversing the order of the insulating layer and the electroluminescent layer.

In the case of the dispersion type inorganic EL element, particles of a light-emitting material are dispersed in a binder to form an electroluminescent layer having a film shape. The light-emitting material is processed into particulate forms. When particles with a desired size cannot be sufficiently obtained by a method of forming the light-emitting material, the light-emitting material may be processed into particles by being crushed in a mortar or the like. The binder is a substance for fixing particles of the light-emitting material in a dispersed state and keeping the shape as an electroluminescent layer. The light-emitting material is uniformly dispersed and fixed in the electroluminescent layer by the binder.

The electroluminescent layer of the dispersion-type inorganic EL element can be formed by a droplet discharge method by which an electroluminescent layer can be selectively formed, a printing method (e.g., screen printing or offset printing), a coating method such as a spin coating method, a dipping method, a dispenser method, or the like. The thickness is not particularly limited, but it is preferably in the range of 10 nm to 1000 nm. Further, in an electroluminescent layer containing the light-emitting material and the binder, the ratio of the light-emitting material is preferably 50 wt % or more and 80 wt % or less.

Figure 12F:
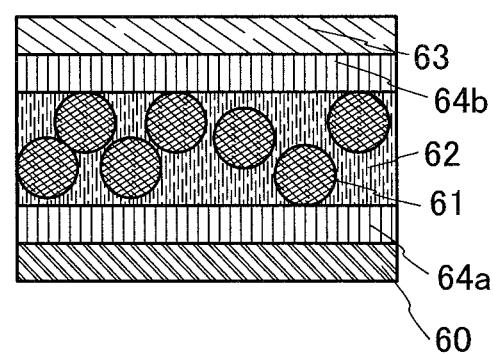

FIGS. 12D to 12F illustrate examples of a dispersion-type inorganic EL element that can be used as a light-emitting element. The light-emitting element illustrated in FIG. 12D has a structure in which a first electrode layer 60, an electroluminescent layer 62, and a second electrode layer 63 are stacked, and the electroluminescent layer 62 contains a light-emitting material 61 fixed by a binder.

As the binder which can be used in this embodiment mode, an organic material or an inorganic material, or a mixed material of an organic material and an inorganic material can be used. As an organic material, the following resin materials can be used: a polymer with a relatively high dielectric constant such as a cyanoethyl cellulose-based resin, or a resin such as polyethylene, polypropylene, a polystyrene-based resin, a silicone resin, an epoxy resin, poly (vinylidene fluoride) resin, or the like. Alternatively, a heat resistant high molecular compound such as aromatic polyamide or polybenzimidazole, or a siloxane resin may be used. Note that the siloxane resin corresponds to a resin containing a Si—O—Si bond. Siloxane is composed of a skeleton structure formed by the bond of silicon (Si) and oxygen (O). As the substituent of this material, an organic group including at least hydrogen (such as an alkyl group or aromatic hydrocarbon) is used. A fluoro group may also be included in the organic group. Alternatively, a resin material such as a vinyl resin like polyvinyl alcohol or polyvinylbutyral, a phenol resin, a novolac resin, an acrylic resin, a melamine resin, a urethane resin, or an oxazole resin (polybenzoxazole) may be used. The dielectric constant of the material can be controlled by mixing high-dielectric-constant microparticles of barium titanate ($BaTiO_3$), strontium titanate ($SrTiO_3$), or the like into such a resin as appropriate.

As an inorganic material included in the binder, a material selected from substances containing inorganic materials can be used, such as silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or other substances containing an inorganic material. With a material formed by mixing a high-dielectric-constant inorganic material into an organic material (by addition or the like), it becomes possible to control the dielectric constant of the electroluminescent layer which contains a light-emitting material and a binder more efficiently, whereby the dielectric constant can be further increased.

In a manufacturing process of the dispersion-type inorganic EL element, the light-emitting material is dispersed into a solution containing a binder. As a solvent of the solution containing a binder that can be used in this embodiment mode, it is preferable to appropriately select such a solvent as to dissolve the binder material and make a solution with the viscosity which is appropriate for a method for forming an electroluminescent layer (various wet processes) and a desired film thickness. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements illustrated in FIGS. 12E and 12F each have a structure in which an insulating layer is provided between the electrode layer and the electroluminescent layer of the light-emitting element illustrated in FIG. 12D. The light-emitting element illustrated in FIG. 12E has an insulating layer 64 between the first electrode layer 60 and the electroluminescent layer 62. The light-emitting element illustrated in FIG. 12F has an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Moreover, the insulating layer may be a single layer or a stacked layer including a plurality of layers.

In addition, although the insulating layer 64 is provided to be in contact with the first electrode layer 60 in FIG. 12E, the insulating layer 64 may also be provided to be in contact with the second electrode layer 63 by reversing the order of the insulating layer and the electroluminescent layer.

There is no particular limitation on the insulating layers 54, 54a, 54b, 64, 64a, and 64b illustrated in FIGS. 12A to 12F, but they preferably have high withstand voltage and are dense films. Further, the insulating layers preferably have high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked film of two kinds or more thereof can be used. These insulating films can be formed by sputtering, evaporation, CVD, or the like. In addition, the insulating layer may be formed by dispersing particles of the insulating material in a binder. A binder material may be formed of a material that is similar to that of a binder contained in the electroluminescent layer and by a method that is similar thereto. The thickness is not particularly limited, but it is preferably in the range of 10 nm to 1000 nm.

The light emitting element of this embodiment emits light when voltage is applied between the pair of electrode layers interposing the electroluminescent layer. The light emitting element of this embodiment can operate with either direct current driving or alternate current driving.

This embodiment mode can be implemented in combination with any of Embodiment Mode 1 and 4 as appropriate.

Embodiment Mode 9

A television device can be completed using a semiconductor device which includes a display element and is formed by the present invention. An example of a television device having high performance and high reliability will be described.

Figure 16:
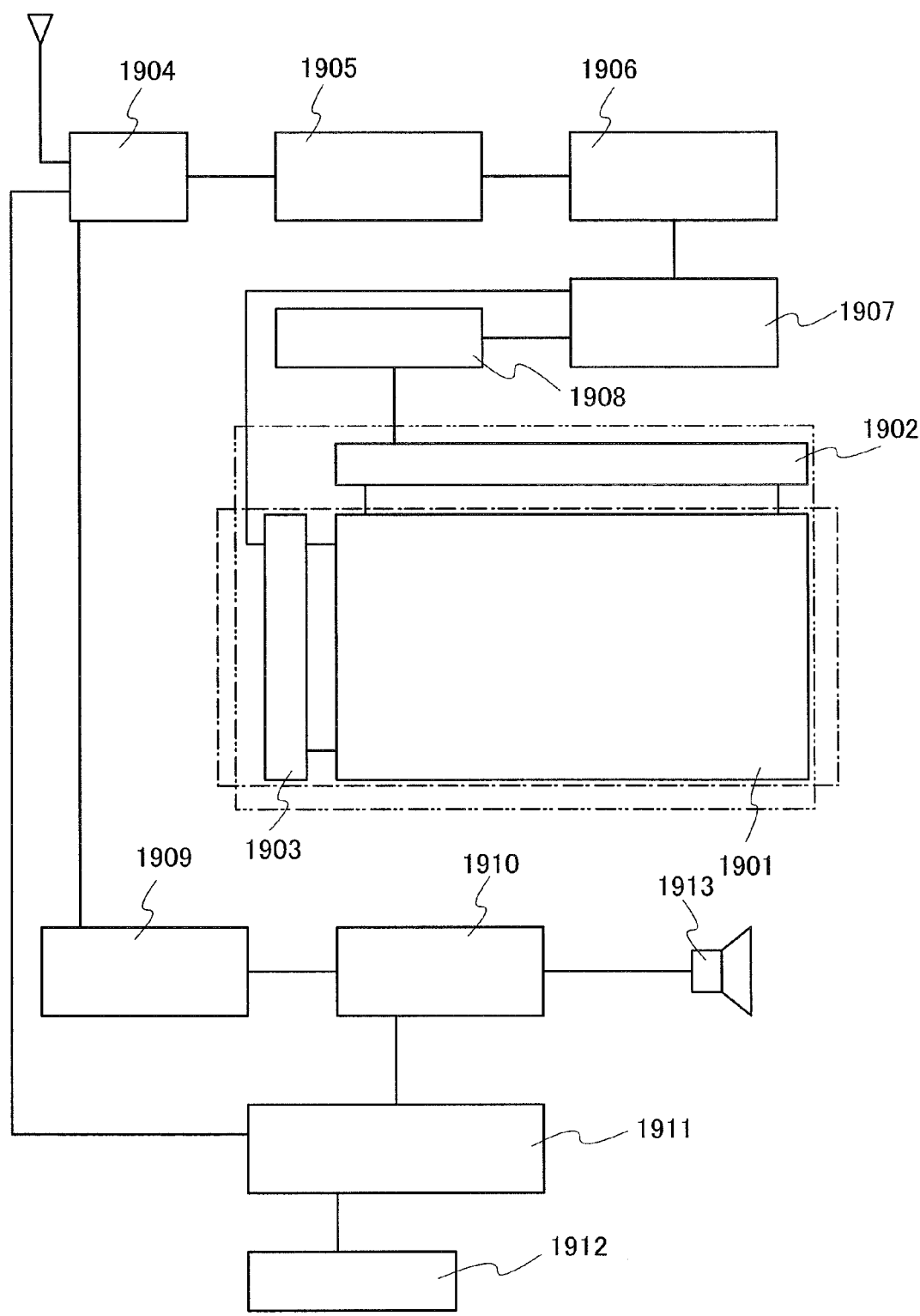
FIG. 16 is a block diagram illustrating a main structure of an electronic device to which the present invention is applied.

FIG. 16 is a block diagram illustrating a main structure of a television device (e.g., a liquid crystal television device or an EL television device).

As for the structures of other external circuits, a video signal amplifier circuit 1905 for amplifying video signals among signals received at a tuner 1904; a video signal processing circuit 1906 for converting signals output from the video signal amplifier circuit 1905 into chrominance signals corresponding to red, green, and blue; a control circuit 1907 for converting the video signals so as to be input into the driver ICs; and the like are provided on the input side of the video signals. The control circuit 1907 outputs a signal to each of the scan line side and the signal line side. In the case of digital driving, a signal divider circuit 1908 may be provided on the signal line side so that input digital signals can be divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 20A:
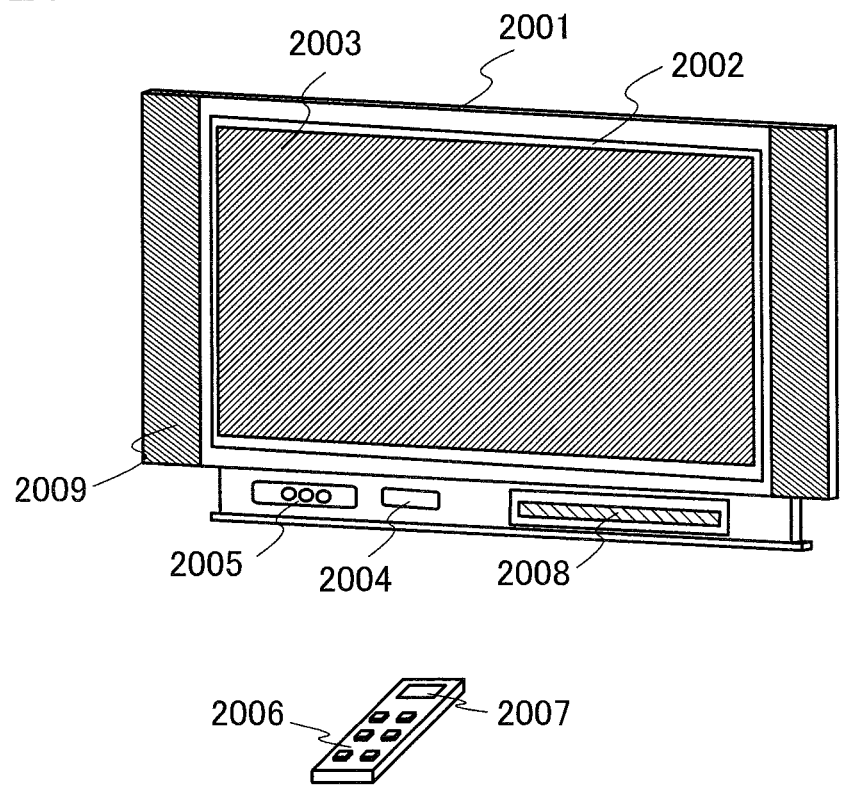
FIGS. 20A and 20B illustrate electronic devices to which the present invention is applied.
Figure 20B:
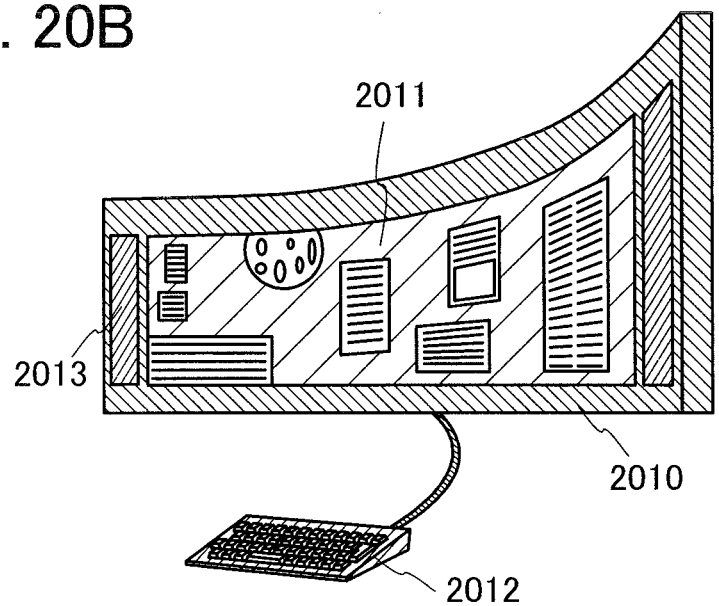

The television device can be completed by incorporating a display module into a housing as illustrated in FIGS. 20A and 20B. A display panel as illustrated in FIGS. 10A and 10B and FIGS. 11A and 11B provided with an FPC is generally also called an EL display module. When an EL display module is used, an EL television device can be completed, and when a liquid crystal display module is used, a liquid crystal television device can be completed. A main screen 2003 is formed using the display module, and a speaker portion 2009, an operation switch, and the like are provided as its accessory equipment. Thus, a television device can be completed in accordance with the present invention.

In addition, reflected light of incident light from external may be blocked with the use of a retardation plate or a polarizing plate. In a top-emission semiconductor device, an insulating layer serving as a partition wall may be colored to be used as a black matrix. The partition wall can be formed by a droplet discharge method or the like as well, using pigment-based black resin or a resin material such as polyimide mixed with carbon black or the like, or a stack of these. Further, a partition may also be formed by depositing different materials in the same region a plurality of times by a droplet discharge method. As a retardation plate, a $\lambda/4$ plate and a $\lambda/2$ plate may be used to control light. The EL display module has a structure in which the light-emitting element, the sealing substrate (sealing material), the retardation plates ($\lambda/4$ plate and $\lambda/2$ plate), and a polarizing plate are provided in this order over a substrate for a TFT element. Light emitted from the light-emitting element travels through these layers to be emitted outside from the polarizing plate. The retardation plate or the polarizing plate may be provided on a side to which light is emitted or may be provided on both sides in the case of a dual-emission semiconductor device in which light is emitted from the both sides. In addition, an anti-reflection film may be provided on the outer side of the polarizing plate. Accordingly, an image with higher resolution and precision can be displayed.

A display panel 2002 using a display element is incorporated into a housing 2001 as illustrated in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network via a modem 2004. Operations of the television device can be carried out using switches that are incorporated into the housing or by a remote control device 2006 provided separately, and a display portion 2007 that displays output information may be provided for the remote control device 2006.

Further, the television device may include a sub-screen 2008 formed using a second display panel to display channels, volume, or the like, in addition to the main screen 2003. In this structure, the main screen 2003 may be formed of an EL display panel superior in a viewing angle, and the sub-screen 2008 may be formed of a liquid crystal display panel capable of display with low power consumption. In order to prioritize lower power consumption, a structure in which the main screen 2003 is formed using a liquid crystal display panel, the sub-screen 2008 is formed using an EL display panel, and the sub-screen can be turned on or off may also be employed. By the present invention, a semiconductor device having high performance and high reliability can be manufactured with high productivity even with the use of such a large substrate, and many TFTs and electronic components.

FIG. 20B illustrates a television device having a large display portion of, for example, 20 inches to 80 inches, which includes a housing 2010, a keyboard 2012 which is an operation portion, a display portion 2011, a speaker unit 2013, and the like. The invention is applied to manufacture the display portion 2011. FIG. 20B illustrates a television device having a curved display portion because a bendable material is used for the display portion. Since the shape of a display portion can be freely designed as described above, a television device having a desired shape can be manufactured.

In accordance with the present invention, a semiconductor device having a display function and high performance and high reliability can be manufactured with high yield. Consequently, a television device having high performance and high reliability can be manufactured with high yield.

It is needless to say that the present invention is not limited to a television device and can be applied to a variety of uses, such as a monitor of a personal computer, and a large display medium such as an information display board at the train station, the airport, or the like or an advertisement display board on the street.

Embodiment Mode 10

In Embodiment Mode 10, an example of a semiconductor device having high performance and high reliability will be described. Specifically, as examples of the semiconductor device, examples of a microprocessor and a semiconductor device which has an arithmetic function and can transmit and receive data without contact will be described.

Figure 17:
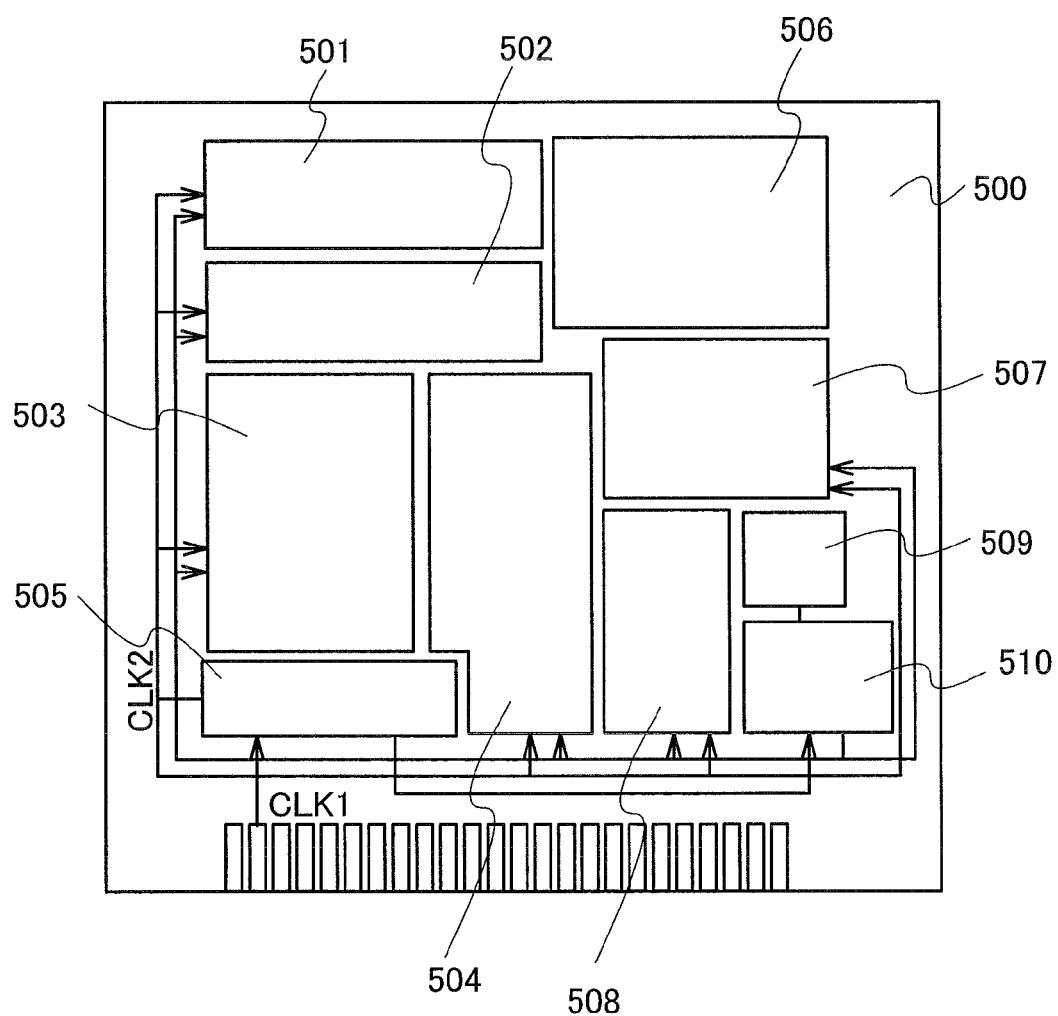
FIG. 17 is a block diagram illustrating a structure of a microprocessor which is obtained using a semiconductor substrate.

FIG. 17 illustrates an example of a microprocessor 500 as an example of a semiconductor device. The microprocessor 500 is manufactured using a semiconductor substrate according to the present invention. This microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded therein. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to each of the above-mentioned circuits. Note that the microprocessor 500 illustrated in FIG. 17 is just an example of the simplified structure, and practical microprocessors can have various structures depending on usage.

Since an integrated circuit is formed using a single crystal semiconductor layer whose crystals are oriented in a certain direction and which is bonded to a glass substrate in the microprocessor 500, higher processing speed and lower power consumption can be achieved.

Figure 18:
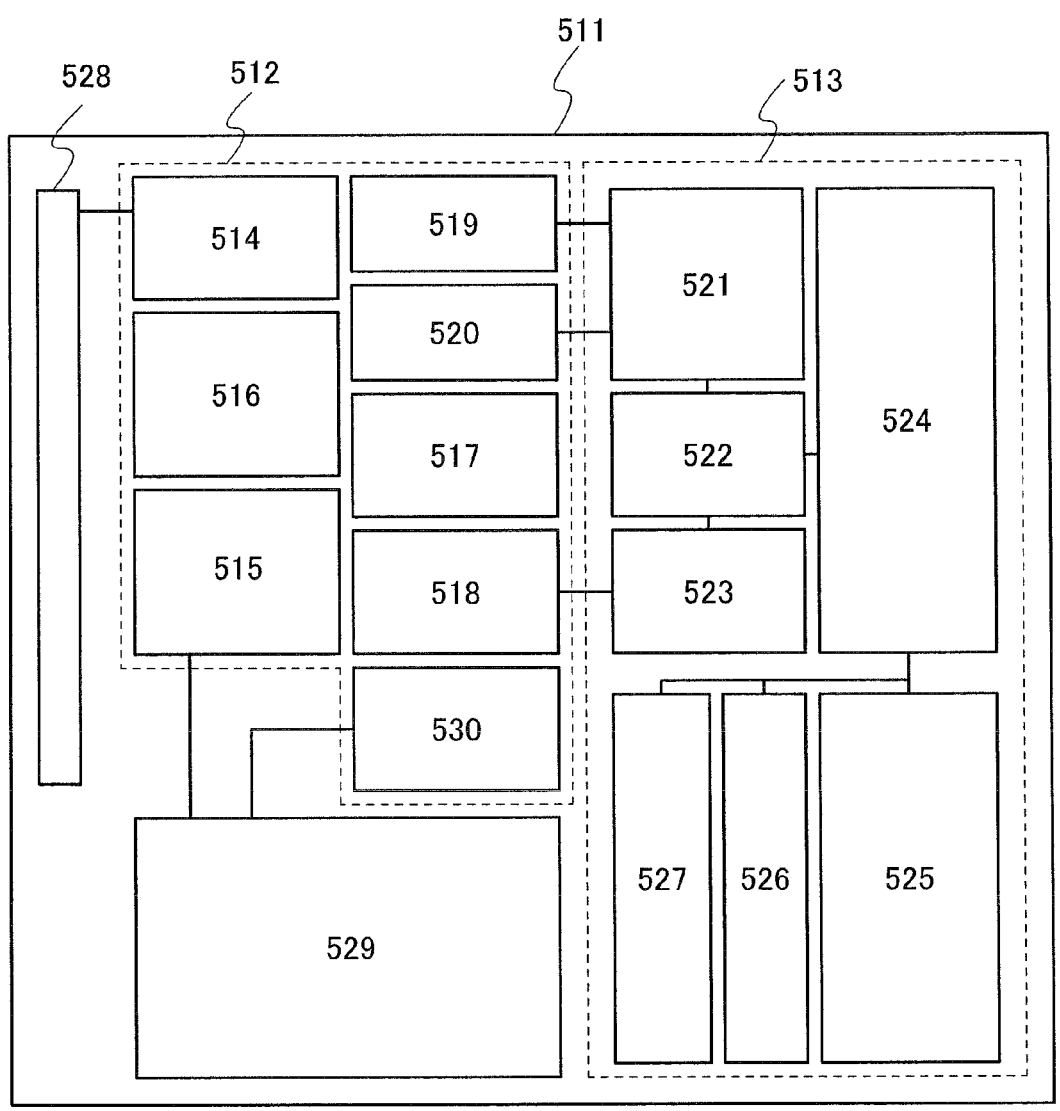
FIG. 18 is a block diagram illustrating a structure of an RFCPU obtained using a semiconductor substrate.

Next, an example of a semiconductor device which has an arithmetic function and can transmit and receive data without contact will be described with reference to FIG. 18. FIG. 18 illustrates an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, a power management circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly as follows. The resonance circuit 514 generates induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 generates a signal that resets the digital circuit portion 513 to be initialized. For example, the reset circuit generates a signal which rises after rise in the power supply voltage with delay as a reset signal. The oscillator circuit 518 changes the frequency and the duty ratio of a clock signal depending on a control signal generated by the constant voltage circuit 516. The demodulation circuit 519 having a low pass filter binarizes changes in amplitude of reception signals of an amplitude shift keying (ASK) system, for example. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then separated into a control command, data, and the like by the RF interface 521. The control command is stored in the control register 522. In the control command, instructions for reading data that is stored in the read only memory 527, writing data in the random access memory 526, performing an arithmetic calculation in the central processing unit 525, and the like are included. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which a part of process is conducted in the circuit dedicated to arithmetic and the other part of the arithmetic process is conducted by the central processing unit 525 using a program.

Since an integrated circuit is formed using a single crystal semiconductor layer whose crystals are oriented in a certain direction and which is bonded to a glass substrate in the RFCPU 511, higher processing speed and lower power consumption can be achieved. Accordingly, even when the capacitor portion 529 which supplies electric power is miniaturized, long-term operation can be secured.

Embodiment Mode 11

Embodiment Mode 11 will be described with reference to FIGS. 14A and 14B. In this embodiment mode, an example of a module using a panel including the semiconductor device manufactured in Embodiment Modes 1 to 8 will be described. In this embodiment mode, an example of a module including a semiconductor device and having high performance and high reliability will be described.

Figure 14A:
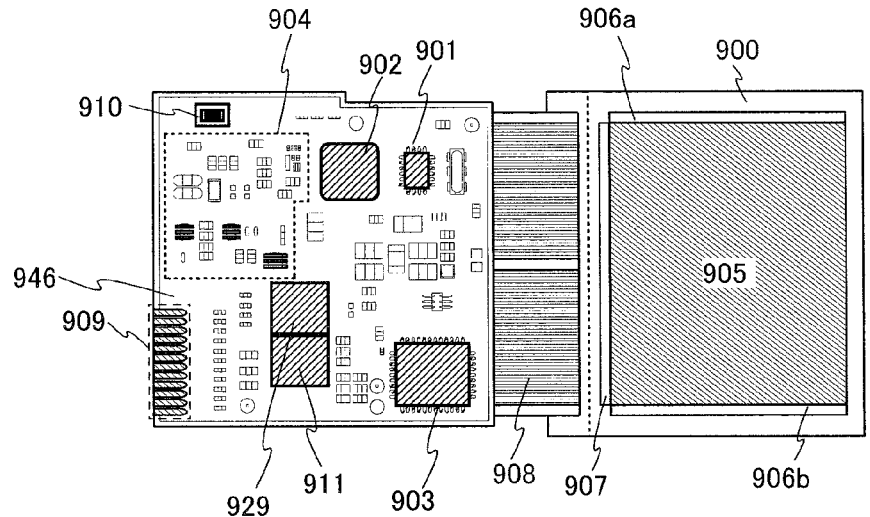
FIG. 14A and 14B illustrate an electronic device to which the present invention is applied.

A module of an information terminal illustrated in FIG. 14A includes a printed wiring board 946 on which a controller 901, a central processing unit (CPU) 902, a memory 911, a power supply circuit 903, an audio processing circuit 929, a transmission/reception circuit 904, and other elements such as a resistor, a buffer, a capacitor, and the like are mounted. In addition, a panel 900 is connected to the printed wiring board 946 through a flexible printed circuit (FPC) 908.

The panel 900 is provided with a pixel region 905 having a light-emitting element in each pixel, a first scanning line driver circuit 906a and a second scanning line driver circuit 906b which select a pixel included in the pixel region 905, and a signal line drive circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power supply circuit 903 may be directly mounted on the panel 900 by a COG (Chip on Glass) method. Moreover, various elements such as a capacitor and a buffer provided on the printed wiring board 946 prevent a noise in a power supply voltage or a signal and a slow rise of a signal.

Figure 14B:
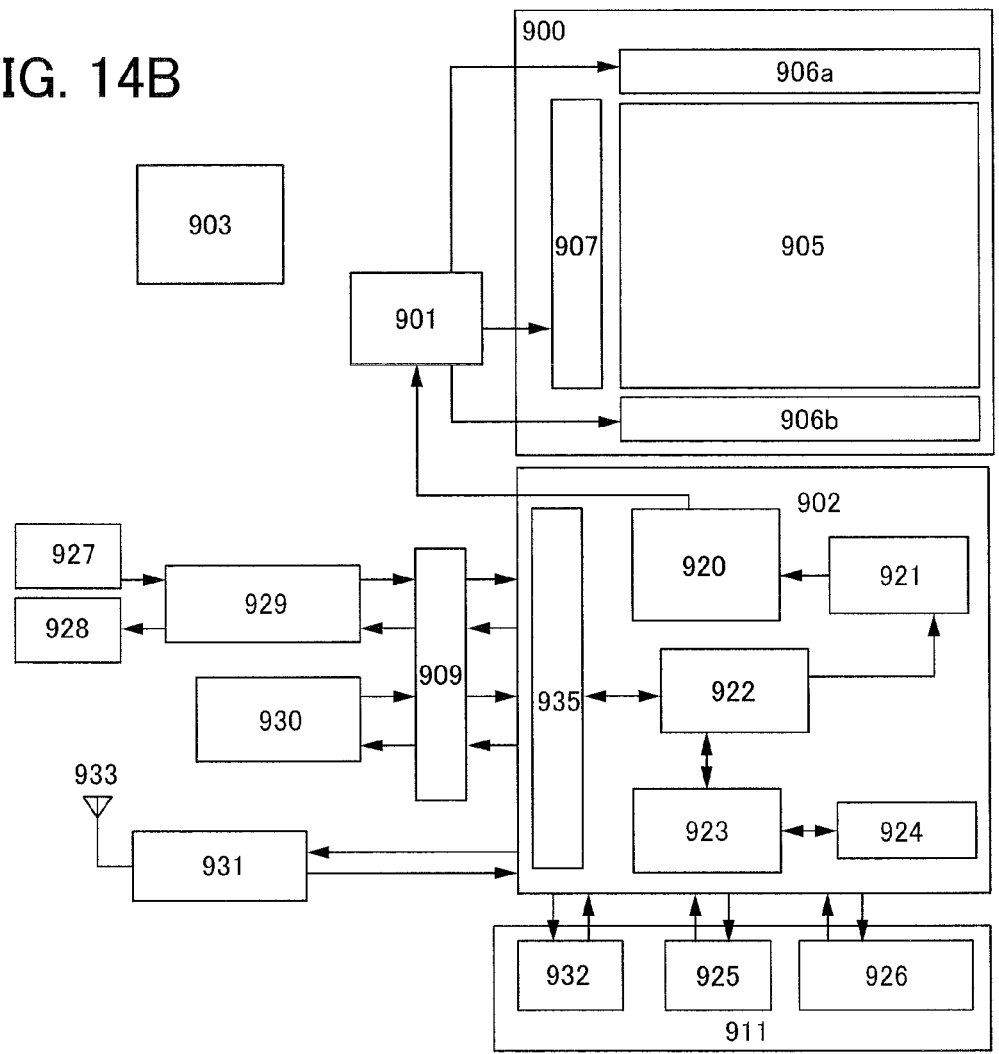

FIG. 14B is a block diagram of the module (a module 999 in FIG. 15) illustrated in FIG. 14A. This module has a VRAM 932, a DRAM 925, a flash memory 926, and the like as the memory 911. The VRAM 932 stores image data to be displayed on the panel 900, the DRAM 925 stores image data or audio data, and the flash memory 926 stores various programs.

The power supply circuit 903 generates a power supply voltage to be applied to the panel 900, the controller 901, the CPU 902, the audio processing circuit 929, the memory 911, and the transmission/reception circuit 931. There is also a case where a current source is provided in the power supply circuit 903 depending on the specification of the panel.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are held in the register 922 and then input to the arithmetic circuit 923, the decoder 921, and the like. The arithmetic circuit 923 operates based on the input signal and specifies an address to send various instructions. Meanwhile, a signal input to the decoder 921 is decoded and input to the control signal generating circuit 920. The control signal generating circuit 920 generates a signal containing various instructions based on the input signal and sends it to the addresses specified by the arithmetic circuit 923, which are specifically the memory 911, the transmission/reception circuit 931, the audio processing circuit 929, the controller 901, and the like.

Each of the memory 911, the transmission/reception circuit 931, the audio processing circuit 929, and the controller 901 operates in accordance with the received instruction. The operation is described briefly below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal containing image data transmitted from the CPU 902 in accordance with the specification of the panel and supplies it to the panel 900. The controller 901 generates a Hsync signal, a Vsync signal, a clock signal CLK, alternating voltage (AC Cont), and a switching signal L/R based on the power supply voltage input from the power supply circuit 903 and various signals input from the CPU 902 and supplies them to the panel 900.

The transmission/reception circuit 904 processes signals which are transmitted and received as electric waves by an antenna 933. In specific, the transmission/reception circuit 904 includes a high frequency circuit such as an isolator, a band pass filter, a VCO (voltage controlled oscillator), an LPF (low pass filter), a coupler, and a balun. Among the signals transmitted and received by the transmission/reception circuit 904, signals containing audio data are transmitted to an audio processing circuit 929 in accordance with an instruction transmitted from the CPU 902.

The signals containing audio data transmitted in accordance with the instruction from the CPU 902 is demodulated into an audio signal in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power supply circuit 903, the audio processing circuit 929, and the memory 911 can be mounted as a package of this embodiment mode. This embodiment mode can be applied to any circuits but high frequency circuits such as an isolator, a band pass filter, a VCO (voltage controlled oscillator), an LPF (low pass filter), a coupler, and a balun.

Embodiment Mode 12

Figure 15:
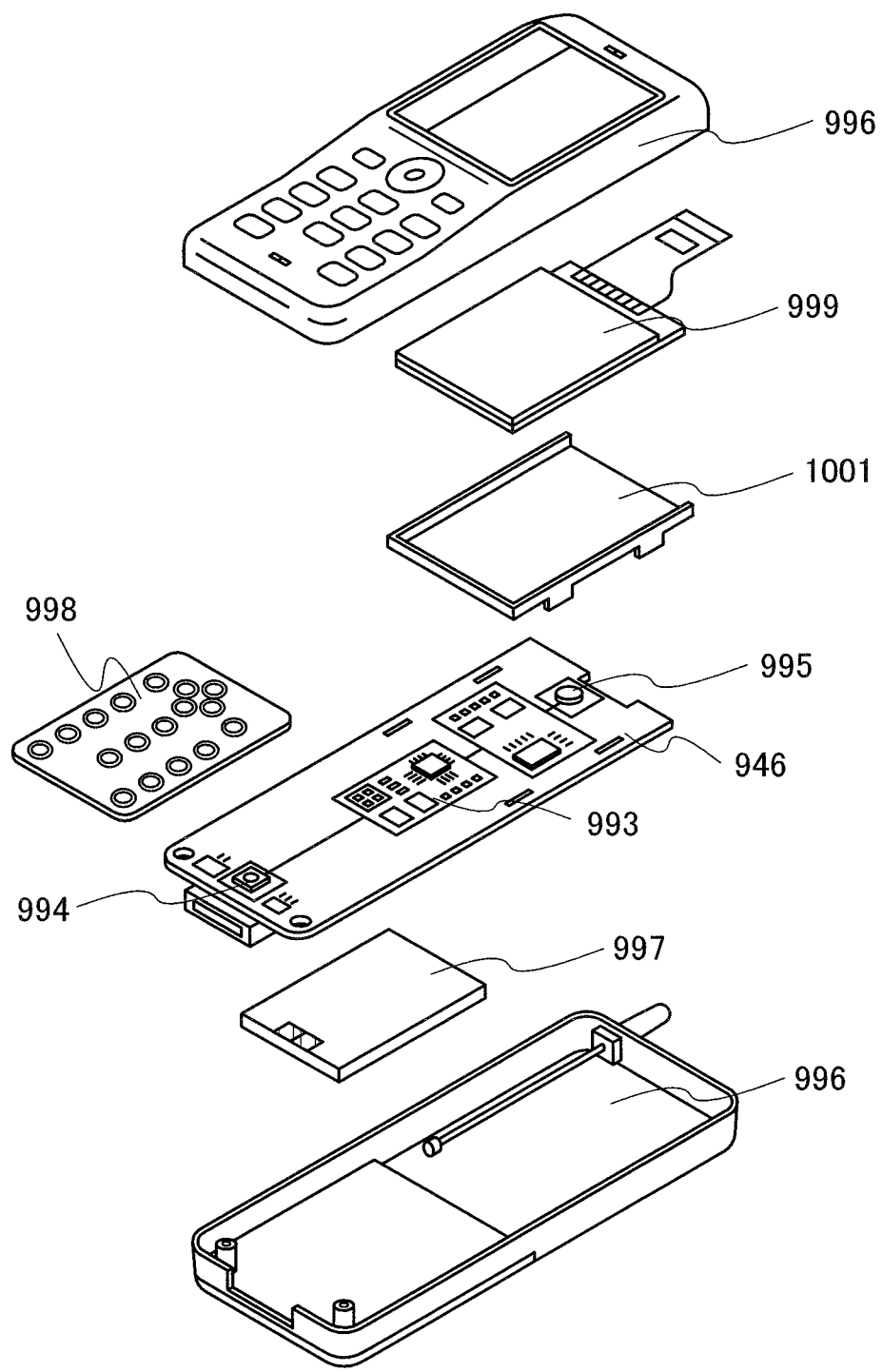
FIG. 15 illustrates an electronic device to which the present invention is applied.

Embodiment Mode 12 will be described with reference to FIGS. 14A and 14B and FIG. 15. FIG. 15 illustrates one mode of a portable compact phone (cellular phone) which includes the module manufactured in Embodiment Mode 11 and operates wirelessly. The panel 900 is detachably incorporated into a housing 1001 so as to be easily combined with a module 999. The shape and the size of the housing 1001 can be appropriately changed in accordance with an electronic device incorporated therein.

The housing 1001 in which the panel 900 is fixed is fitted to the printed wiring board 946 and set up as the module 999. A controller, a CPU, a memory, a power supply circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed circuit board 946 through the FPC 908.

The module 999, an input means 998, and a battery 997 are stored in a housing 996. The pixel region of the panel 900 is arranged so that it can be seen through a window formed in the housing 996.

The housing 996 illustrated in FIG. 15 is an example of an exterior shape of a telephone. However, an electronic device of this embodiment mode can be changed into various modes in accordance with functions and intended purposes. An example of the modes will be explained in the following embodiment mode.

Embodiment Mode 13

By applying the present invention, various semiconductor devices having a display function can be manufactured. In other words, the present invention is applicable to various electronic devices in which these semiconductor devices having a display function are incorporated into display portions. In Embodiment Mode 13, examples of electronic devices including a semiconductor device having a display function and having high performance and high reliability will be described.

As electronic devices of the present invention, television devices (also simply referred to as televisions or television receivers), cameras such as digital cameras or digital video cameras, cellular phone sets (also simply referred to as cellular phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD) player), and the like can be given. Specific examples will be described with reference to FIGS. 19A to 19E.

Figure 19A:
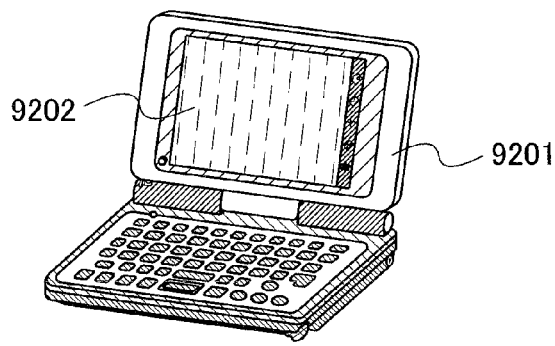
FIGS. 19A to 19E illustrate electronic devices to which the present invention is applied.

A portable information terminal illustrated in FIG. 19A includes a main body 9201, a display portion 9202, and the like. The semiconductor device of the present invention can be applied to the display portion 9202. Accordingly, a portable information terminal with high performance and high reliability can be provided.

Figure 19B:
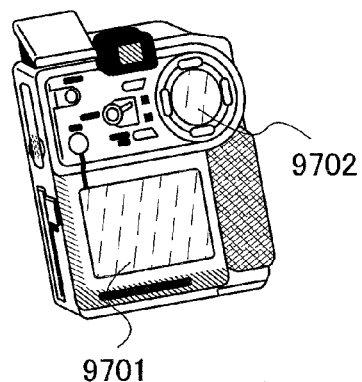

A digital video camera illustrated in FIG. 19B includes a display portion 9701, a display portion 9702, and the like. The semiconductor device of the present invention can be applied to the display portion 9701. Accordingly, a digital video camera with high performance and high reliability can be provided.

Figure 19C:
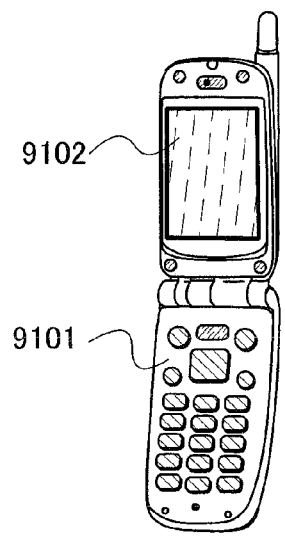

A cellular phone illustrated in FIG. 19C includes a main body 9101, a display portion 9102, and the like. The semiconductor device of the present invention can be applied to the display portion 9102. Accordingly, a cellular phone with high performance and high reliability can be provided.

Figure 19D:
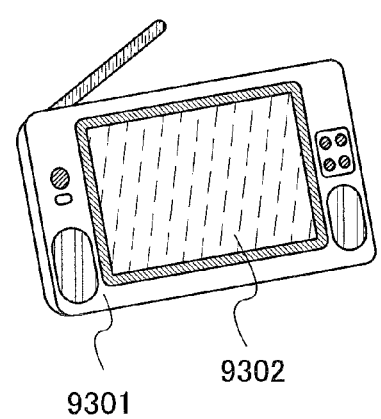

A portable television device illustrated in FIG. 19D includes a main body 9301, a display portion 9302, and the like. The semiconductor device of the present invention can be applied to the display portion 9302. Accordingly, a portable television device with high performance and high reliability can be provided. The semiconductor device of the present invention can be applied to various types of television devices including a small-sized television device incorporated in a portable terminal such as a cellular phone, a medium-sized television device that is portable, and a large-sized television device (e.g., greater than or equal to 40 inches in size).

Figure 19E:
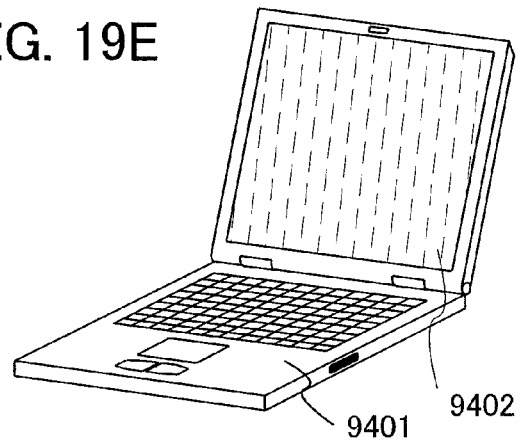

A portable computer illustrated in FIG. 19E includes a main body 9401, a display portion 9402, and the like. The semiconductor device of the present invention can be applied to the display portion 9402. Accordingly, a portable computer with high performance and high reliability can be provided.

In addition, a semiconductor device of the present invention can be used as a lighting device as well. The semiconductor device to which the present invention is applied can also be used as a small desk lamp or a large room lighting device. Further, the semiconductor device of the present invention can also be used as a backlight of a liquid crystal display device.

In this manner, by using the semiconductor device of the present invention, electronic devices with high performance and high reliability can be provided.

This application is based on Japanese Patent Application serial no. 2007-264409 filed with Japan Patent Office on Oct. 10, 2007, the entire contents of which are hereby incorporated by reference.

What is claimed is:

1. A manufacturing method of a semiconductor device, comprising the steps of:
adding an impurity element imparting one conductivity type to a semiconductor substrate from a surface of the semiconductor substrate, to form an impurity region of a field-effect transistor;
irradiating the surface of the semiconductor substrate with ions, to form an embrittlement layer in the semiconductor substrate before adding the impurity element;
forming a first insulating layer over the surface of the semiconductor substrate;
forming a silicon nitride film over the first insulating layer;
forming a mask over a part of the silicon nitride film;
etching the silicon nitride film and the first insulating layer using the mask so that a second insulating layer and a silicon nitride layer are formed;
removing the mask;
etching the semiconductor substrate using the silicon nitride layer as a mask;
removing the silicon nitride layer;
bonding a supporting substrate and the etched semiconductor substrate with the second insulating layer interposed therebetween;
performing a first heat treatment;
after the first heat treatment, performing a second heat treatment for generating a crack in the embrittlement layer and separating the etched semiconductor substrate at the embrittlement layer to form a semiconductor layer including the impurity region over the supporting substrate; and
forming the field-effect transistor using at least a part of the impurity region of the semiconductor layer as a channel formation region,
wherein the semiconductor layer is etched deeper than a depth of the embrittlement layer.

2. The manufacturing method of a semiconductor device according to claim 1, wherein a protective layer is formed over the surface of the semiconductor substrate and then the impurity element imparting one conductivity type is added to the semiconductor substrate through the protective layer formed over the surface of the semiconductor substrate, to form the impurity region.

3. The manufacturing method of a semiconductor device according to claim 2, wherein the protective layer is formed of a single layer or a stacked structure of a plurality of layers selected from a silicon nitride layer, a silicon oxide layer, a silicon nitride oxide layer, or a silicon oxynitride layer.

4. The manufacturing method of a semiconductor device according to claim 1, wherein the impurity element imparting one conductivity type is selectively added to the semiconductor substrate using a mask.

5. The manufacturing method of a semiconductor device according to claim 1, wherein as the impurity region, a plurality of impurity regions having different impurity concentrations are formed.

6. The manufacturing method of a semiconductor device according to claim 1, wherein a glass substrate is used as the supporting substrate.

7. The manufacturing method of a semiconductor device according to claim 1, wherein a display element electrically connected to the field-effect transistor is formed.

8. The manufacturing method of a semiconductor device according to claim 7, wherein a liquid crystal element is formed as the display element.

9. The manufacturing method of a semiconductor device according to claim 7, wherein a light-emitting element is formed as the display element.

10. The manufacturing method of a semiconductor device according to claim 1, wherein a second insulating film is formed over the supporting substrate before bonding the semiconductor substrate and the supporting substrate.

11. The manufacturing method of a semiconductor device according to claim 1, wherein a concentration peak of the impurity element is located between the surface of the semiconductor substrate and the embrittlement layer.

12. A manufacturing method of a semiconductor device, comprising the steps of:

adding an impurity element imparting one conductivity type to a semiconductor substrate from a surface of the semiconductor substrate, to form an impurity region of a field-effect transistor;

irradiating the surface of the semiconductor substrate with ions, to form an embrittlement layer in the semiconductor substrate before adding the impurity element;

forming a first insulating layer over the surface of the semiconductor substrate;

forming a silicon nitride film over the first insulating layer;

forming a mask over a part of the silicon nitride film;

etching the silicon nitride film and the first insulating layer using the mask so that a second insulating layer and a silicon nitride layer are formed;

removing the mask;

etching the semiconductor substrate using the silicon nitride layer as a mask;

removing the silicon nitride layer;

bonding a supporting substrate and the etched semiconductor substrate with the second insulating layer interposed therebetween;

performing a first heat treatment in a temperature of 70° C. to 350° C.;

after the first heat treatment, performing a second heat treatment for generating a crack in the embrittlement layer and separating the etched semiconductor substrate at the embrittlement layer with higher temperature than the first heat treatment to form a semiconductor layer including the impurity region over the supporting substrate; and forming the field-effect transistor using at least a part of the impurity region of the semiconductor layer as a channel formation region, wherein the semiconductor layer is etched deeper than a depth of the embrittlement layer.

13. The manufacturing method of a semiconductor device according to claim 12, wherein a protective layer is formed over the surface of the semiconductor substrate and then the impurity element imparting one conductivity type is added to the semiconductor substrate through the protective layer formed over the surface of the semiconductor substrate, to form the impurity region.

14. The manufacturing method of a semiconductor device according to claim 13, wherein the protective layer is formed of a single layer or a stacked structure of a plurality of layers selected from a silicon nitride layer, a silicon oxide layer, a silicon nitride oxide layer, or a silicon oxynitride layer.

15. The manufacturing method of a semiconductor device according to claim 12, wherein the impurity element imparting one conductivity type is selectively added to the semiconductor substrate using a mask.

16. The manufacturing method of a semiconductor device according to claim 12, wherein as the impurity region, a plurality of impurity regions having different impurity concentrations are formed.

17. The manufacturing method of a semiconductor device according to claim 12, wherein a glass substrate is used as the supporting substrate.

18. The manufacturing method of a semiconductor device according to claim 12, wherein a display element electrically connected to the field-effect transistor is formed.

19. The manufacturing method of a semiconductor device according to claim 18, wherein a liquid crystal element is formed as the display element.

20. The manufacturing method of a semiconductor device according to claim 18, wherein a light-emitting element is formed as the display element.

21. The manufacturing method of a semiconductor device according to claim 12, wherein a second insulating film is formed over the supporting substrate before bonding the semiconductor substrate and the supporting substrate.

22. The manufacturing method of a semiconductor device according to claim 12, wherein a concentration peak of the impurity element is located between the surface of the semiconductor substrate and the embrittlement layer.

23. A manufacturing method of a semiconductor device, comprising the steps of:

adding an impurity element imparting one conductivity type to a semiconductor substrate from a surface of the semiconductor substrate, to form an impurity region of a field-effect transistor;

irradiating the surface of the semiconductor substrate with ions, to form an embrittlement layer in the semiconductor substrate before adding the impurity element;

forming a first protective layer over the surface of the semiconductor substrate;

forming a silicon nitride film over the first protective layer;

forming a mask over a part of the silicon nitride film;

etching the silicon nitride film and the first protective layer using the mask so that a second protective layer and a silicon nitride layer are formed;

removing the mask;

etching the semiconductor substrate using the silicon nitride layer as a mask;

removing the silicon nitride layer;

bonding a supporting substrate and the etched semiconductor substrate with the second protective layer interposed therebetween;

performing a first heat treatment;

after the first heat treatment, performing a second heat treatment for generating a crack in the embrittlement layer and separating the etched semiconductor substrate at the embrittlement layer to form a semiconductor layer including the impurity region over the supporting substrate; and forming the field-effect transistor using at least a part of the impurity region of the semiconductor layer as a channel formation region, wherein the semiconductor layer is etched deeper than a depth of the embrittlement layer, and wherein the first protective layer is an insulating layer comprising at least a layer selected from a group consisting of a silicon nitride layer, a silicon oxide layer, a silicon nitride oxide layer, and a silicon oxynitride layer.

24. The manufacturing method of a semiconductor device according to claim 23, the impurity element imparting one conductivity type is added to the semiconductor substrate through the first protective layer formed over the surface of the semiconductor substrate, to form the impurity region.

25. The manufacturing method of a semiconductor device according to claim 23, wherein the impurity element imparting one conductivity type is selectively added to the semiconductor substrate using a mask.

26. The manufacturing method of a semiconductor device according to claim 23, wherein as the impurity region, a plurality of impurity regions having different impurity concentrations are formed.

27. The manufacturing method of a semiconductor device according to claim 23, wherein a glass substrate is used as the supporting substrate.

28. The manufacturing method of a semiconductor device according to claim 23, wherein a display element electrically connected to the field-effect transistor is formed.

29. The manufacturing method of a semiconductor device according to claim 28, wherein a liquid crystal element is formed as the display element.

30. The manufacturing method of a semiconductor device according to claim 28, wherein a light-emitting element is formed as the display element.

31. The manufacturing method of a semiconductor device according to claim 23, wherein a second insulating film is formed over the supporting substrate before bonding the semiconductor substrate and the supporting substrate.

32. The manufacturing method of a semiconductor device according to claim 23, wherein a concentration peak of the impurity element is located between the surface of the semiconductor substrate and the embrittlement layer.

* * * * *